(12) United States Patent
Park et al.

(10) Patent No.: US 9,087,738 B2
(45) Date of Patent: *Jul. 21, 2015

(54) THREE-DIMENSIONAL SEMICONDUCTOR MEMORY DEVICE

(71) Applicant: SAMSUNG ELECTRONICS CO., LTD., Suwon-si, Gyeonggi-do (KR)

(72) Inventors: Sang-Yong Park, Suwon-si (KR); Jintaek Park, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/255,170

(22) Filed: Apr. 17, 2014

(65) Prior Publication Data

US 2014/0225183 A1 Aug. 14, 2014

Related U.S. Application Data

(63) Continuation of application No. 13/231,177, filed on Sep. 13, 2011, now Pat. No. 8,704,293.

(30) Foreign Application Priority Data

Sep. 20, 2010 (KR) .......................... 10-2010-0092578

(51) Int. Cl.
  *H01L 29/72* (2006.01)
  *H01L 27/115* (2006.01)
  *H01L 27/02* (2006.01)
  *H01L 29/66* (2006.01)
  *H01L 29/792* (2006.01)

(52) U.S. Cl.
  CPC ...... *H01L 27/11578* (2013.01); *H01L 27/0207* (2013.01); *H01L 27/11565* (2013.01); *H01L 27/11582* (2013.01); *H01L 29/66833* (2013.01); *H01L 29/7926* (2013.01)

(58) Field of Classification Search
  CPC .................................................. H01L 29/7813
  USPC .................................. 257/329, 676, E29.262
  See application file for complete search history.

(56) References Cited

U.S. PATENT DOCUMENTS

| 8,704,293 B2 * | 4/2014 | Park et al. ...................... 257/329 |
| 2011/0227207 A1 * | 9/2011 | Yilmaz et al. ................. 257/676 |

* cited by examiner

*Primary Examiner* — Edward Wojciechowicz
(74) *Attorney, Agent, or Firm* — Lee & Morse, P.C.

(57) ABSTRACT

A three-dimensional semiconductor device includes a stacked structure including a plurality of conductive layers stacked on a substrate, a distance along a first direction between sidewalls of an upper conductive layer and a lower conductive layer being smaller than a distance along a second direction between sidewalls of the upper conductive layer and the lower conductive layer, the first and second directions crossing each other and defining a plane parallel to a surface supporting the substrate, and vertical channel structures penetrating the stacked structure.

6 Claims, 55 Drawing Sheets

THREE-DIMENSIONAL SEMICONDUCTOR MEMORY DEVICE

CROSS-REFERENCE TO RELATED APPLICATIONS

This is a continuation application based on pending application Ser. No. 13/231,177, filed Sep. 13, 2011, the entire contents of which is hereby incorporated by reference.

This U.S. non-provisional patent application claims priority under 35 U.S.C. §119 to Korean Patent Application No. 10-2010-0092578, filed on Sep. 20, 2010, in the Korean Intellectual Property Office, the entire contents of which are hereby incorporated by reference.

BACKGROUND

1. Field

Embodiments of the inventive concept relate generally to a semiconductor device, and more particularly, to a three-dimensional semiconductor memory device including three-dimensionally arranged memory cells and methods of fabricating the same.

2. Description of the Related Art

A three-dimensional integrated circuit (3D-IC) memory technique may be used to increase a memory capacity. The 3D-IC memory technique generally refers to technology related to arranging memory cells three-dimensionally.

One 3D-IC technique is a punch-and-plug technique. The punch-and-plug technique includes sequentially forming multi-layered thin layers on a substrate and then forming plugs to penetrate the thin layers. Through this technique, without a drastic increase of manufacturing costs, a three-dimensional memory device may obtain an increased memory capacity.

SUMMARY

Example embodiments of the inventive concept may provide a three-dimensional (3D) semiconductor device with a large memory capacity.

Example embodiments of the inventive concept may also provide a 3D semiconductor device including a plurality of stacked structures and having a reduced pad region area.

According to example embodiments of the inventive concept, a three-dimensional semiconductor device includes a stacked structure including a plurality of conductive layers stacked on a substrate, a distance along a first direction between sidewalls of an upper conductive layer and a lower conductive layer being smaller than a distance along a second direction between sidewalls of the upper conductive layer and the lower conductive layer, the first and second directions crossing each other and defining a plane parallel to a surface supporting the substrate, and vertical channel structures penetrating the stacked structure.

The device may further include bit lines electrically connecting the vertical channel structures with each other, the bit lines extending along the first direction.

The stacked structure may further include insulating layers interposed between the conductive layers, sidewalls of the conductive layers and the insulating layers exposed in the first direction are substantially coplanar with each other.

Widths of the plurality of conductive layers along the first direction may be substantially the same.

The conductive layers may include first pads, each first pad being exposed by a sequentially stacked conductive layer and being spaced apart from the vertical structures along the second direction.

The device may further include contact plugs disposed on the respective first pads.

The conductive layers may include second pads, each second pad being exposed by a sequentially stacked conductive layer and being spaced apart from the vertical structures along the first direction.

A width of the second pad along the first direction may be smaller than a width of the first pad along the second direction.

A distance along a third direction between sidewalls of the upper and lower of the conductive layers may be smaller than a distance along the second direction between sidewalls of the upper and lower of the conductive layer, the third direction being opposite the second direction.

A distance from the vertical channel structure to an edge of the stacked structure may be smaller in the first direction than in the second direction.

According to other example embodiments of the inventive concept, a three-dimensional semiconductor device includes a first stacked structure on a substrate, the first stacked structure including a first memory region penetrated by a first vertical channel structure and a first pad region adjacent the first memory region, and a second stacked structure on the first stacked structure, the second stacked structure including a second memory region penetrated by a second vertical channel structure and a second pad region adjacent the second memory region, wherein in a plan view, major axes of the first and second stacked structures cross each other.

A distance between the first memory region and an edge of the first pad region may be smaller in a first direction parallel to a top surface of the substrate than in a second direction crossing the first direction, and a distance between the second memory region and an edge of the second pad region may be greater in the first direction than in the second direction.

The distance between the first memory region and the edge of the first pad region may be smaller in a direction opposite the second direction than in the second direction, and the distance between the second memory region and the edge of the second pad region may be smaller in a direction opposite the first direction than in the first direction.

A width of the first stacked structure along the first direction may be smaller than a width of the second stacked structure along the first direction, and a width of the first stacked structure along the second direction may be greater than a width of the second stacked structure along the second direction.

The device may further include an interlayer insulating layer interposed between the first pad region and the second stacked structure.

According to yet other example embodiments of the inventive concept, a three-dimensional semiconductor device includes a first stacked structure including a plurality of conductive layers stacked on a substrate, the stacked structure including a memory region and at least one pad region adjacent a first side of the memory region along a first direction, a vertical channel structure penetrating the conductive layers in the memory region, and pads on the conductive layers in the pad region, wherein a distance along the first direction between sidewalls of sequentially arranged conductive layers is larger than a distance along a second direction between sidewalls of the sequentially arranged conductive layers, the first and second directions crossing each other and defining a plane parallel to a surface supporting the substrate.

Each conductive layer may include a first sidewall substantially extending along the first direction, and a second sidewall substantially extending along the second direction, first sidewalls of at least two sequentially stacked conductive layers of the plurality of conductive layers being aligned with each other to define a uniform flat plane of the memory region, the flat plane being at a side of the memory region other than the first side.

The pads and the memory region may be adjacent to each other only along the first direction.

The first sidewalls of all the stacked conductive layers may be aligned with each other to define a uniform flat plane of the memory region, the flat plane being at a side of the memory region other than the first side.

The device may further include a second stacked structure on the first stacked structure, the second stacked structure having a vertical channel structure in a memory region and pads on conductive layers in a pad region, major axes of the first and second stacked structures crossing each other.

BRIEF DESCRIPTION OF THE DRAWINGS

The above and other features and advantages will become more apparent to those of ordinary skill in the art by describing in detail exemplary embodiments with reference to the attached drawings, in which.

Figure 1:
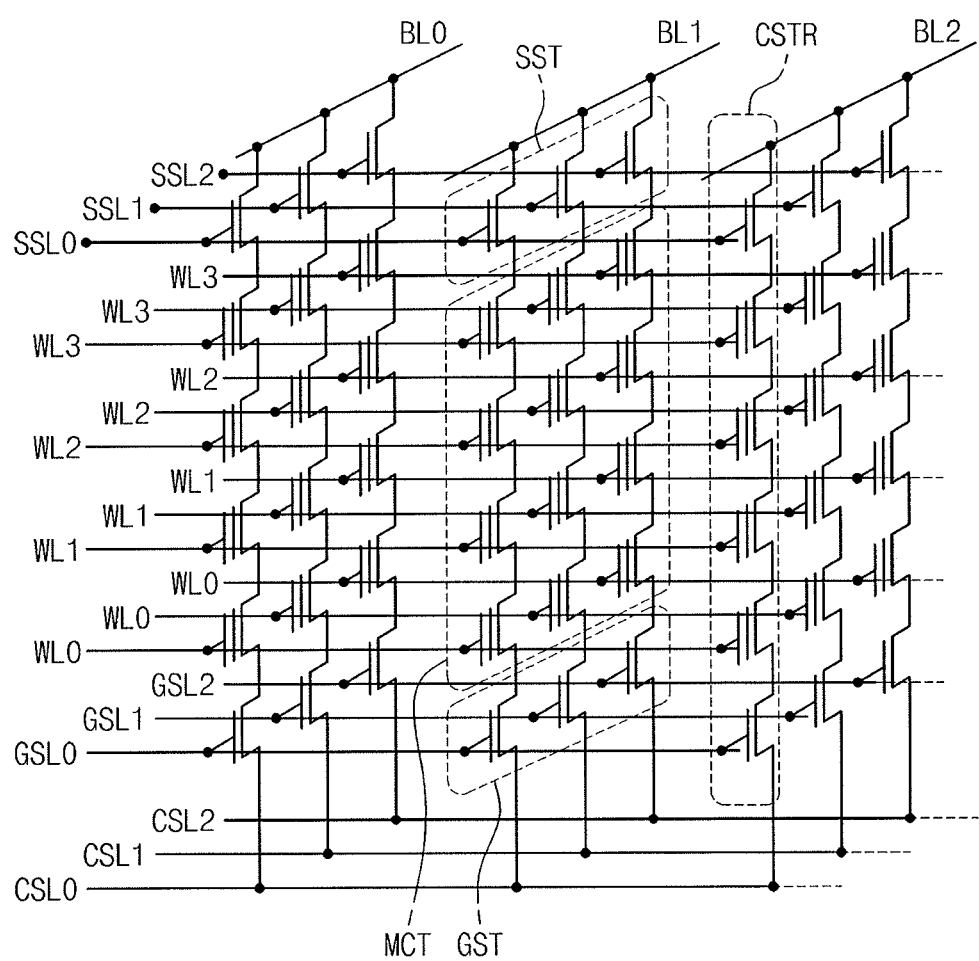
FIG. 1 illustrates a circuit diagram of a three dimensional (3D) semiconductor memory device according to embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers, elements, and regions may be exaggerated for clarity. Like reference numerals in the drawings denote like elements throughout.

It will be understood that when an element is referred to as being "connected" or "coupled" with respect to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concept are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concept should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A 3D semiconductor device according to example embodiments of the inventive concept may include a cell array region, a peripheral circuit region, a sense amp region, a decoding circuit region, and a connection region. A plurality of memory cells and bit lines and word lines for electrical connection to the plurality of memory cells may be in the cell array region. Circuits for driving the plurality of memory cells may be in the peripheral circuit region, and circuits for reading information stored in the plurality of memory cells may be in the sense amp region. The connection region may be between the cells array region and the decoding circuit region, and a wiring structure for electrically connecting the word lines with the decoding circuit region may be between the word lines and the decoding region.

FIG. 1 is a circuit diagram of a three dimensional (3D) semiconductor memory device according to embodiments of the inventive concept.

Referring to FIG. 1, in some embodiments of the inventive concept, a cell array of a 3D semiconductor memory device may include common source lines CSL0, CSL1, and CSL2, bit lines BL0, BL1, and BL2, and cell strings CSTR interposed among the common source line CSL0-CSL2 and the bit lines BL0-BL2.

The bit lines BL0-BL2 may be two-dimensionally arranged, so a plurality of parallel cell strings CSTR may be connected to each of the bit lines BL. A plurality of the cell strings CSTR may be connected in common to a corresponding one of the common source line CSL0-CSL2. That is, a plurality of the cell strings CSTR may be disposed among the bit lines BL0-BL2 and each of the common source lines CSL0-CSL2. The common source lines CSL0-CSL2 may be two-dimensionally arranged. In some embodiments, the common source lines CSL0-CSL2 may be connected with one another in an equipotential state. In other embodiments, the common source lines CSL0-CSL2 may be separated from one another, such that they are controlled independently.

Each of the cell strings CSTR may include ground selection transistors GST coupled to the common source lines CSL0-CSL2, string selection transistors SST coupled to the bit lines BL0-BL2, and a plurality of memory cell transistors MCT disposed between one of the ground selection transistors GST and one of the string selection transistors SST. Here, the plurality of the memory cell transistors MCT may be connected in series between one of the ground selection transistors GST and one of the string selection transistors SST.

Source regions of a plurality of the ground selection transistors GST may be connected in common to one of the common source lines CSL0-CSL2. In addition, ground selection lines GSL0-GSL2, word lines WL0-WL3, and string selection lines SSL0-SSL2, which serve as gate electrodes of the ground selection transistor GST, the memory cell transistors MCT and the string selection transistor SST, respectively, may be disposed between the common source lines CSL0-CSL2 and the bit lines BL0-BL2. Moreover, each of the memory cell transistors MCT may include a data storage element.

In some aspects of the inventive concept, one of the cell string CSTR may include a plurality of the memory cell transistors MCT disposed (or spaced) at different distances apart from the corresponding common source line CSL0-CSL2. That is, between the common source lines CSL0-CSL2 and the bit lines BL0-BL2, there may be a multi-layered word line structure including the word lines WL0-WL3 disposed at different levels from each other.

In addition, gate electrodes of the memory cell transistors MCT, which are disposed at the substantially same level from the common source lines CSL0-CSL2, may be connected in common to one of the word lines WL0-WL3, such that they are in an equipotential state. Alternatively, although gate electrodes of the memory cell transistors MCT may be disposed at the substantially same level from the common source lines CSL0-CSL2, a portion thereof (e.g., gate electrodes disposed in one row or column) may be electrically and spatially separated from other portion thereof (e.g., gate electrodes disposed in other row or column).

First Embodiment

Figure 2:
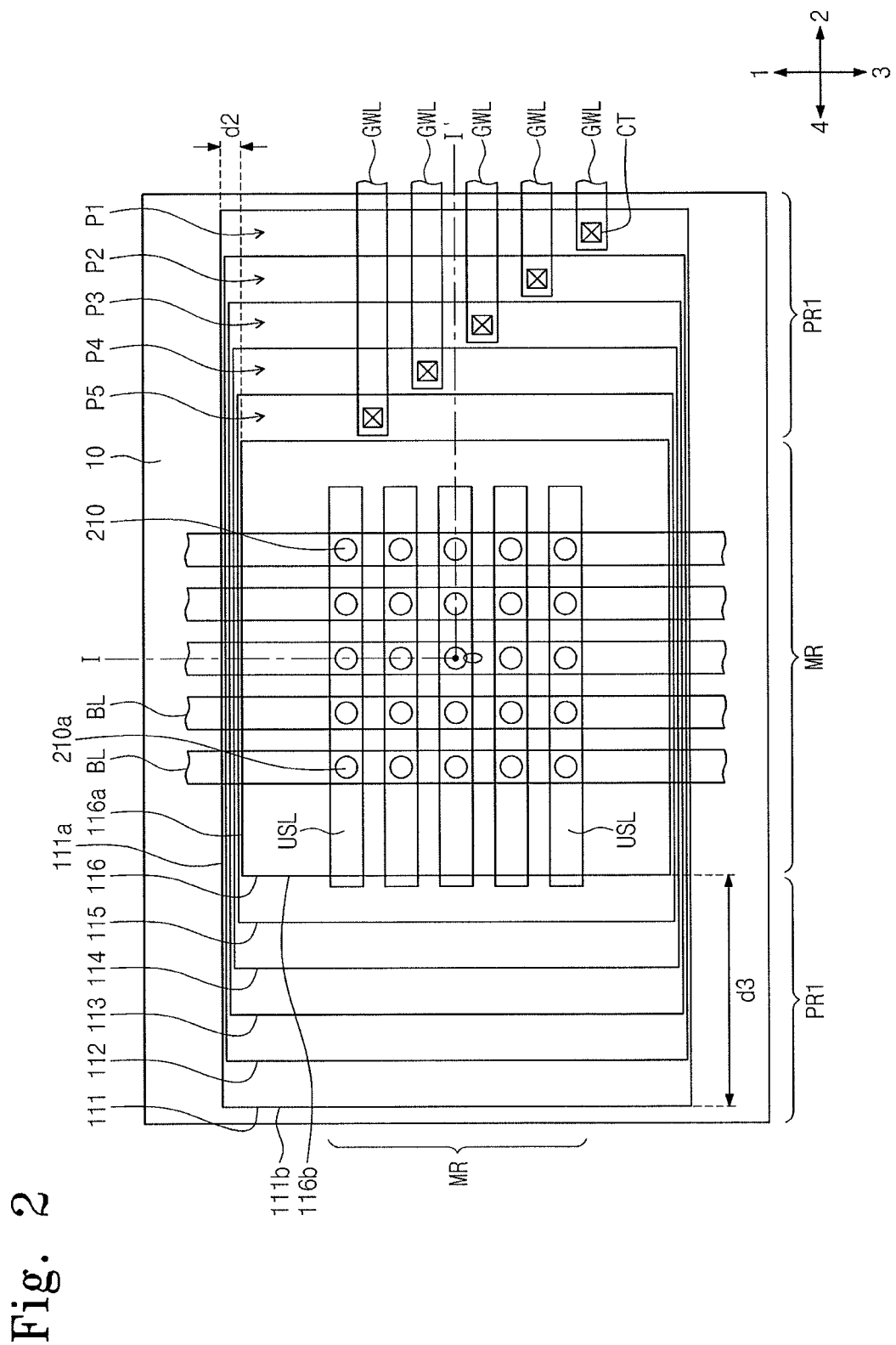
FIGS. 2 and 3 illustrate schematic planar and cross-sectional views, respectively, of a 3D semiconductor device according to a first embodiment of the inventive concept.
Figure 3:
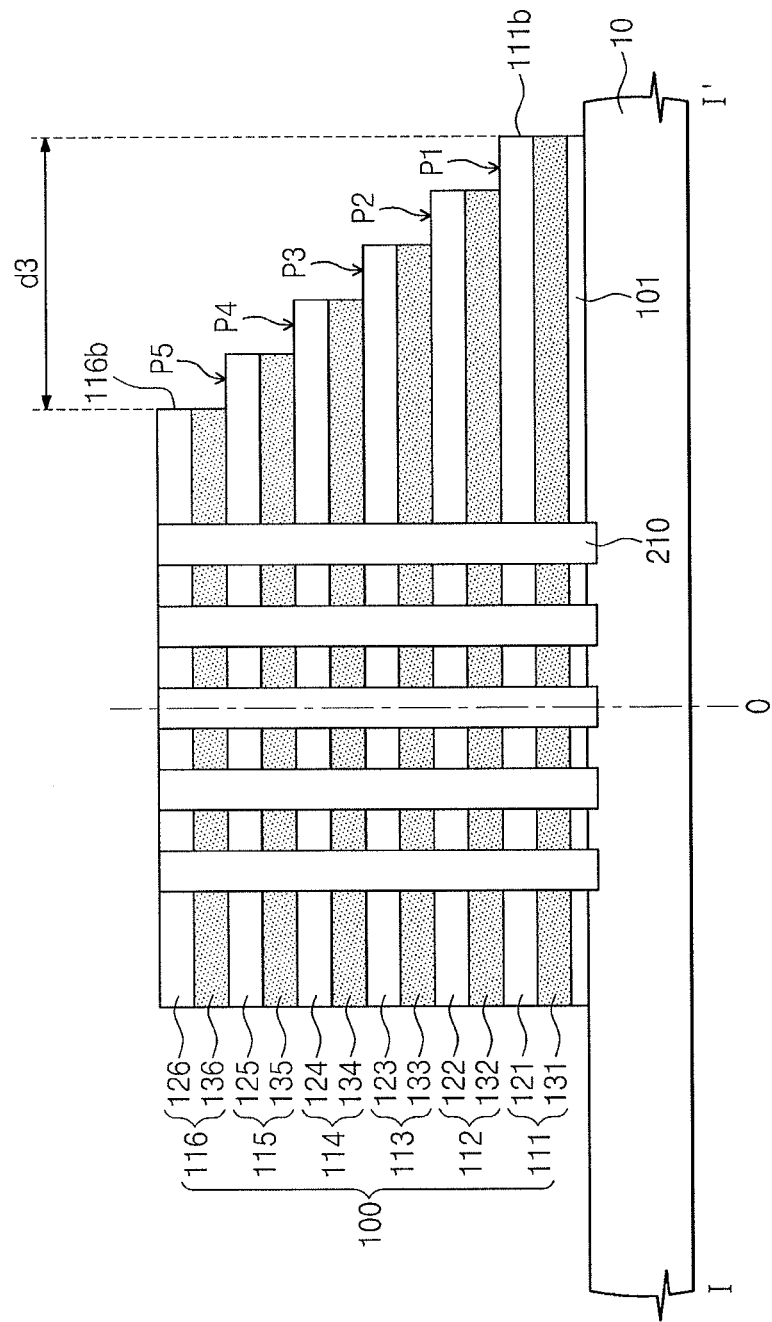

FIG. 2 is a plan view illustrating a 3D semiconductor device according to a first embodiment of the inventive concept, and FIG. 3 is a cross-sectional view taken along line I-O-I' of FIG. 2. For ease of description, a portion of the structure in FIG. 2 is omitted in FIG. 3.

Referring to FIGS. 2 and 3, a stacked structure 100 may be provided on a substrate 10. The substrate 10 may be, for example, a material having a semiconducting property, an insulating material, a conductor, and/or one or more of these materials covered by an insulating material. For example, the substrate 10 may be a silicon wafer. As illustrated in FIG. 3, the stacked structure 100 may include first to sixth horizontal layers 111 to 116 sequentially stacked on the substrate 10. Each of the first to sixth horizontal layers 111 to 116 may include a first material layer and a second material layer. That is, first material layers 131 to 136 and second material layers 121 to 126 may be alternately stacked on the substrate 10, e.g., first and second material layers 121 and 131 may define the first horizontal layer 111. The second material layers 121 to 126 may be formed of an insulating layer, e.g., the second material layers 121 to 126 may be formed of at least one of silicon oxide and silicon nitride. A buffer oxide 101 may be interposed between the stacked structure 100 and the substrate 10. The buffer oxide 101 may be a thermal oxide layer.

The first material layers 131 to 136, e.g., each of the first material layers 131 and 136, may include a conductive layer. For example, the conductive layer for the first material layers 131 to 136 may include at least one of a polysilicon layer, a conductive metal layer, or a conductive metal nitride layer. According to example embodiments of the inventive concept, with respect to NAND FLASH memory devices, in the conductive layer for the first material layers 131 to 136, the lowermost conductive layer, i.e., first material layer 131, may serve as a ground selection line, and the remaining conductive layers 132 to 136 disposed on the lowermost conductive layer 131 may serve as word lines.

As illustrated in FIG. 2, the stacked structure 100 may include a memory region MR, i.e., where vertical channel structures 210 are formed, and a first pad region PR1, i.e., where first pads P1 to P5 are formed. In the following description, the memory region MR is a portion of the stacked structure 100, except for the pad region PR1 provided with the pads. The first pads P1 to P5 may be portions of the first to fifth horizontal layers 111 to 115, each of which is exposed by the corresponding one of the horizontal layers positioned thereon. As illustrated in FIGS. 2-3, respective vertical channel structures 210 may be formed through the stacked structure 100, e.g., the channel structures 210 may extend from the second material layer 126 to the substrate 10, and may include a semiconductor pattern. The channel structures 210 will be described in more detail below with reference to FIGS. 49 through 52.

In the following description, first to fourth directions will be used for easier understanding of example embodiments of the inventive concept. As shown in FIG. 2, the first direction may cross the second direction, and the third and fourth directions may be opposite to the first and second directions, respectively. Furthermore, the first to fourth directions may be parallel to a top surface of the substrate 10. Under this directional configuration, the first pad region PR1 may be provided in a region adjacent to the memory region MR in the second direction (hereinafter, a second directional adjacent region). In some embodiments, the first pad region PR1 may be also disposed in a region adjacent to the memory region MR in the forth direction (hereinafter, a fourth directional adjacent region). That is, the first pad region PR1 may be provided at both sides of the memory region MR. In certain embodiments, the two first pad regions PR1 disposed at both sides of the memory region MR may be substantially symmetrical (e.g., mirror symmetry). For example, one first pad region PR1 may be arranged to be adjacent to only one side of the memory region MR, e.g., adjacent only along the second direction as illustrated in FIG. 2. In another example, two first pad regions PR1 may be arranged along a single straight line, e.g., along respective second and fourth directions, so the memory region MR may be therebetween, i.e., on the same straight line.

Figure 12:
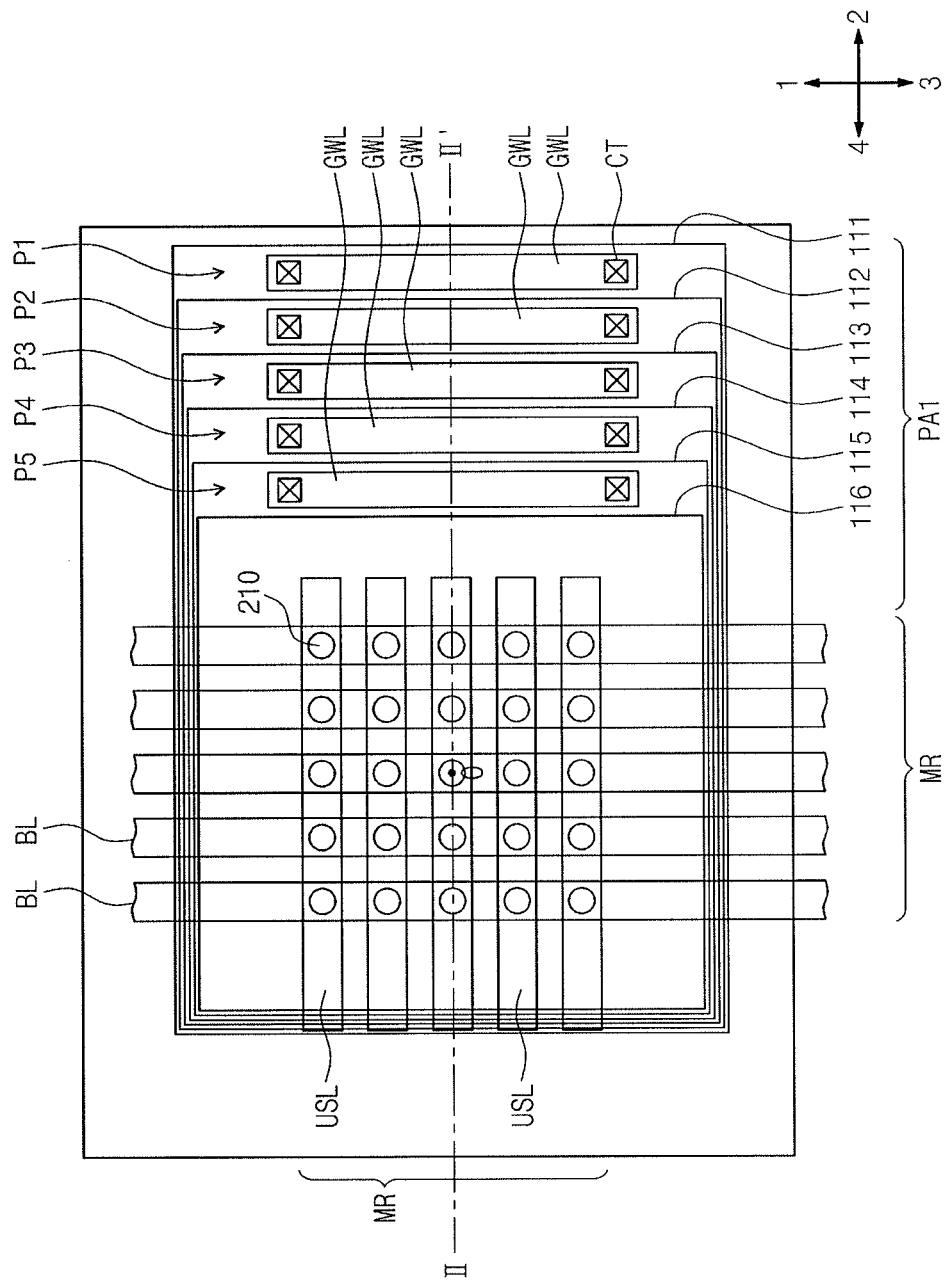
FIGS. 12 and 13 illustrate schematic planar and cross-sectional views, respectively, of a 3D semiconductor device according to modifications of the first embodiments of the inventive concept.

Each of the first pads P1-P5 provided at both sides of the memory region MR may have a substantially same width. Contact plugs CT may be formed on at least one of the two pad regions PR1 disposed in the second and fourth directional adjacent regions. The horizontal layers 111 to 115 may be electrically connected to global word lines GWL via the contact plugs CT. Even though FIG. 2 shows that each of the contact plugs CT is disposed on the corresponding one of the first pads P1-P5, example embodiments are not limited thereto. For instance, as shown in FIG. 12, a plurality of the contact plugs CT may be provided on the respective first pads P1 to P5. In addition, positions of the contact plugs CT may be variously modified according to shapes and positions of the first material layers 131 to 136.

For example, as the first pad region PR1 is adjacent to the memory region MR along, e.g., only along, the second and/or fourth direction, the first pad region PR1 may not be provided in a region adjacent to the memory region MR in the first direction (hereinafter, a first directional adjacent region) or the third direction (hereinafter, a third directional adjacent region). The first direction may be parallel to a direction of a bit line BL to be described below. For instance, in the case that the memory region MR has a tetragonal shape in plan view, the first pad region PR1 may be partially formed in regions near a first side and a second side parallel to the first side, i.e., at two opposite sides of a total of four sides of the tetragonal memory region MR, so the first pad region PR1 may not be formed near third and fourth sides connecting the first side to the second side.

In the case that the first pad regions PR1 are partially formed around the memory region MR according to example embodiments, e.g., only at one side or two opposite sides of the memory region MR, the stacked structure 100 may be formed in a reduced occupying area in a plan view. That is, according to example embodiments of the inventive concept, it is possible to reduce occupying areas of the first pads P1-P5 and consequently increase an integration density of a 3D semiconductor device, as compared with conventional 3D semiconductor devices, i.e., in which occupying areas of stepwise pads may increase with an increase in a height of the stacked structure 100.

In detail, as the first pad region PR1 may be disposed along, e.g., only along, the second and/or fourth directions relative to the memory region MR, distances between sidewalls of the horizontal layers 111 to 116 may vary depending on a direction. That is, a first distance d2 between a long sidewall of the uppermost horizontal layer, i.e., a long sidewall 116a of the sixth horizontal layer 116, and a long sidewall of the lowermost horizontal layer, i.e., a long sidewall 111a of the first horizontal layer 111, may be smaller in the first direction than a second distance d3, i.e., a distance between respective short sidewalls 116b and 111b, in the second direction (d2<d3). For example, in some embodiments, long sidewalls of the horizontal layers 111 to 116 may be aligned with each other in the first direction, so the first directional sidewalls of the horizontal layers 111 to 116 may be substantially coplanar with each other as shown in FIG. 2. It is noted that although FIG. 2 depicts that the sidewalls of the horizontal layers 111 to 116 in the first direction are spaced apart from each other by a small spacing, this spacing is intended only to distinguish the sidewalls in the first direction from each other, i.e., a single line could be used to illustrate all long sidewalls of layers 111 through 116). Similarly, a distance between a sidewall of the uppermost horizontal layer 116 and a sidewall of the lowermost horizontal layer 111 is smaller in the third direction than in the fourth direction. It is noted that while uppermost and lowermost layers 116 and 111 are addressed herein, the described relationship between respective sidewalls may refer to any two sequentially stacked layers of the plurality of horizontal layers.

According to some aspects of the inventive concept, a distance from the vertical channel structures 210 to an edge of the stacked structure 100 may differ in the first direction and in the second direction. For instance, when a distance from an outermost one of the vertical channel structures 210 to an edge of the stacked structure 100 adjacent thereto is considered, a distance in the first direction may be smaller than that in the second direction, e.g., a distance between a vertical channel structure 210a and the long sidewalls 116a may be smaller than a distance between the vertical structures 210a and the short sidewalls 116b (FIG. 2).

The vertical channel structures 210 may be electrically connected to the bit lines BL extending along the first direction. In some embodiments, some of the vertical channel structures 210 arranged along the first direction may be electrically connected to the same bit line BL. Upper selection lines USL may be provided between the stacked structure 100 and the bit lines BL. The upper selection lines USL may extend along a direction crossing the bit lines BL. For instance, the upper selection lines USL may extend along the second direction. Some of the vertical channel structures 210 arranged along the second direction may penetrate the same upper selection line USL and be electrically connected to different bitlines BL. In some embodiments, the upper most horizontal layer 116 may serve as the upper selection line.

FIGS. 4, 6, 8, and 10 are plan views illustrating methods of fabricating a 3D semiconductor device according to the first embodiment of the inventive concept, and FIGS. 5, 7, 9, and 11 are cross-sectional views along lines I-O-I' of FIGS. 4, 6, 8 and 10, respectively.

Figure 4:
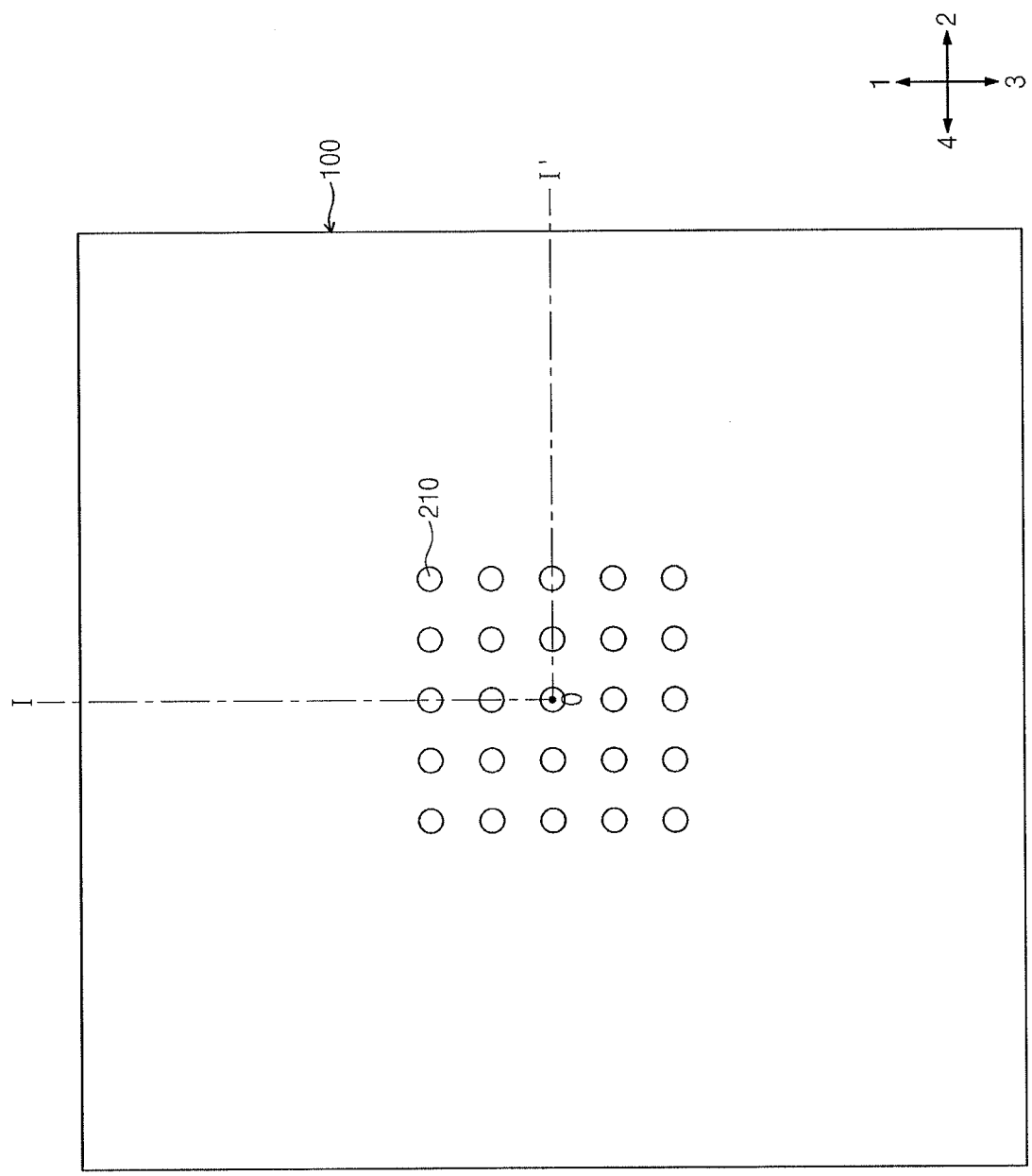
FIGS. 4 through 11 illustrate methods of fabricating a 3D semiconductor device according to a first embodiment of the inventive concept.
Figure 5:
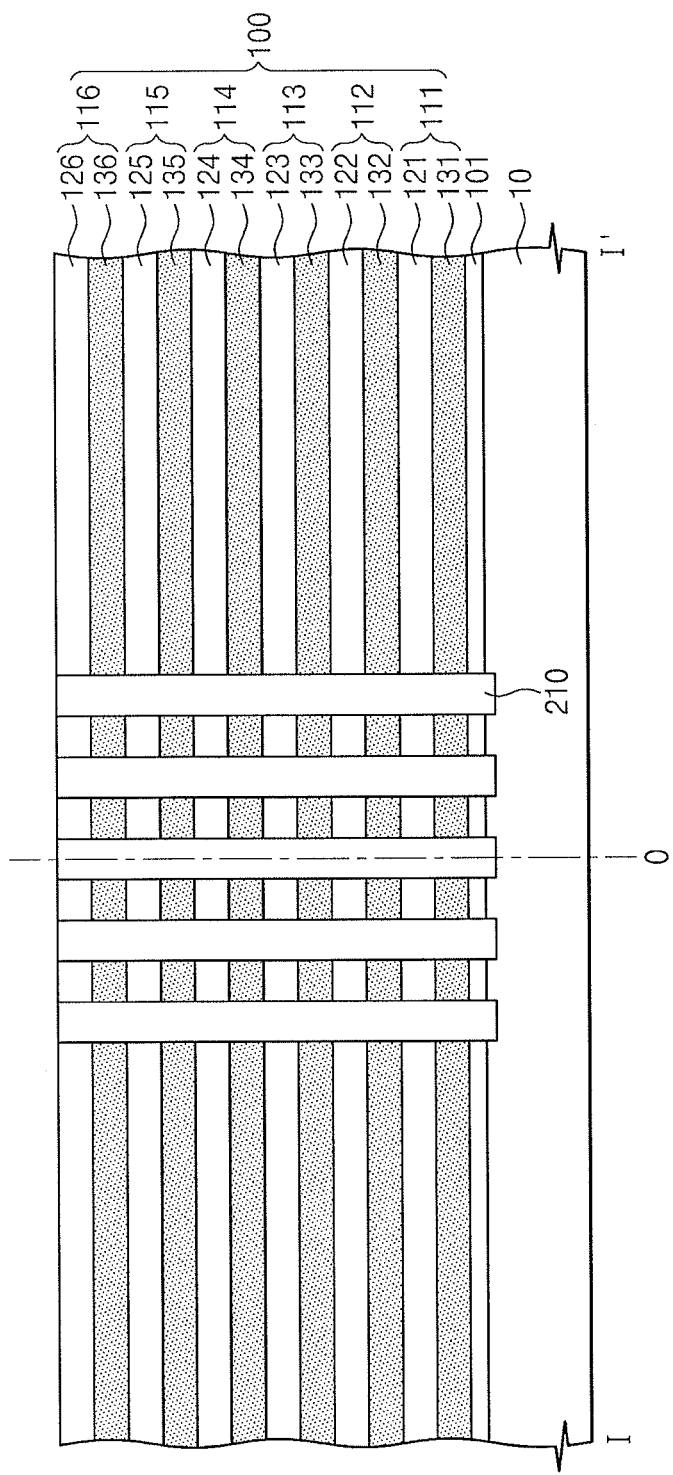

Referring to FIGS. 4 and 5, the stacked structure 100 may be formed on the substrate 10. The stacked structure 100 may include the first to sixth horizontal layers 111 to 116 sequentially stacked on the substrate 10. Each of the first to sixth horizontal layers 111 to 116 may include a first material layer and a second material layer. That is, the first material layers 131 to 136 and the second material layers 121 to 126 may be alternately formed on the substrate 10. The first material layers 131 to 136 may be formed of at least one conductive layer. The conductive layer for the first material layers 131 to 136 may include at least one of a polysilicon layer, a conductive metal layer, or a conductive metal nitride layer. The second material layers 121 to 126 may be formed of an insulating layer. For instance, the second material layers 121 to 126 may be formed of at least one of silicon oxide and silicon nitride.

Alternatively, in some embodiments, the first material layers 131 to 136 may be sacrificial layers, which may be formed of a material having an etch selectivity with respect to the second material layers 121 to 126. For instance, the first material layers 131 to 136 may be formed of a material that is etched at a faster rate than materials of the second material layers 121 to 126 during etching of the first material layers 131 to 136 using a sacrificial layer material etchant. For instance, at least one of the second material layers 121 to 126 may include at least one layer of silicon oxide or silicon nitride, and at least one of the first material layers 131 to 136 may include at least one layer of silicon, silicon oxide, silicon carbide, or silicon nitride. Furthermore, the sacrificial layers may be selected to be a different material from the second material layers 121 to 126.

In addition, vertical channel structures 210 penetrating the stacked structure 100 may be provided. Structures and formation methods of the vertical channel structures 210 will be described in further detail with reference to FIGS. 49 through 52. The vertical channel structures 210 may be formed spaced apart from each sides of the stacked structure 100 by a specific distance.

Figure 6:
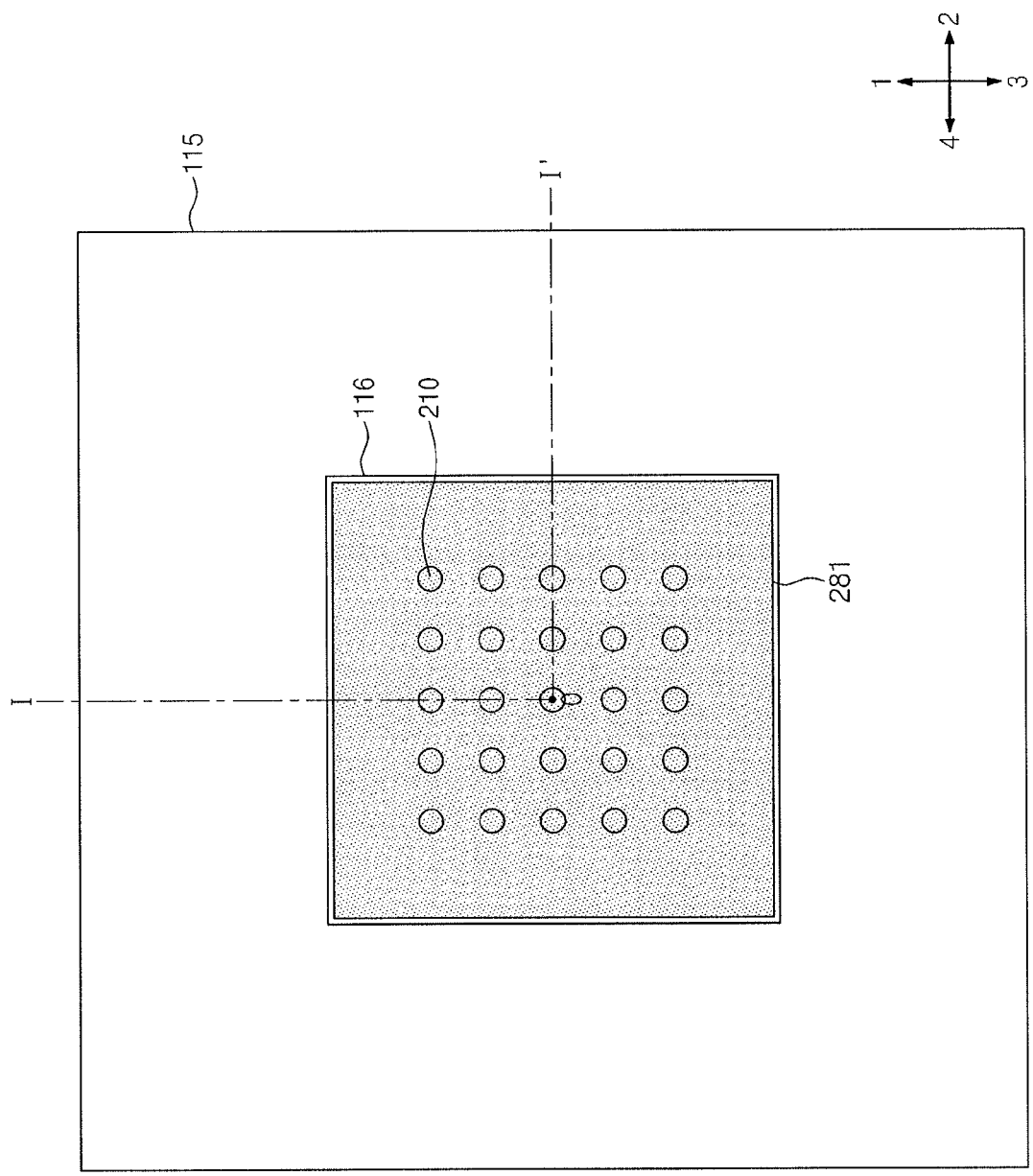
Figure 7:
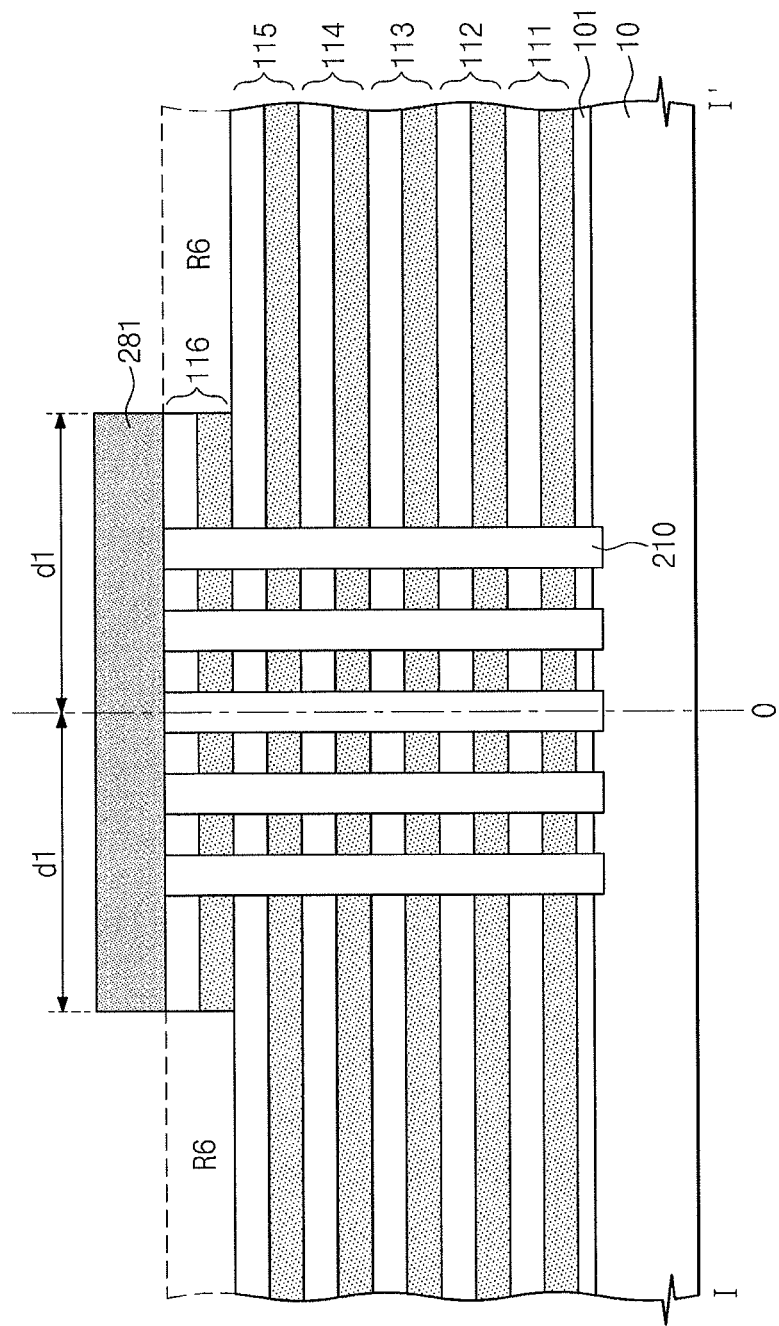

Referring to FIGS. 6 and 7, a first photoresist film 281 may be formed to cover the vertical channel structures 210. The formation of the first photoresist film 281 may include forming a photoresist material on the stacked structure 100, and sequentially performing a pre-baking process, an exposure process, a development process, and a post-baking process on the resultant structure provided with the photoresist material. The first photoresist film 281 may include an organic material. Distances from a specific origin O to two edges of the first photoresist film 281, i.e., as measured along the first and second directions, may be given by d1, where the origin O may be located at a central point of the memory region MR shown in FIG. 2 or a central one of the vertical channel structures 210 formed in the memory region MR. In the meantime, the distance d1 may be a parameter for exemplarily comparing widths of the first photoresist film 281 and other photoresist films to be described below with each other. That is, a width of the first photoresist film 281 measured along each of the first and second directions may be given by 2·d1.

A portion R6 of the sixth horizontal layer 116 may be removed by a patterning process using the first photoresist film 281 as an etch mask. For instance, the patterning process may be performed by an anisotropic dry etching technique using plasma. As the result of the patterning process, a top surface of the fifth horizontal layer 115 may be exposed by the patterned sixth horizontal layer 116. In some embodiments, the first photoresist film 281 may be removed after the patterning process of the sixth horizontal layer 116.

Figure 8:
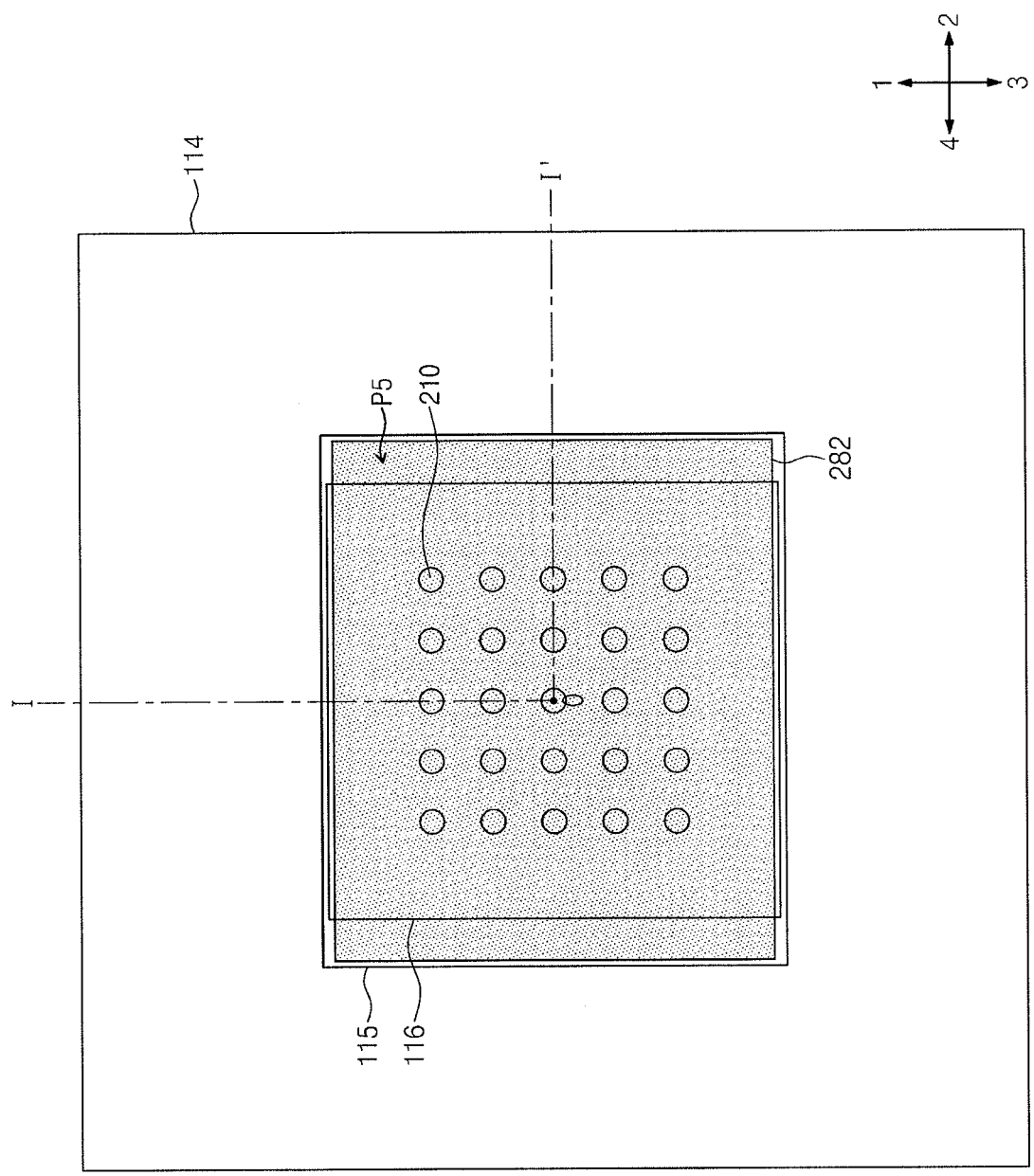
Figure 9:
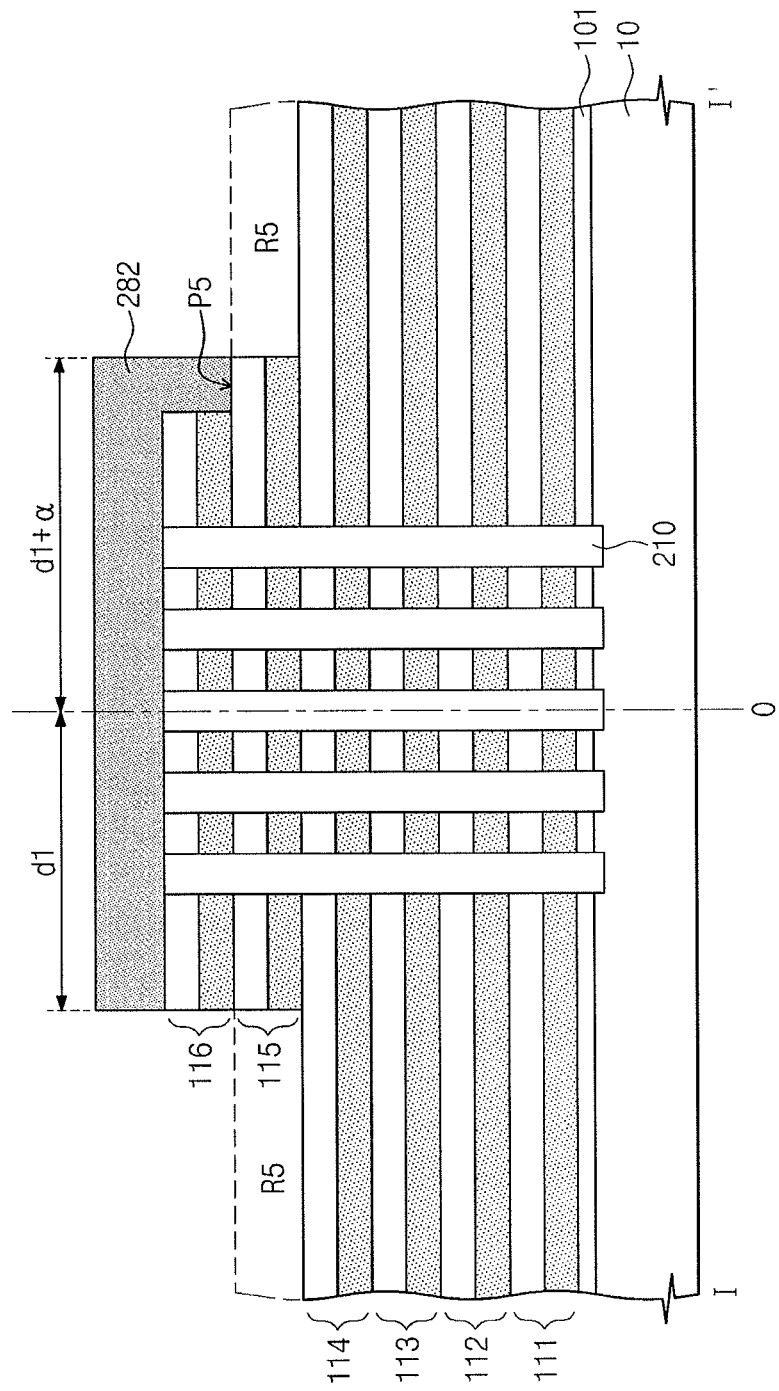

Referring to FIGS. 8 and 9, a second photoresist film 282 may be formed on the stacked structure 100. Distances from the origin O to two edges of the second photoresist film 282, i.e., as measured along the first and second directions, may be given by d1 and d1+α, respectively. That is, a first directional width of the second photoresist film 282 may be 2·d1, and a second directional width of the second photoresist film 282 may be 2·d1+2·α. A first directional width of the first photoresist film 281 may be still given by 2·d1.

A portion R5 of the fifth horizontal layer 115 may be removed by a patterning process using the second photoresist film 282 as an etchmask. As the result of the patterning process, a pad P5 may be formed at an edge portion of the fifth horizontal layer 115. A second directional width of the pad P5 may be given by a. Since first directional widths of the first and second photoresist films 281 and 282 are substantially the same, the long sidewall of the fifth horizontal layer 115 may be aligned with the long sidewall of the sixth horizontal layer 116. That is, the first directional sidewalls of the fifth and sixth horizontal layers 115 and 116 may be substantially coplanar with each other, so a step structure having a width a may be formed only in the second direction for forming the pad P5 as illustrated in FIGS. 8-9. The second photoresist film 282 may be removed after the patterning of the fifth horizontal layer 115.

Figure 10:
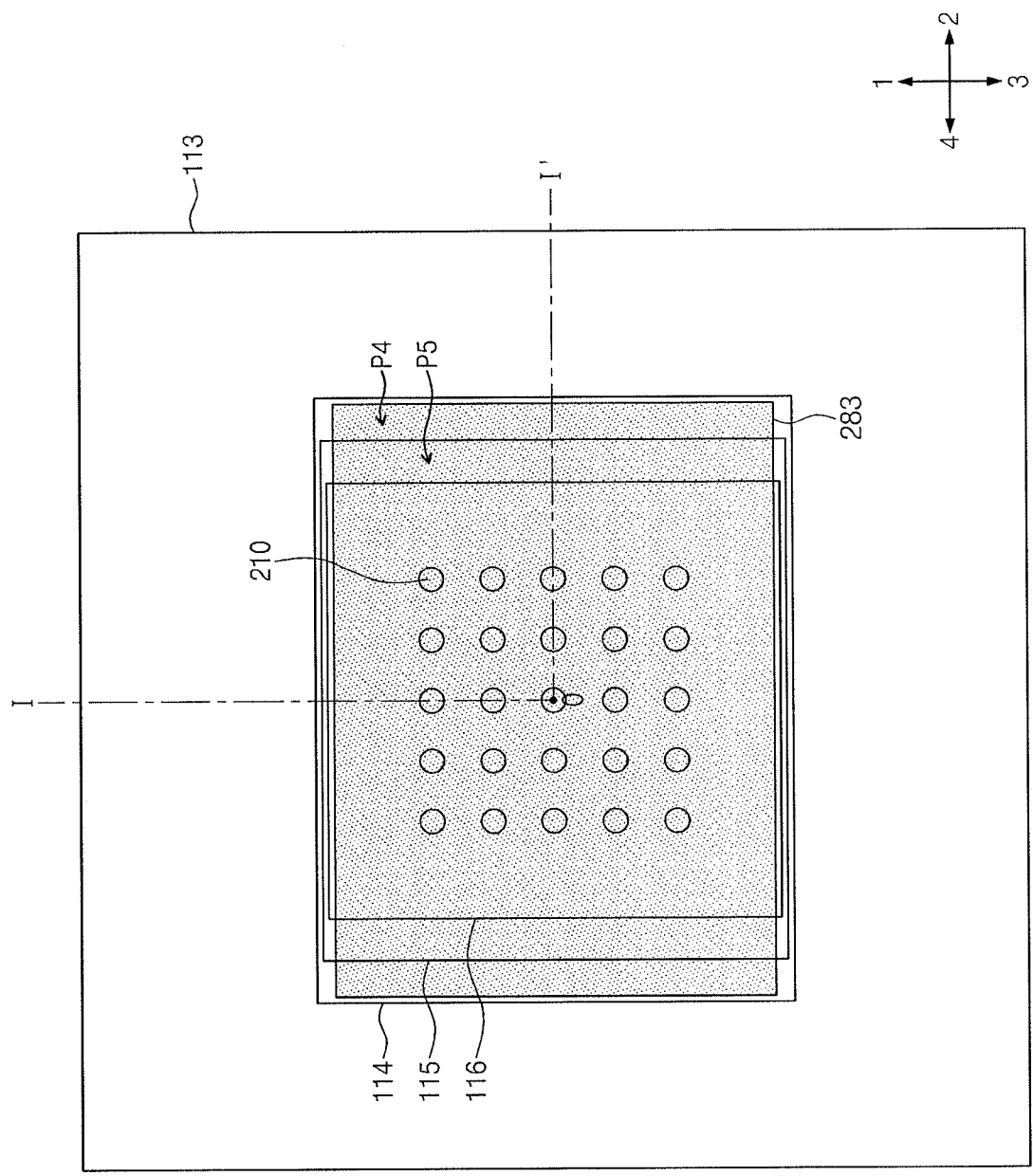
Figure 11:
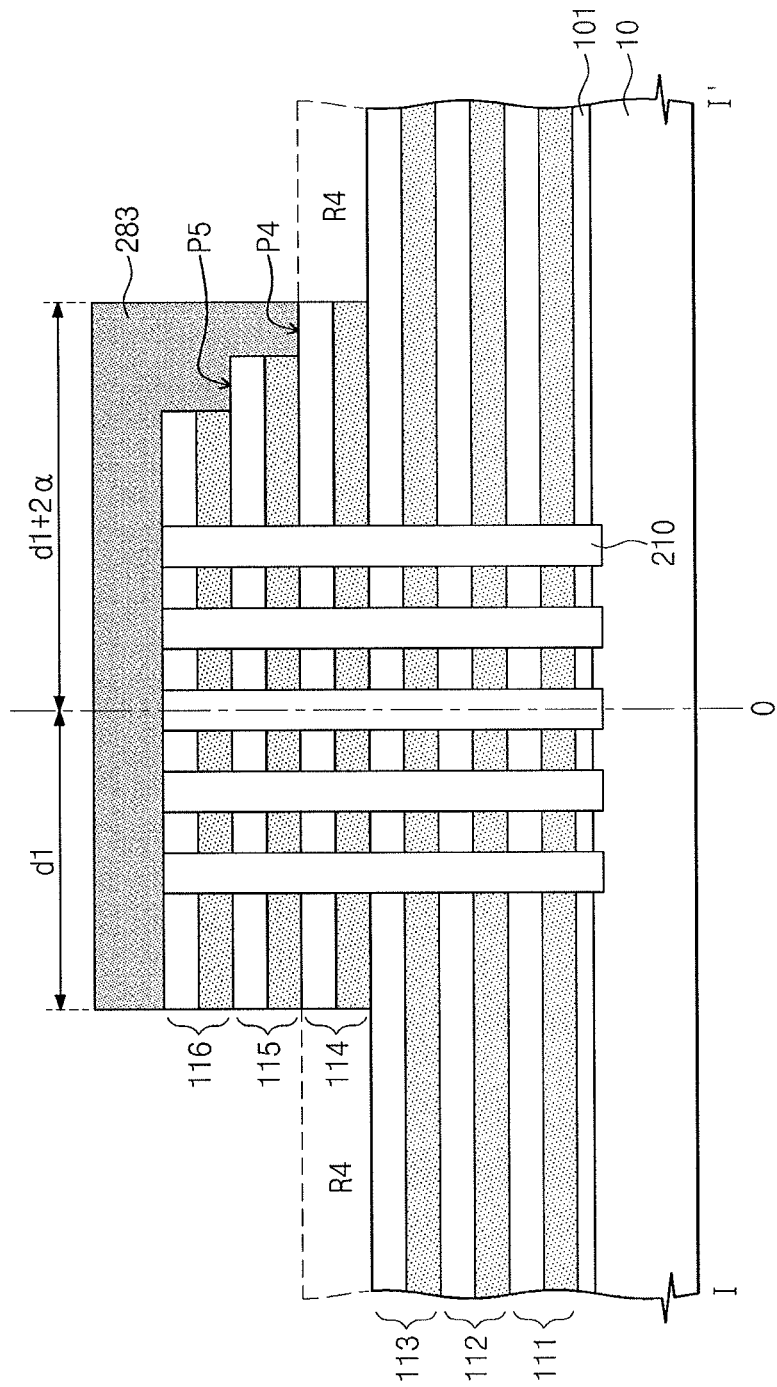

Referring to FIGS. 10 and 11, a third photoresist film 283 may be formed on the stacked structure 100. The first and second directional distances from the origin O to two edges of the third photoresist film 283, i.e., as measured along the first and second directions, may be given by d1 and d1+2·α, respectively. Thereafter, the fourth horizontal layer 114 may be patterned using the third photoresist film 283 as an etch mask. During the patterning of the fourth horizontal layer 114, a portion R4 of the fourth horizontal layer 114 may be removed, and consequently, a pad P4 may be formed at an edge portion of the fourth horizontal layer 114. A second directional width of the pad P4 may be given by a.

In sum, according to the aforementioned embodiments, each of the horizontal layers 114 to 116 may be patterned using several photoresist films 281 to 283 having different widths from each other along the second direction. As a result, as described with reference to FIGS. 6 through 11, the second directional distances from the origin O to edges of the photoresist films 281 to 283 may increase stepwise, e.g., from d1 to d1+α to d1+2·α respectively. That is, the patterning of the respective horizontal layers 114 to 116 may be performed using a new photoresist film having an increased second directional width (for instance, a second directional width increased by the distance a from the origin O), compared with the previously used photoresist film. By contrast, the first directional distances from the origin O to edges of the respective photoresist films 281 to 283 may be substantially the same distance of d1 for all the horizontal layers 114 to 116. Thereafter, the first, second, and third horizontal layers 111 to 113 may be patterned in a same manner as described with reference to FIGS. 6 through 11, and consequently, the first pad region PR1 shown in FIGS. 2 and 3 may be formed near the memory region MR. As described above, in the case that the first material layers 131 to 136 are formed of the sacrificial layers, additional processes, which will be described with reference to FIGS. 50 through 52, may be further performed after the forming of the first pad region PR1.

Figure 13:
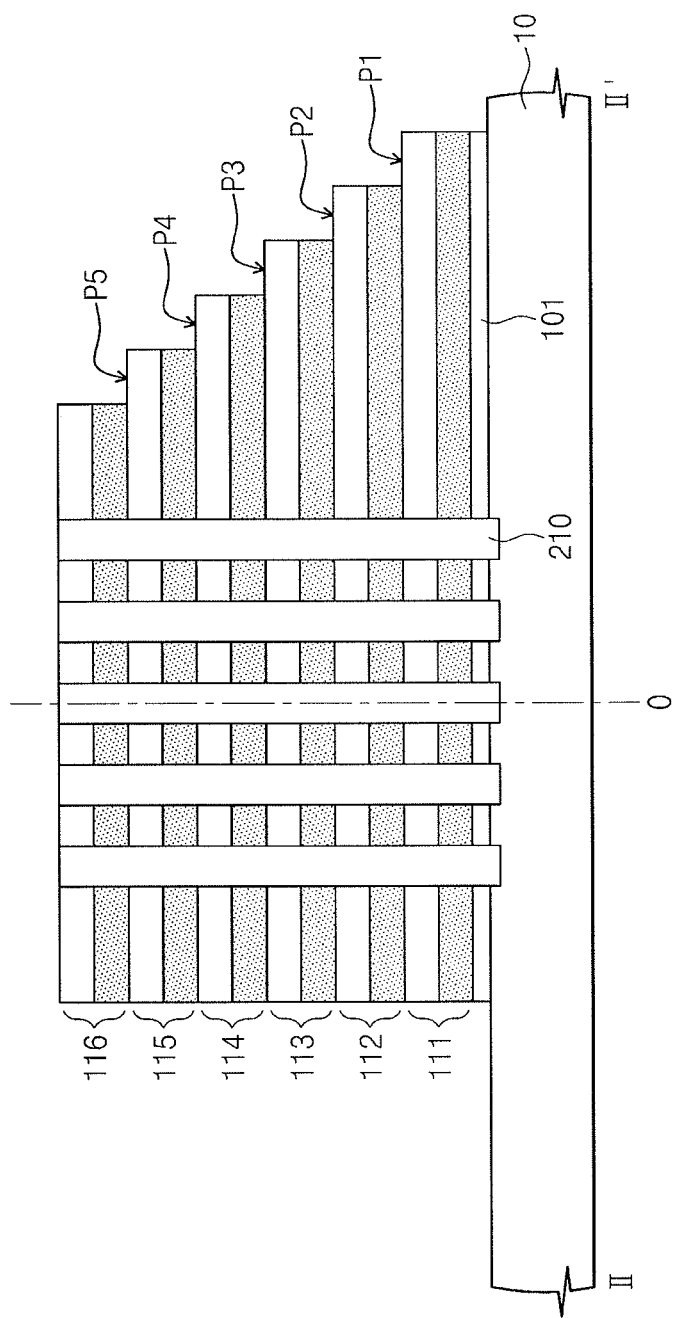

FIG. 12 is a plan view of a 3D semiconductor device according to modifications of the first embodiment of the inventive concept, and FIG. 13 is a cross-sectional view taken along line II-II' of FIG. 12. Referring to FIGS. 12 and 13, the first pad region PR1 may be provided in the second directional adjacent region. However, the first pad region PR1 may not be provided in the fourth directional adjacent region, unlike the first embodiment described with reference to FIGS. 2 through 11. That is, in the case that the memory region MR has a tetragonal shape in a plan view, the first pad region PR1 may be partially formed only in the region near the first side, i.e., except for regions near the second to fourth sides. This disposal of the first pad region PR1 can be realized by changing widths of the first to third photoresist films 281 to 283 described with reference to FIGS. 6 through 11. For instance, in the case that the patterning steps of the horizontal layers are performed under the condition that the fourth directional distances from the origin O to edges of the first to third photoresist films 281 to 283 are fixed to the distance d1, the first pad region PR1 may be partially provided at one side of the memory region MR as shown in FIGS. 12 and 13.

The first pad region PR1 may include first to fifth pads P1 to P5. A plurality of contact plugs CT may be formed on each of the first to fifth pads P1 to P5. In addition, the plurality of the contact plugs CT disposed on each pad may be electrically connected to each other by a global word line GWL. According to the aforementioned modifications of the first embodiment of the inventive concept, occupying area of the pad region may be reduced.

Second Embodiment

Figure 14:
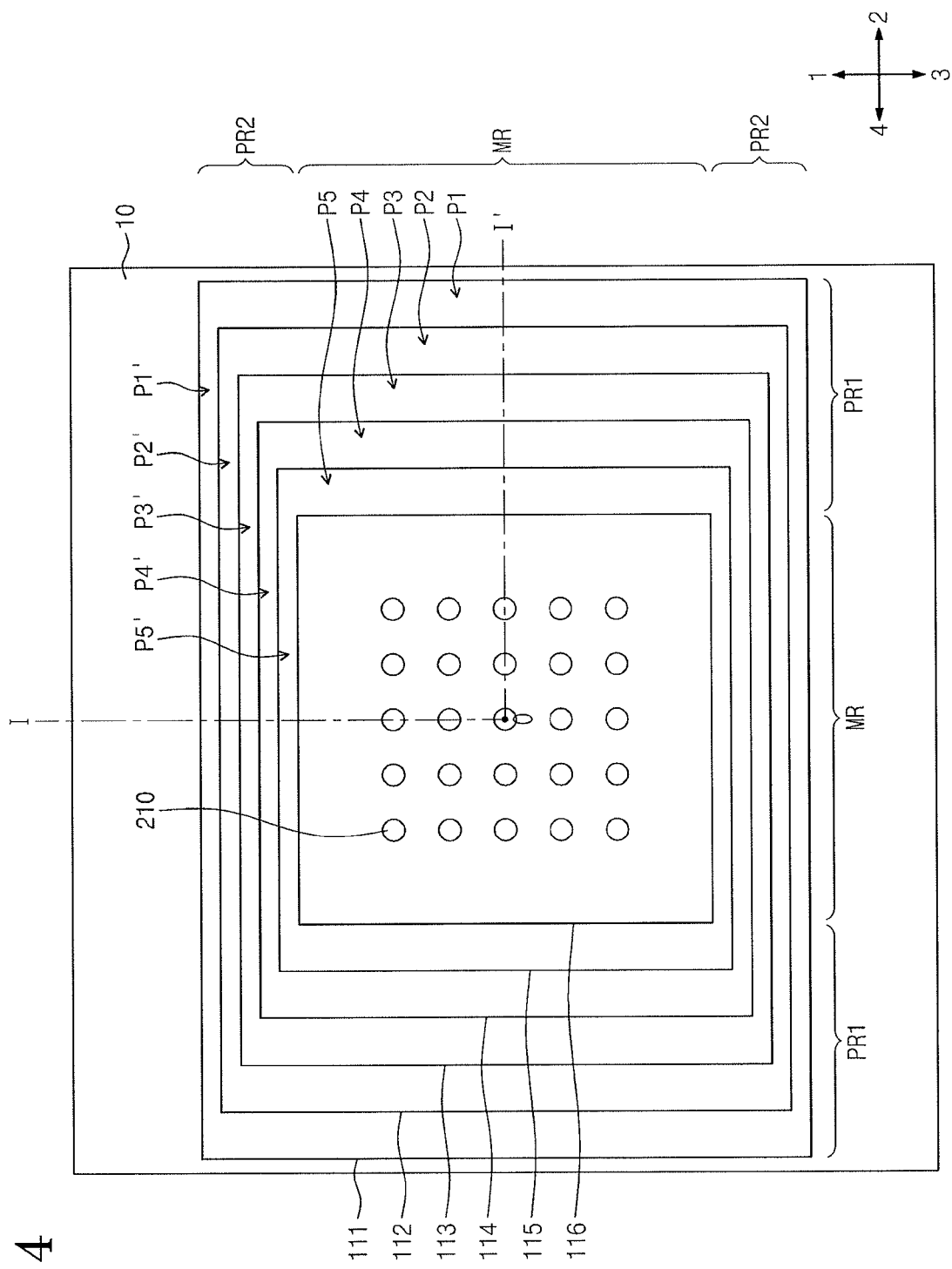
FIGS. 14 and 15 illustrate schematic planar and cross-sectional views, respectively, of a 3D semiconductor device according to a second embodiment of the inventive concept.
Figure 15:
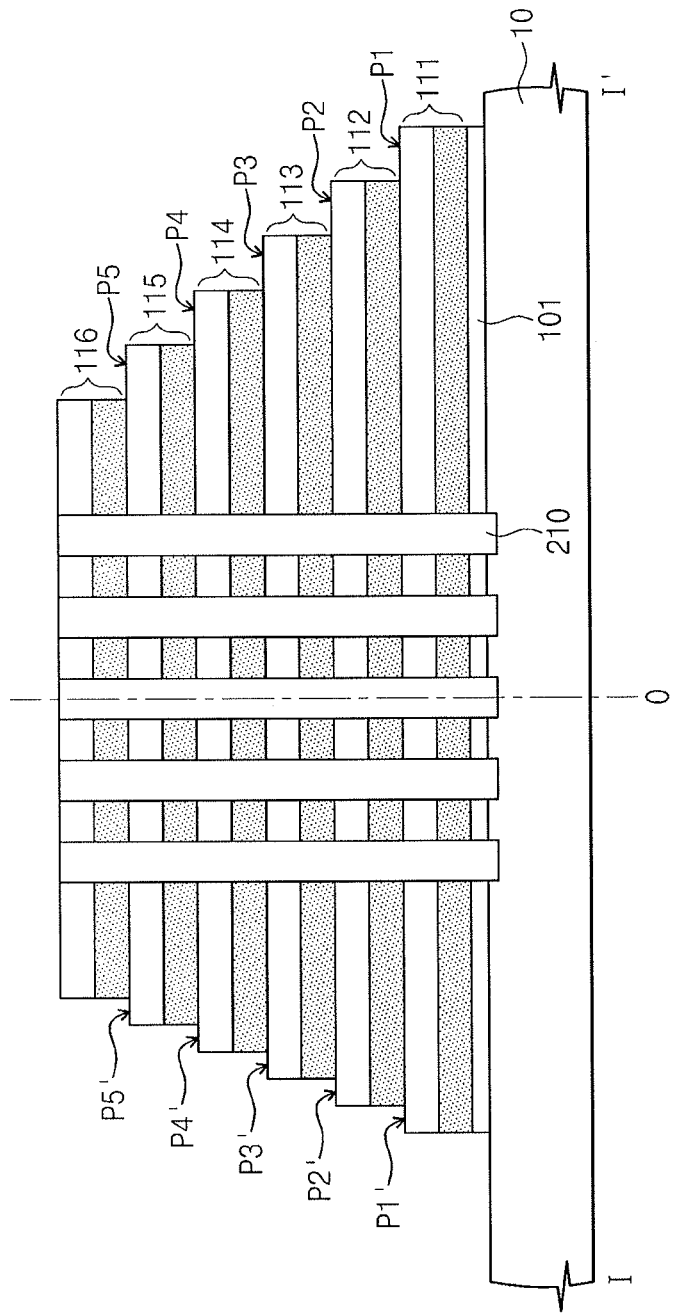

FIG. 14 is a plan view of a 3D semiconductor device according to a second embodiment of the inventive concept, and FIG. 15 is a cross-sectional view taken along line I-O-I' of FIG. 14. For ease of description, overlapping description of elements or technical features previously described with reference to FIGS. 2 through 13 may be omitted.

Referring to FIGS. 14 and 15, the first pad region PR1 may be provided in the second and fourth directional adjacent regions. The first pad region PR1 may be formed to have a substantially same shape or configuration as in the first embodiment. A second pad region PR2 may be provided in the first and third directional adjacent regions. The second pad region PR2 may be a region including second pads P1'-P5' having smaller widths than the first pads P1-P5 of the first pad region PR1. For instance, the widths of the second pads P1'-P5' may be less than half of those of the first pads P1-P5. In some embodiment, the contact plugs (not shown) may not be provided on the second pads P1'-P5', while they may be provided on the first pads P1-P5. In other embodiments, the contact plugs may be provided on at least one of the second pads P1'-P5'.

In still other embodiments, not as shown in FIGS. 14 and 15, the first pad region PR1 and the second pad region PR2 may not be provided in the third and fourth directional adjacent regions.

Figure 16:
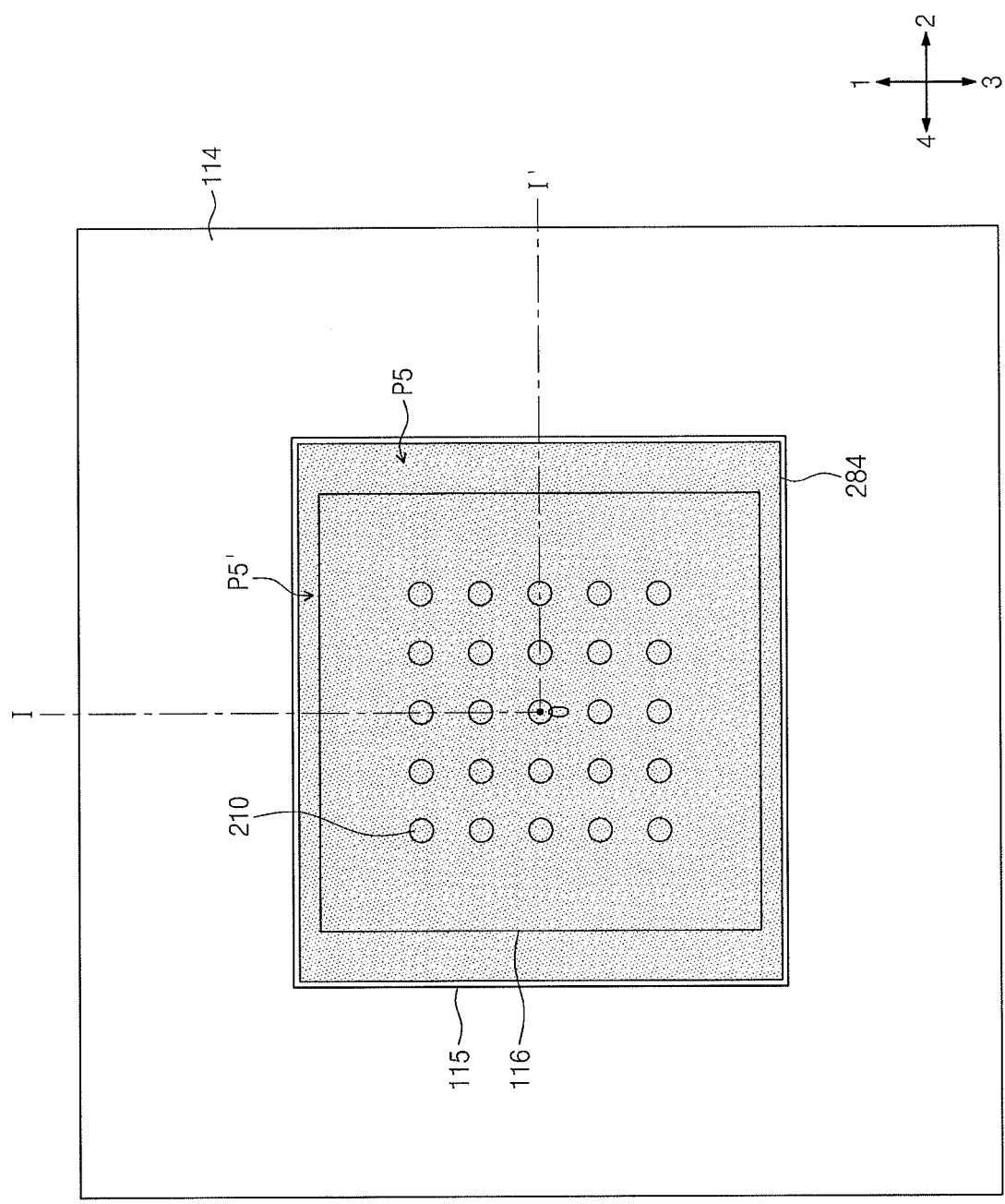
FIGS. 16 and 17 illustrate methods of fabricating a 3D semiconductor device according to a second embodiment of the inventive concept.
Figure 17:
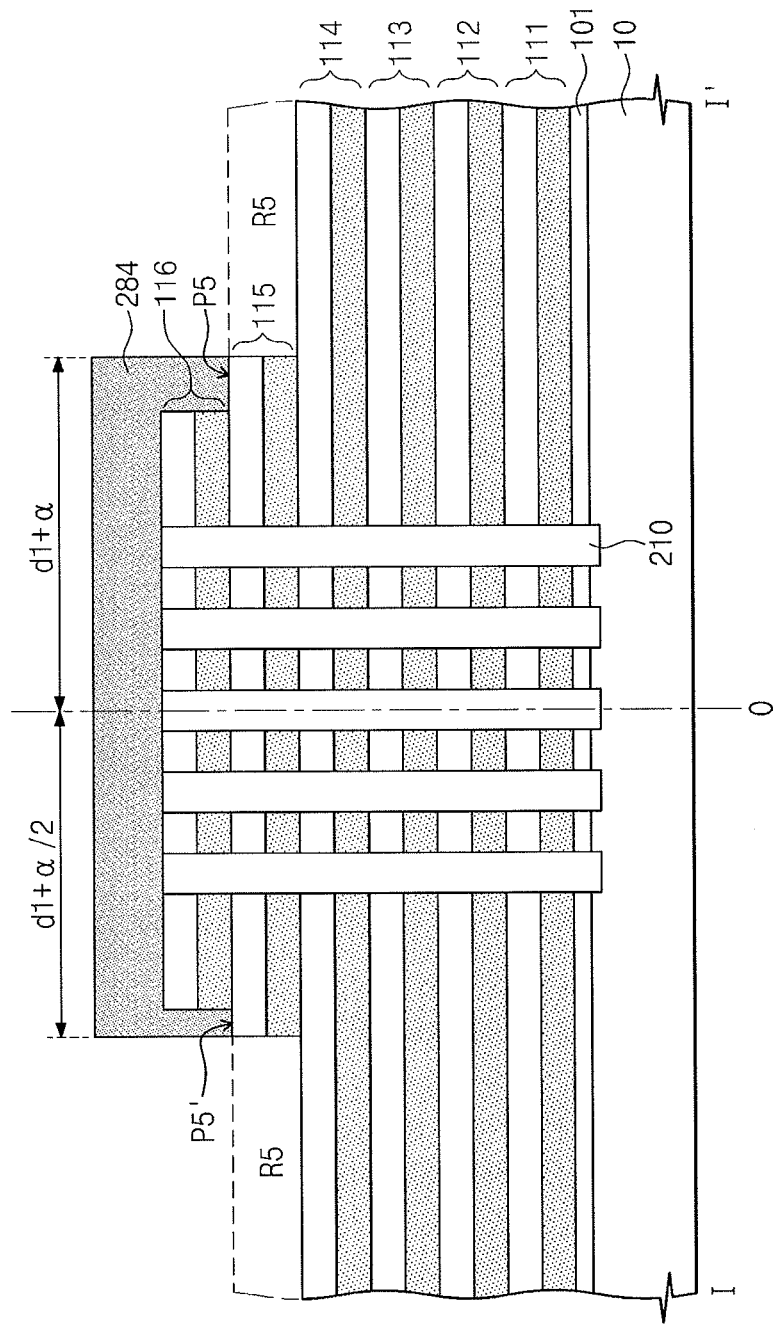

FIG. 16 is a plan view of methods of fabricating a 3D semiconductor device according to a second embodiment of the inventive concept, and FIG. 17 is a cross-sectional view taken along line I-O-I' of FIG. 16. Referring to FIGS. 16 and 17, a fourth photoresist film 284 may be formed on the resultant structure described with reference to FIGS. 6 and 7. First and second directional distances from the origin O to edges of the fourth photoresist film 284 may be given by d1+α/2 and d1+α, respectively. First directional distances from the origin O to edges of photoresist films may increase stepwise by a distance of α/2, e.g., the distances may be given by d1, d1+α/2, d1+α, d1+3·α/2, and the like. Second directional distances from the origin O to edges of photoresist films may increase stepwise by a distance of α, e.g., the distances may be given as d1, d1+α, d1+2·α, d1+3·α, and the like. In sum, according to the second embodiment of the inventive concept, the photoresist films having direction-dependent incremental widths as patterning masks may be used to form the first pad region PR1 and the second pad region PR2, and thus, the first and second pad regions PR1 and PR2 may be formed to have different directional widths.

Third Embodiment

Figure 18:
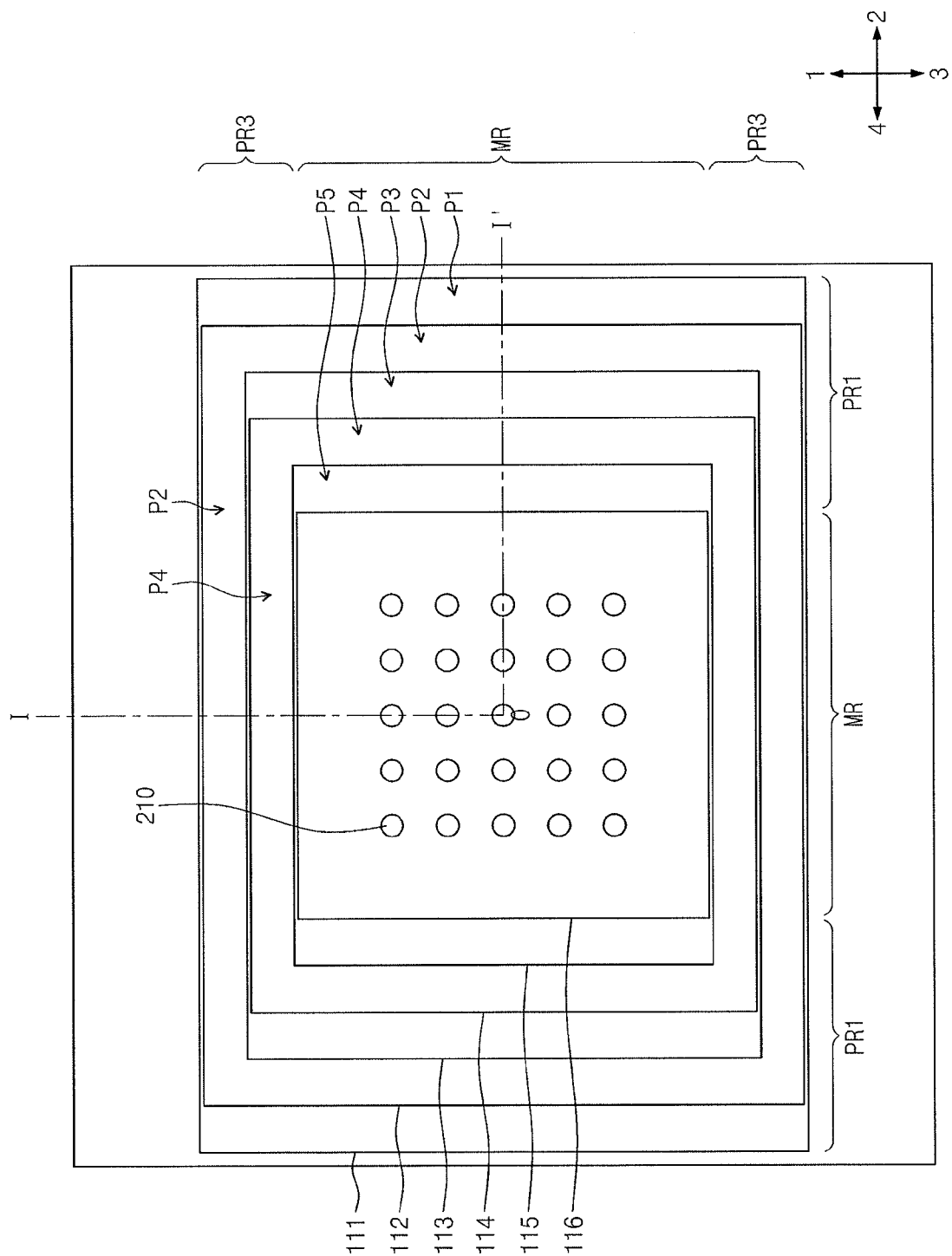
FIGS. 18 and 19 illustrate schematic planar and cross-sectional views, respectively, of a 3D semiconductor device according to a third embodiment of the inventive concept.
Figure 19:
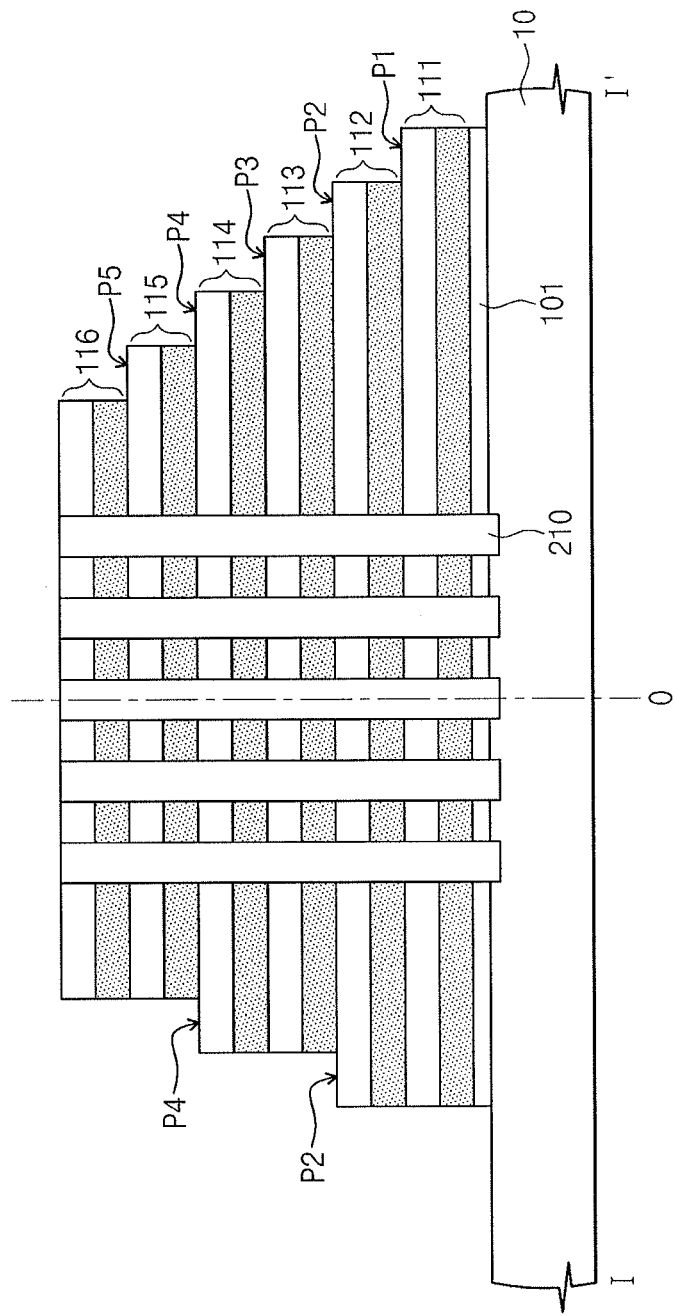

FIG. 18 is a plan view of a 3D semiconductor device according to a third embodiment of the inventive concept, and FIG. 19 is a cross-sectional view taken along line I-O-I' of FIG. 18. For ease of description, overlapping description of elements or technical features previously described with reference to FIGS. 2 through 17 may be omitted.

Referring to FIGS. 18 and 19, the first pad region PR1 may be provided in the second and fourth directional adjacent regions of the memory region MR. The first pad region PR1 may be formed to have a substantially same shape or configuration as the first embodiment. A third pad region PR3 may be provided in the first and third directional adjacent regions of the memory region MR. In some embodiment, the third pad region PR3 may be realized by pads formed on some of the horizontal layers 111 to 116. That is, in the first direction, some of the horizontal layers 111 to 116 may be formed to define the pad, but the remaining horizontal layers may be formed not to define such pad. For instance, as shown in FIGS. 18 and 19, the third pad region PR3 may include pads P2 and P4, which are formed on the second and fourth horizontal layers 112 and 114, respectively. That is, each of the pads may be formed on every two horizontal layers. As a result, for instance, the fifth and sixth horizontal layers 115 and 116 may have the first directional sidewalls aligned and coplanar with each other. Similarly, the third and fourth horizontal layers 113 and 114 may have the first directional sidewalls aligned with each other, and the first and second horizontal layers 111 and 112 may have the first directional sidewalls aligned with each other. Sidewalls of the third and fourth horizontal layers 113 and 114 may be spaced apart from sidewalls of the fifth and sixth horizontal layers 115 and 116 by the width of the pad P4, i.e., a. Sidewalls of the first and second horizontal layers 111 and 112 may be spaced apart from sidewalls of the third and fourth horizontal layers 113 and 114 by the width of the pad P2, i.e., a. In other embodiments, not as shown in FIGS. 18 and 19, each of the pads may be formed on every three or more horizontal layers. In some embodiment, the contact plugs (not shown) may not be provided on the third pad region PR3, while they may be provided on the first pad region PR1. In other embodiments, the contact plugs may be provided on both of the first and third pad regions PR1 and PR3.

FIGS. 20, 22, 24, 26, and 28 are plan views illustrating methods of fabricating a 3D semiconductor device according to a third embodiment of the inventive concept, and FIGS. 21, 23, 25, 27, and 29 are sectional views along line I-O-I' of FIGS. 20, 22, 24, 26, and 28.

Figure 20:
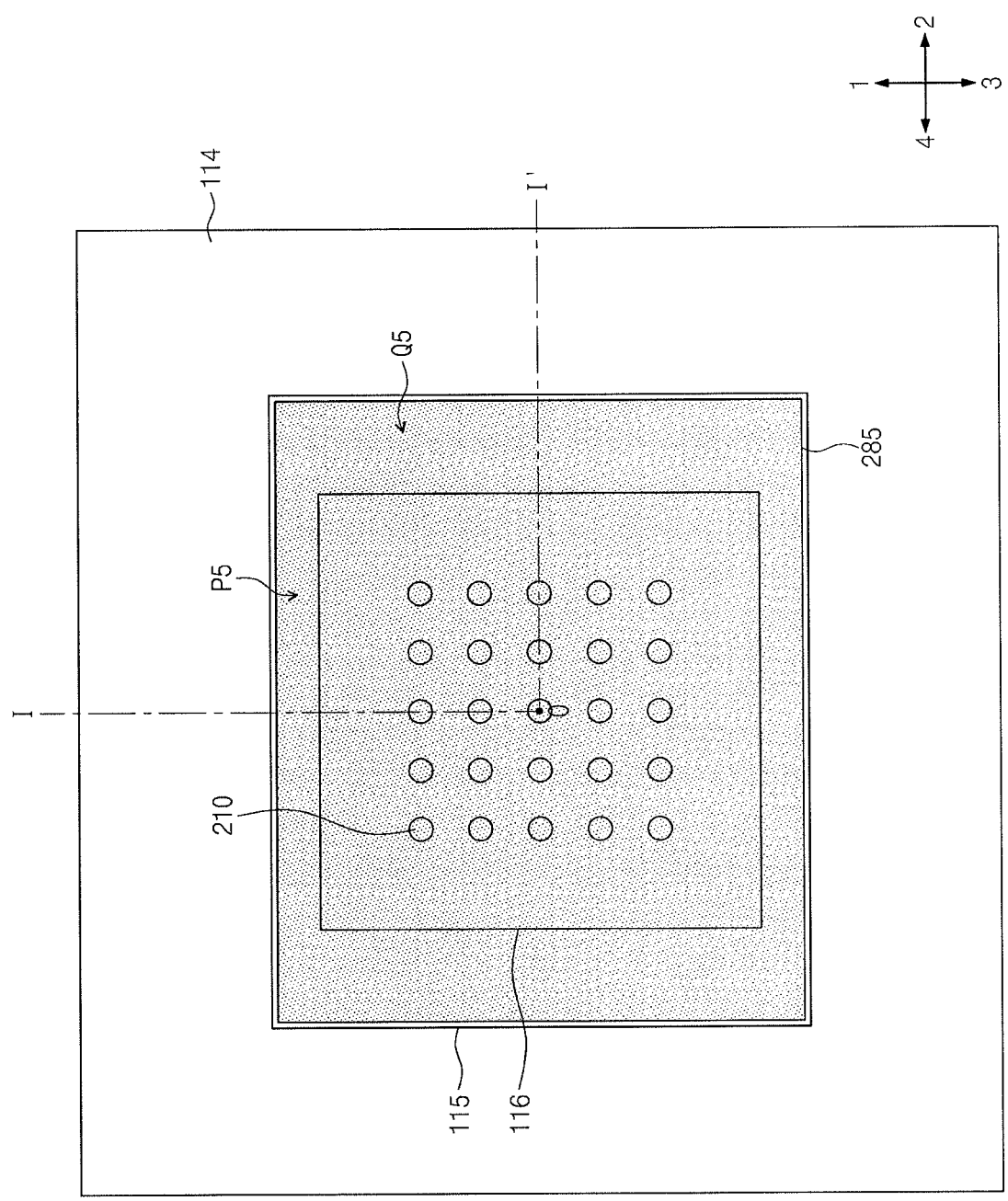
FIGS. 20 through 29 illustrate methods of fabricating a 3D semiconductor device according to a third embodiment of the inventive concept.
Figure 21:
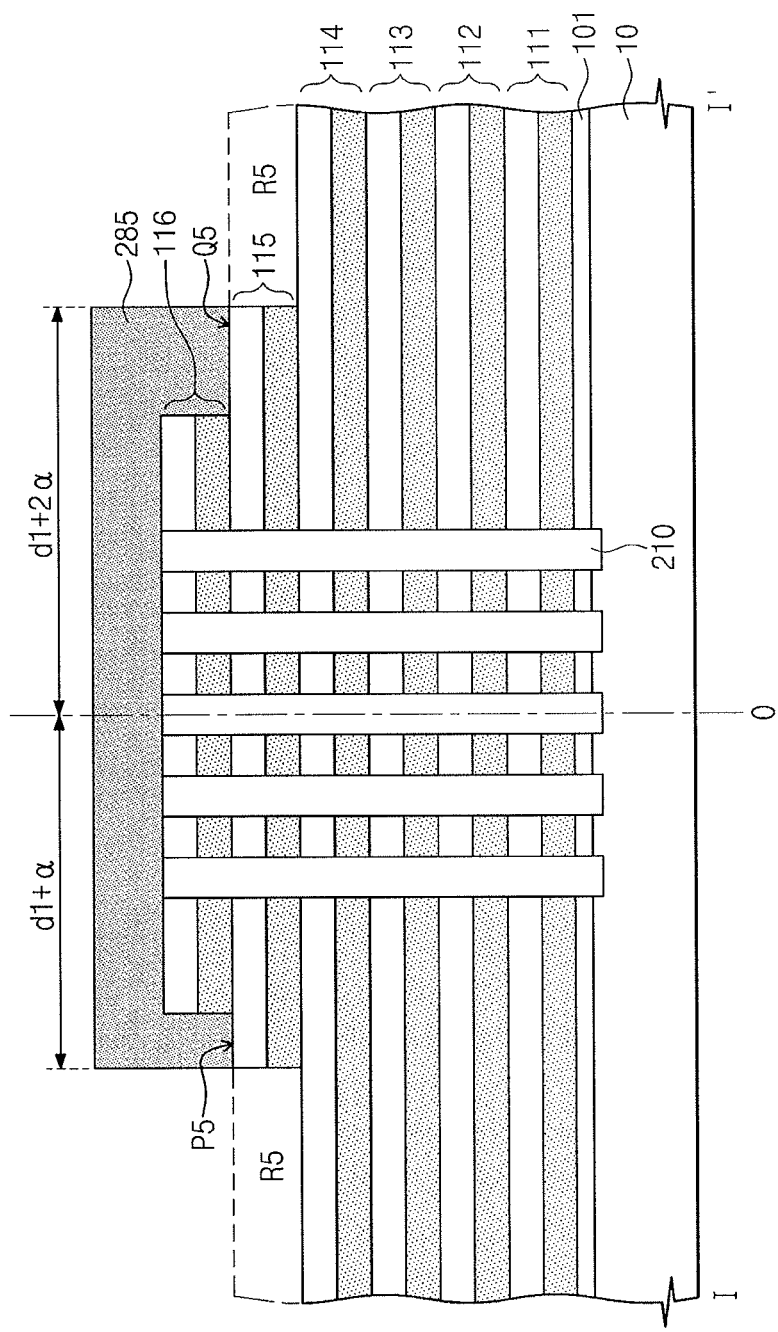

Referring to FIGS. 20 and 21, a fifth photoresist film 285 may be formed on the resultant structure described with reference to FIGS. 6 and 7. First and second directional distances from the origin O to edges of the fifth photoresist film 285 may be given by $d1+\alpha$ and $d1+2\cdot\alpha$, respectively. The fifth horizontal layer 115 may be patterned using the fifth photoresist film 285 as an etch mask. A portion R5 of the fifth horizontal layer 115 may be removed by the patterning of the fifth horizontal layer 115. As the result of the patterning process, a pad P5 may be formed in the first and third directional adjacent regions, and a pad Q5 may be formed in the second and fourth directional adjacent regions. A width of the pad Q5 may be greater than that of the pad P5. For instance, the width of the pad Q5 may be twice as large as the width of the pad P5.

Figure 22:
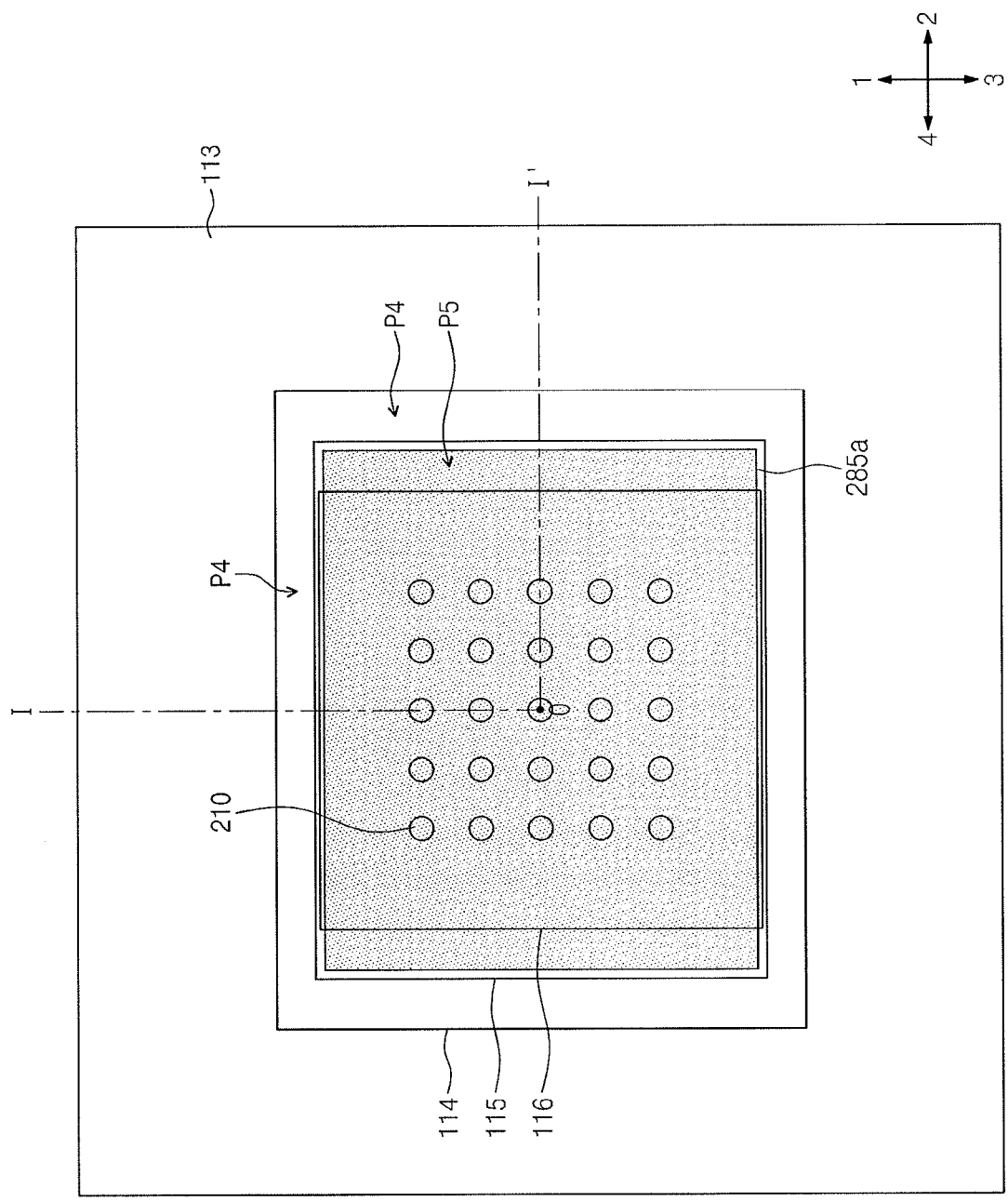
Figure 23:
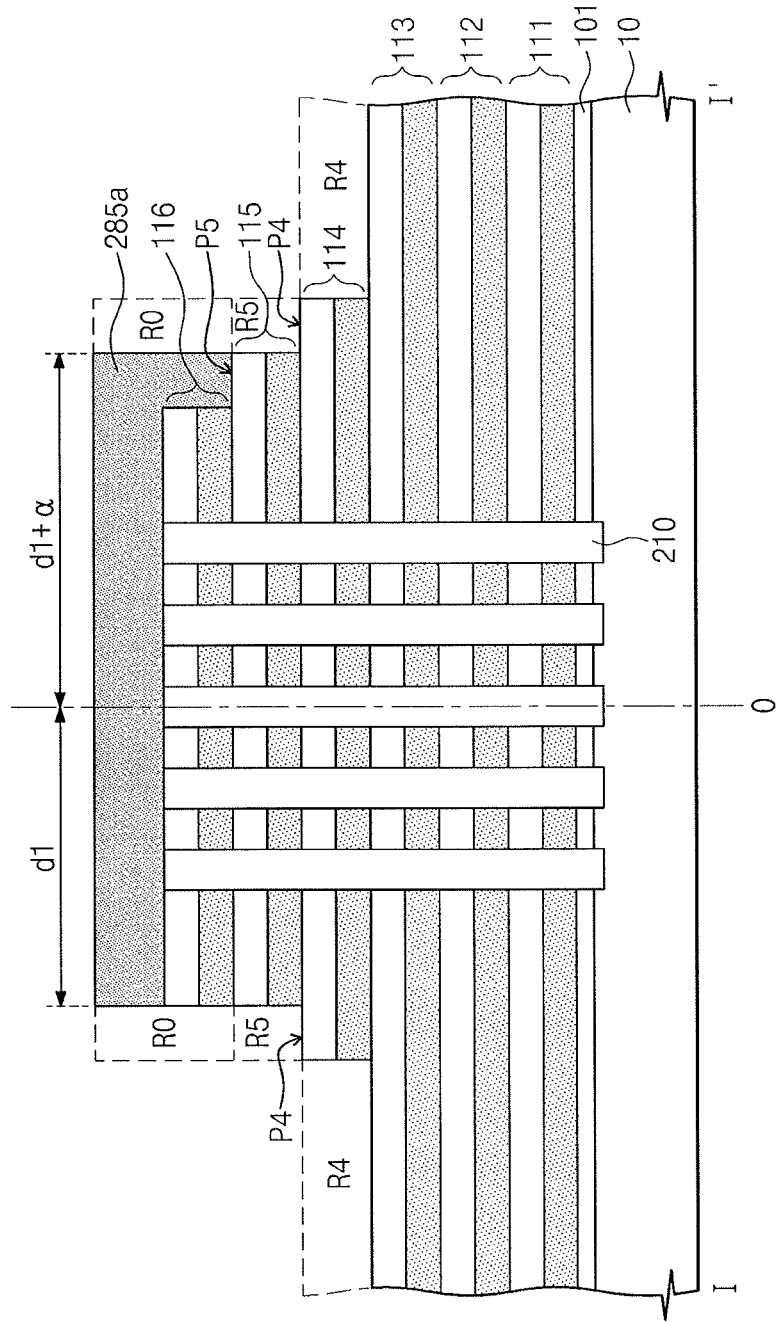

Referring to FIGS. 22 and 23, a fifth photoresist pattern 285a may be formed by removing a portion R0 of the fifth photoresist film 285. The removal of the portion R0 may be performed using a dry and/or wet isotropic etch process. In some embodiments, a top surface of the fifth photoresist film 285 may be partially removed together with the portion R0 not as shown in FIGS. 22 and 23, but for easier understanding of example embodiments of the inventive concept, the etching on the top surface of the fifth photoresist film 285 and the resultant structure may be omitted hereinafter. Due to the isotropic etching process, sidewalls of the fifth photoresist film 285 may be laterally recessed by a width a. That is, first and second directional distances from the origin O to edges of the fifth photoresist pattern 285a may be given by $d1$ and $d1+\alpha$, respectively. A portion R5 of the fifth horizontal layer and a portion R4 of the fourth horizontal layer may be etched using the fifth photoresist pattern 285a as an etch mask. The etching of the fourth and fifth horizontal layers 114 and 115 may be performed by an anisotropic dry etching technique using plasma. As the result of the anisotropic etching of the fourth and fifth horizontal layers 114 and 115, a pad P4 may be formed in the first and third directional adjacent regions, and pads P4 and P5 may be formed in the second and fourth directional adjacent regions. Widths of the pads P4 and P5 may be a, respectively.

Figure 24:
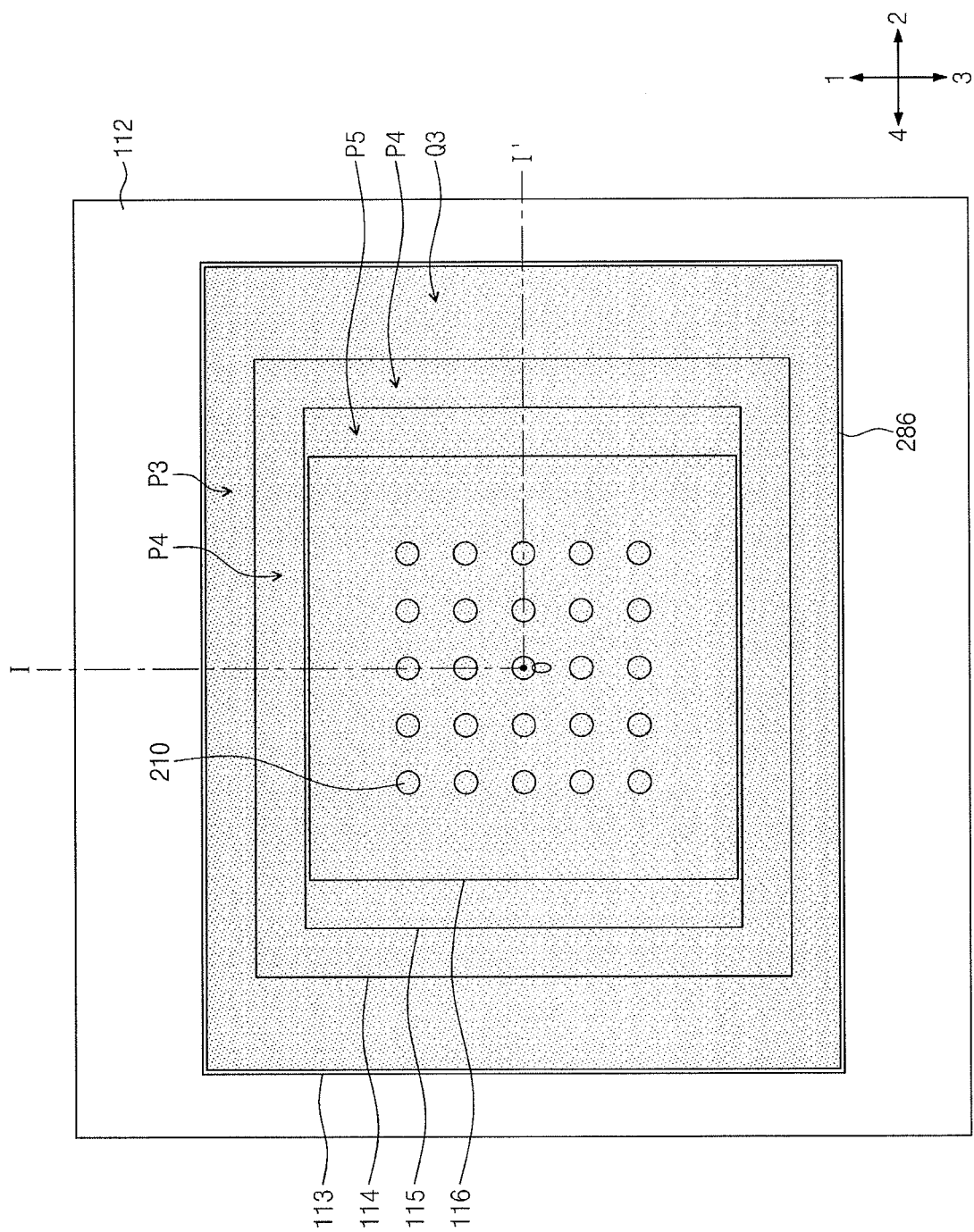
Figure 25:
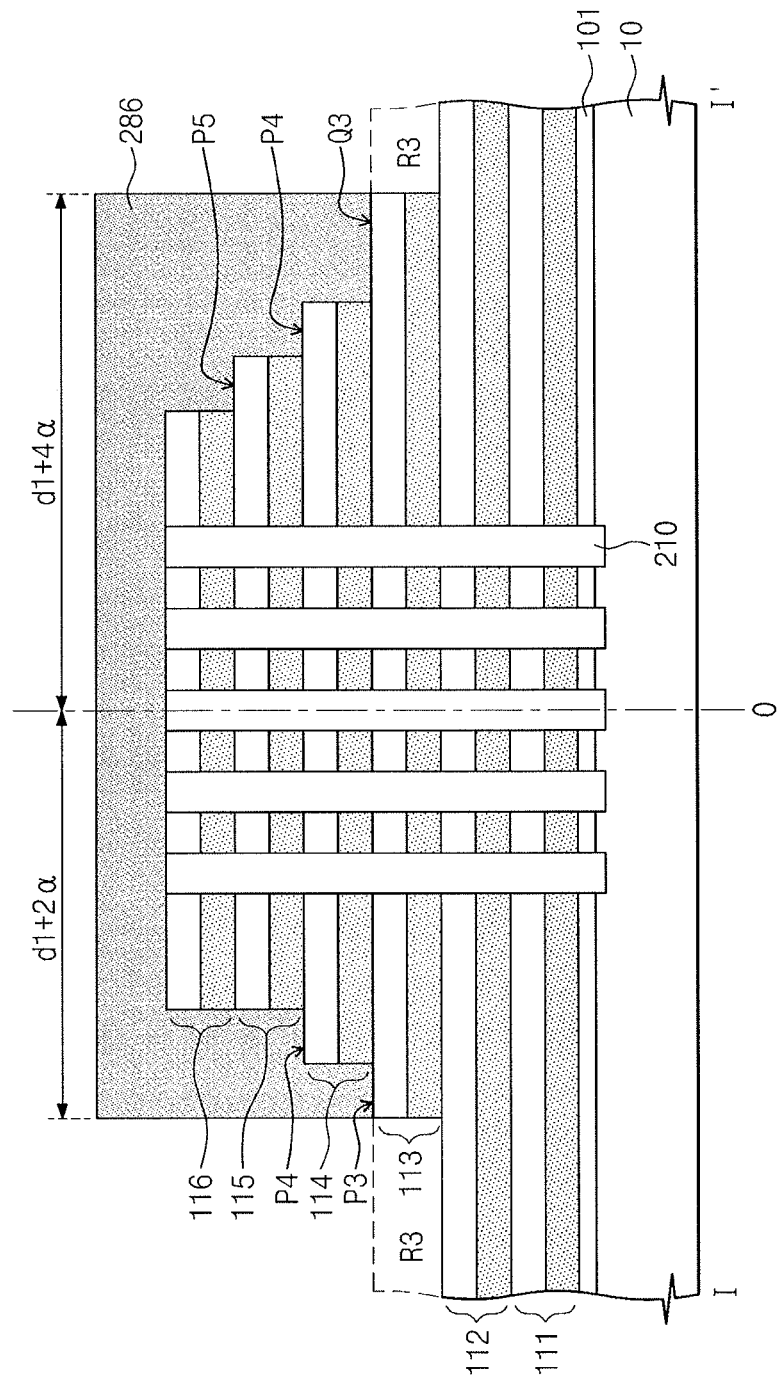

Referring to FIGS. 24 and 25, a sixth photoresist film 286 may be formed on the resultant structure including the pads P4 and P5. The sixth photoresist film 286 may be formed after the removal of the fifth photoresist film 285 or stacked on the resultant structure provided with the fifth photoresist film 285. First and second directional distances form the origin O to edges of the sixth photoresist film 286 may be given by $d1+2\cdot\alpha$ and $d1+4\cdot\alpha$, respectively. The third horizontal layer 113 may be patterned using the sixth photoresist film 286 as an etch mask. A portion R3 of the third horizontal layer 113 may be removed by the patterning of the third horizontal layer 113. As the result of the patterning process, a pad P3 may be formed in the first and third directional adjacent regions with respect to the vertical channel structures 210, and a pad Q3 may be formed in the second and fourth directional adjacent regions. A width of the pad Q3 may be twice (i.e., $2\cdot\alpha$) as large as the width of the pad P5.

Figure 26:
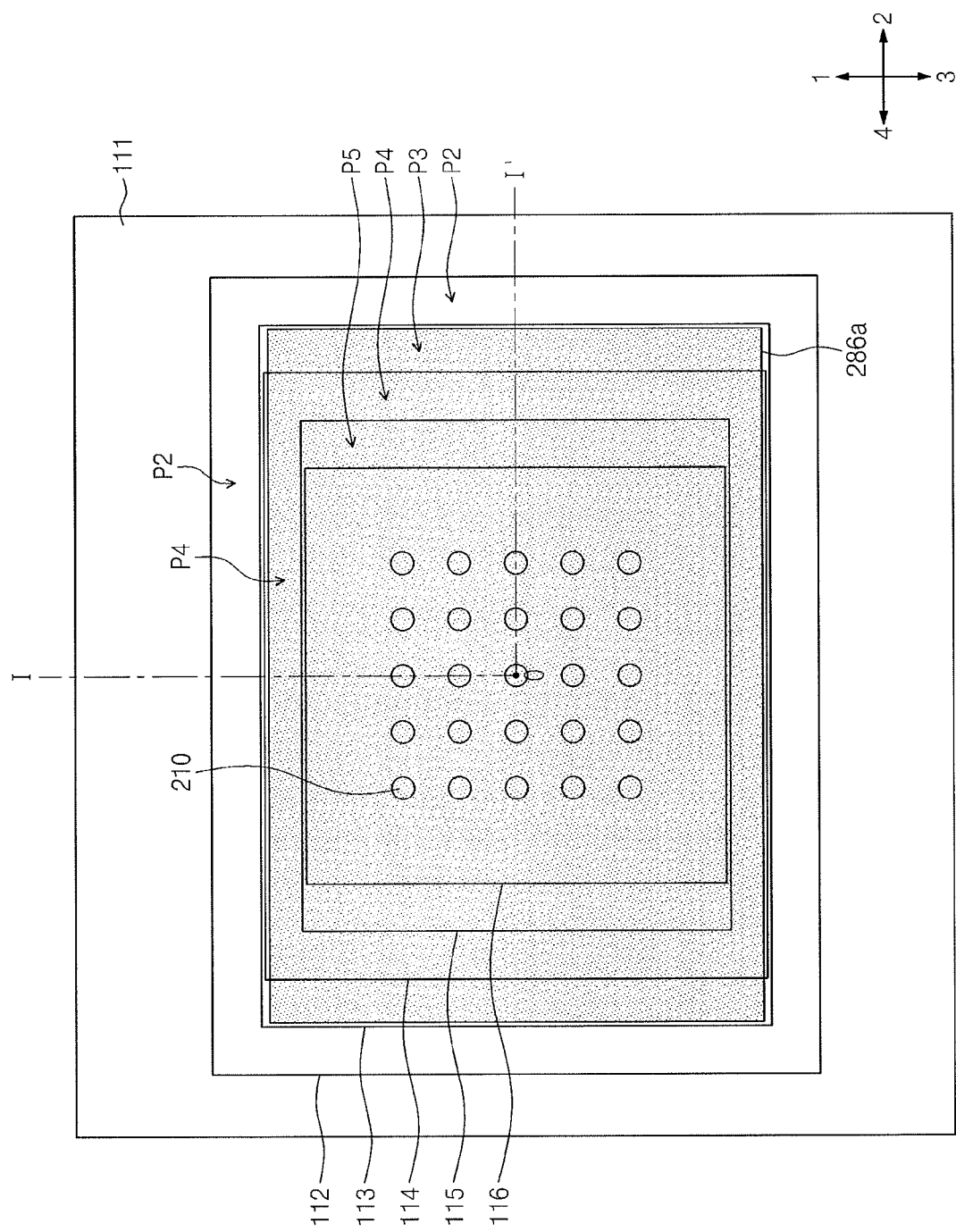
Figure 27:
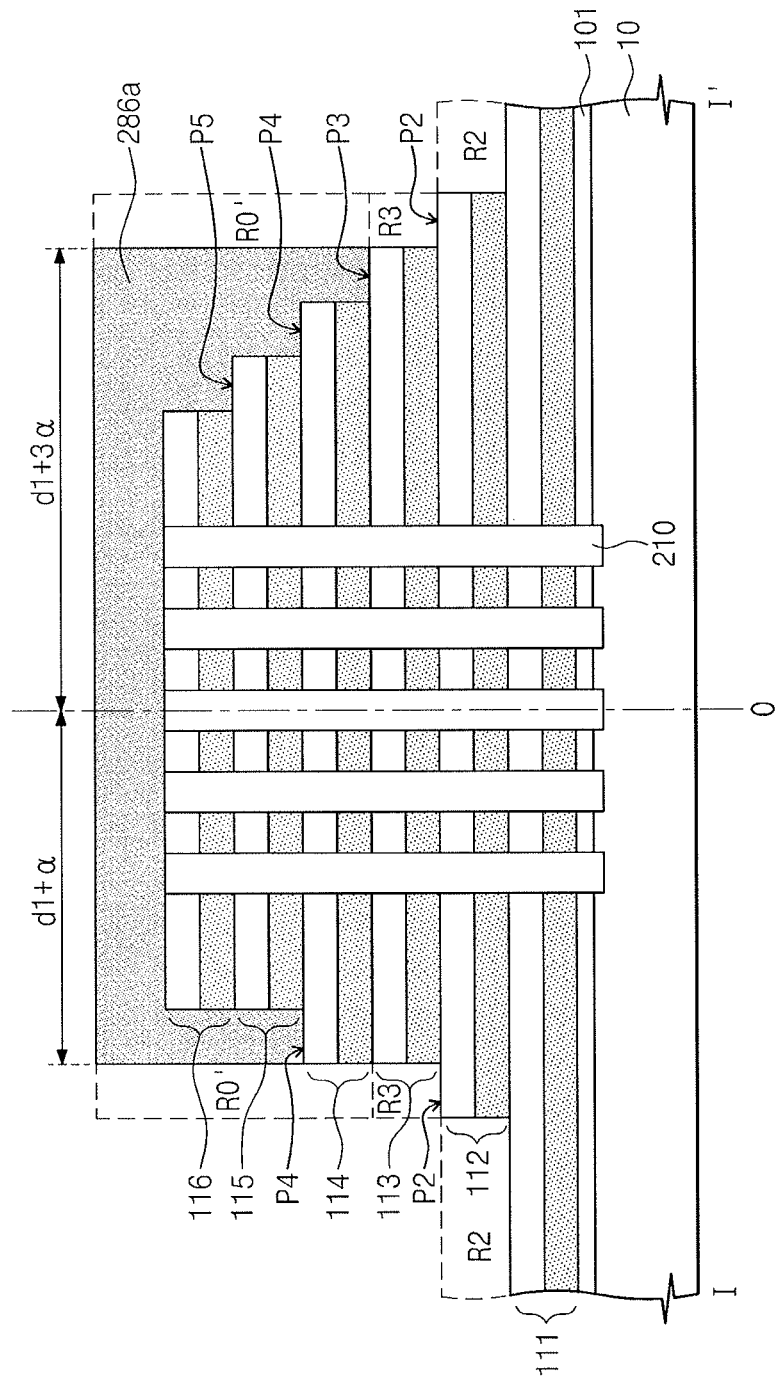

Referring to FIGS. 26 and 27, a sixth photoresist pattern 286a may be formed by removing a portion R0' of the sixth photoresist film 286. The removal of the portion R0' may be performed using a dry and/or wet isotropic etch process. Due to the isotropic etching process, sidewalls of the sixth photoresist film 286 may be laterally recessed by a width a. That is, first and second directional distances from the origin O to edges of the sixth photoresist pattern 286a may be given by $d1+\alpha$ and $d1+3\cdot\alpha$, respectively. A portion R3 of the third horizontal layer and a portion R2 of the second horizontal layer may be etched using the sixth photoresist pattern 286a as an etch mask. As the result of the etching of the second and third horizontal layers 112 and 113, a pad P2 may be formed in the first and third directional adjacent regions, and pads P3 and P2 may be formed in the second and fourth directional adjacent regions. Widths of the pads P2 and P3 may be a, respectively.

Figure 28:
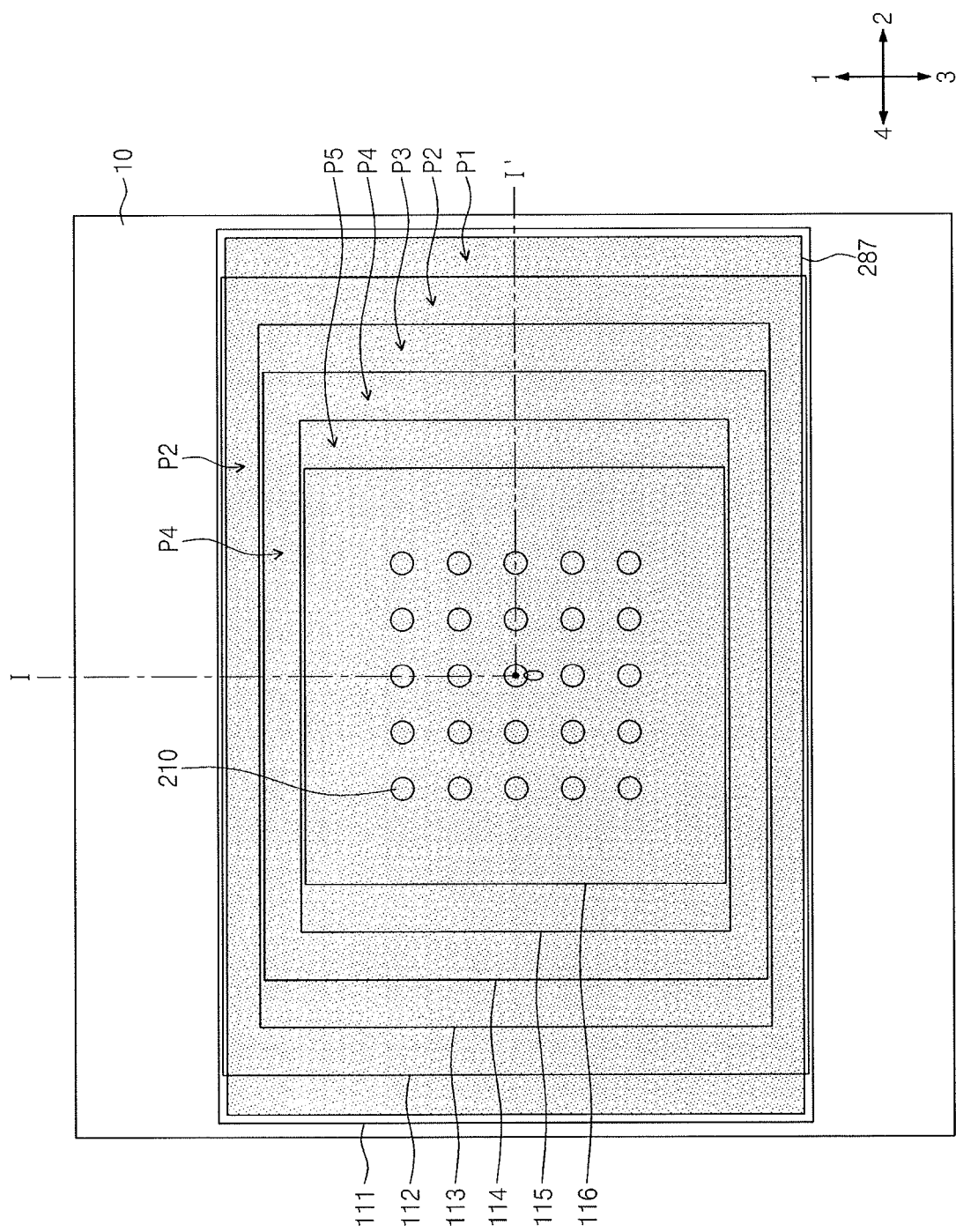
Figure 29:
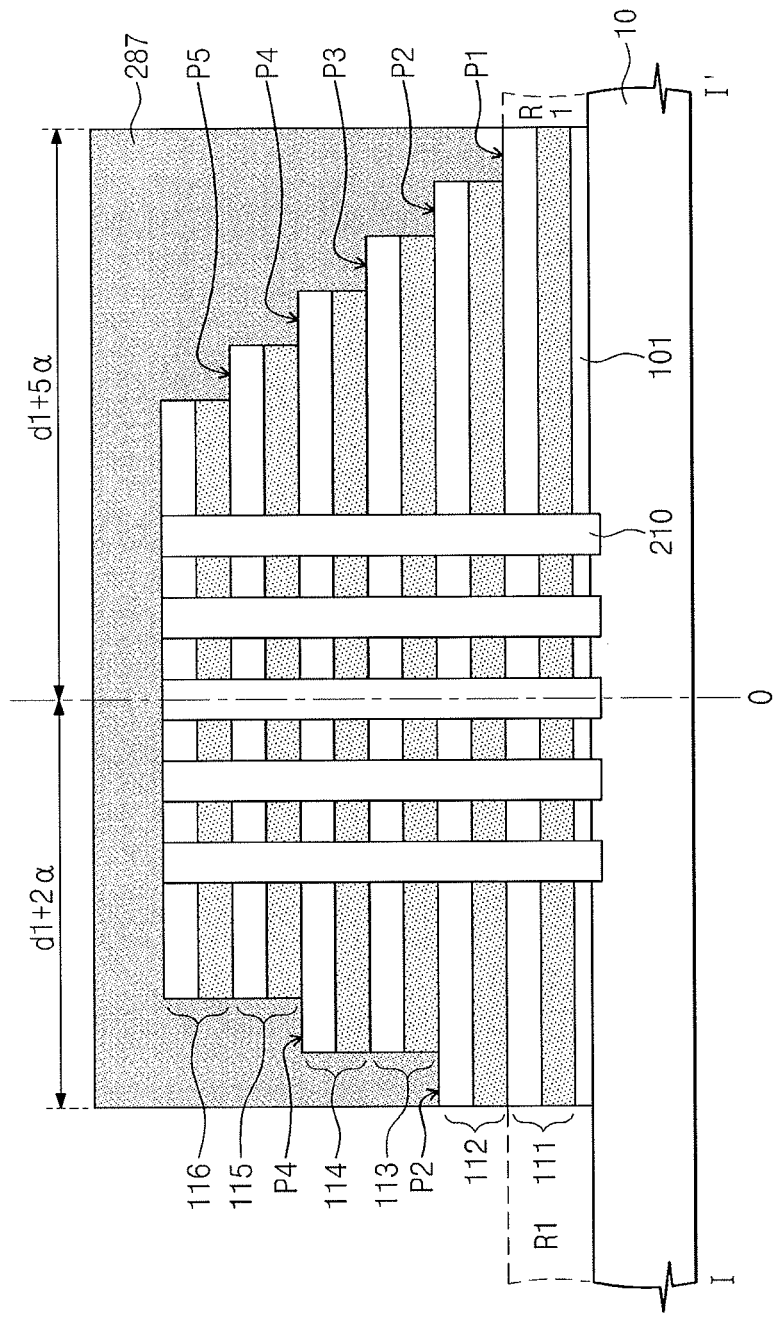

Referring to FIGS. 28 and 29, a seventh photoresist film 287 may be formed on the resultant structure including the pads P2 and P3. First and second directional distances form the origin O to edges of the seventh photoresist film 287 may be given by $d1+2\cdot\alpha$ and $d1+5\cdot\alpha$, respectively. A portion R1 of the first horizontal layer 111 may be removed using the seventh photoresist film 287 as an etchmask. As the result of the removal process, a pad P1 may be formed in the second and fourth directional adjacent regions.

Figure 30:
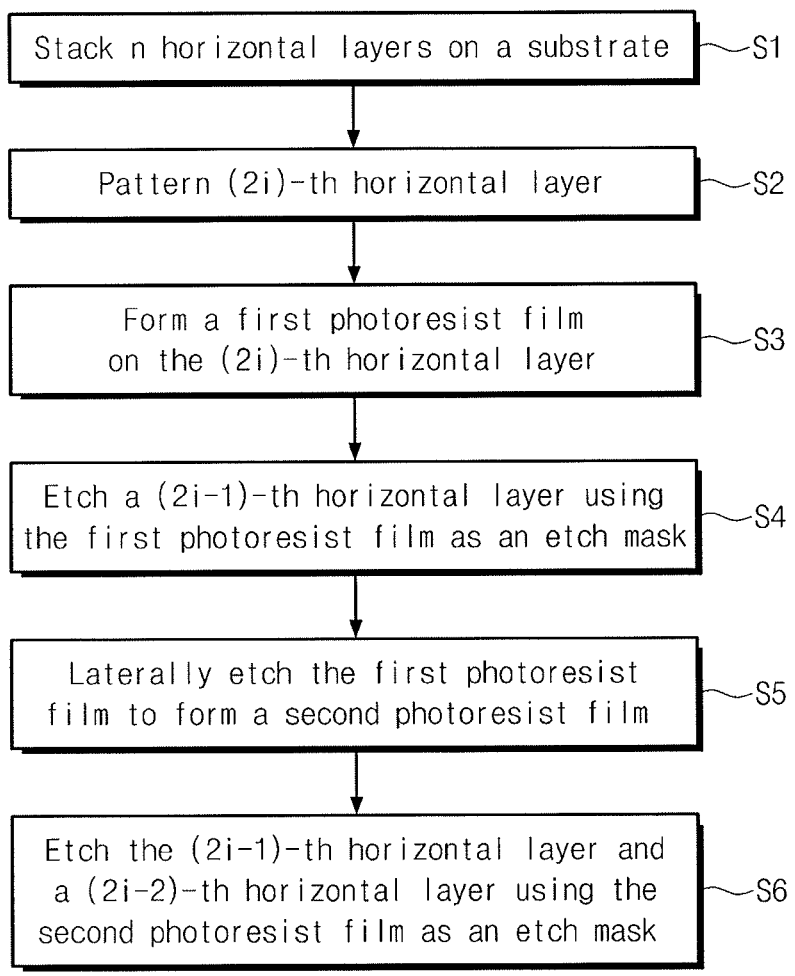
FIG. 30 illustrates a flowchart of methods of fabricating a 3D semiconductor device according to a third embodiment of the inventive concept.

According to the third embodiments of the inventive concept, a fabrication method of repeatedly using a single photoresist film during etching a plurality of horizontal layers may be used to realize a pad structure, in which pads are formed on every horizontal layer in the second and fourth directions and on every second horizontal layer in the first and third directions. For instance, the pad structure may be realized by a process illustrated by a flowchart of FIG. 30. Referring to FIG. 30, the process may include forming a stacked structure including n horizontal layers on a substrate (in S1), patterning a (2i)-th horizontal layer where i is a natural number denoting a stacking order of the horizontal layer and is $1 \leq i \leq n/2$ (in S2), forming a first photoresist film with first and second outer sidewalls on the (2i)-th horizontal layer, the first outer sidewall being spaced apart from a first directional sidewall of the (2i)-th horizontal layer by a distance a and the second outer sidewall being spaced apart from a second directional sidewall of the (2i)-th horizontal layer by a distance $2\cdot\alpha$ (in S3), etching a (2i−1)-th horizontal layer using the first photoresist film as an etch mask (in S4), laterally etching the first and second outer sidewalls to a horizontal depth of a to form a second photoresist film (in S5), and anisotropically etching the (2i−1)-th horizontal layer and a (2i−2)-th horizontal layer using the second photoresist film as an etch mask (in S6). As the result of the process, the pads may be formed on the (2i−1)-th horizontal layer in the first directional adjacent region as well as on the (2i−1)-th and (2i−2)-th horizontal layers in the second directional adjacent region.

In order to reduce complexity in the drawings and to provide better understanding of example embodiments of the inventive concept, the process, in which a single photoresist film is used to etch two horizontal layers, was explained above, but example embodiments of the inventive concept are not limited thereto. For instance, the pads may be formed on three or more horizontal layers using a single photoresist film, and a way of adjusting a width of the photoresist film may be used during this process.

Fourth Embodiment

Figure 31:
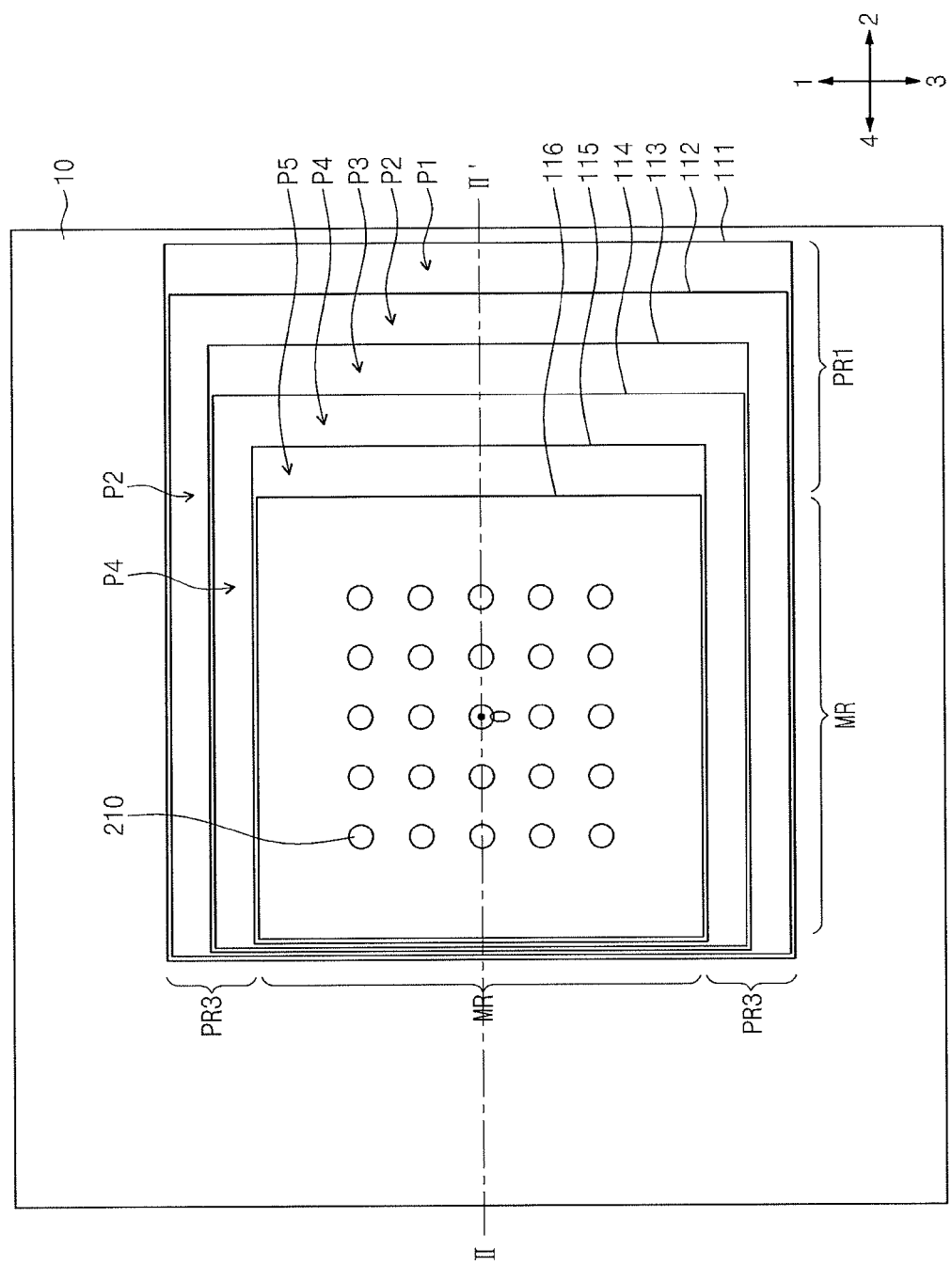
FIGS. 31 and 32 illustrate schematic planar and cross-sectional views, respectively, of a 3D semiconductor device according to a fourth embodiment of the inventive concept.
Figure 32:
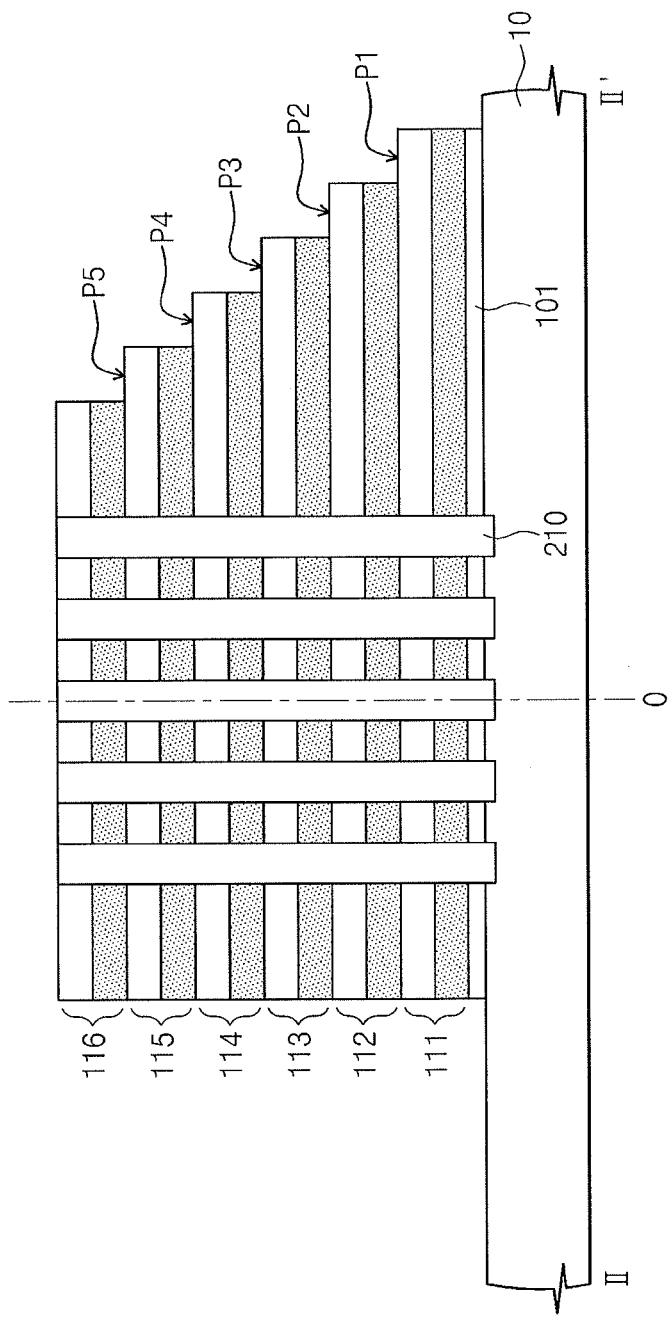

FIG. 31 is a plan view illustrating a 3D semiconductor device according to a fourth embodiment of the inventive concept, and FIG. 32 is a cross-sectional view taken along line II-II' of FIG. 31. Referring to FIGS. 31 and 32, according to the fourth embodiment of the inventive concept, a third pad region PR3 may be provided in the first and third directional adjacent regions, similar to the third embodiment. The first pad region PR1 may be partially provided in the second directional adjacent region but not in the fourth directional adjacent region, unlike the third embodiments described with reference to FIGS. 18 and 19. That is, the fourth directional sidewalls of the horizontal layers 111 to 116 may be aligned and coplanar with each other. Accordingly, a 3D semiconductor device can be fabricated to have a reduced chip size.

FIGS. 33, 35, 37, 39, and 41 are plan views illustrating methods of fabricating a 3D semiconductor device according to a fourth embodiment of the inventive concept, and FIGS. 34, 36, 38, 40, and 42 are cross-sectional views taken along lines II-II' of FIGS. 33, 35, 37, 39 and 41, respectively. The first and third directional adjacent regions of the stacked structure shown in FIGS. 33 through 42 may be formed by the substantially same methods as the third embodiments described with reference to FIGS. 20 through 29. Therefore, description of first and third directional features may be omitted hereinafter.

Figure 33:
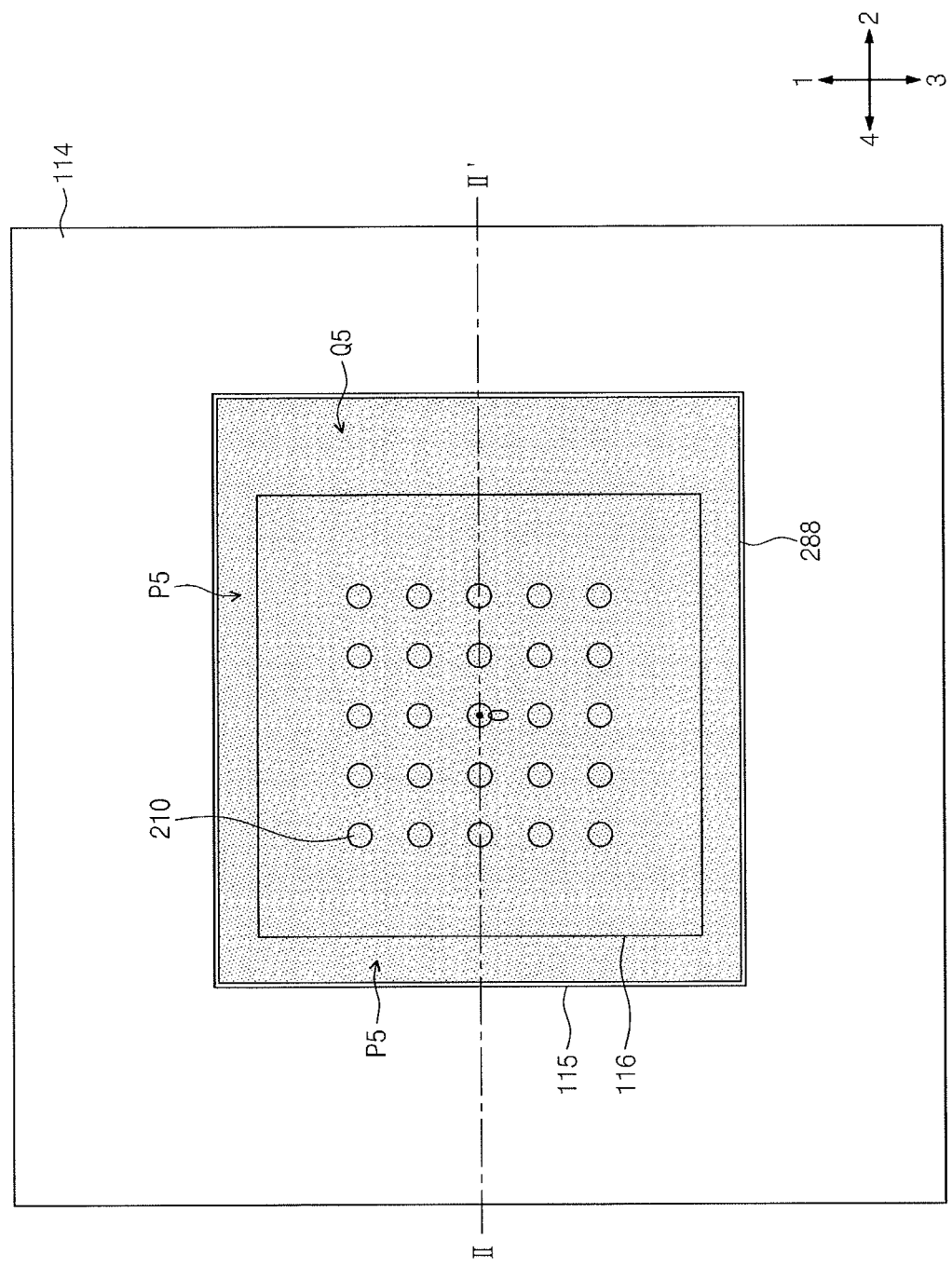
FIGS. 33 through 42 illustrate methods of fabricating a 3D semiconductor device according to a fourth embodiment of the inventive concept.
Figure 34:
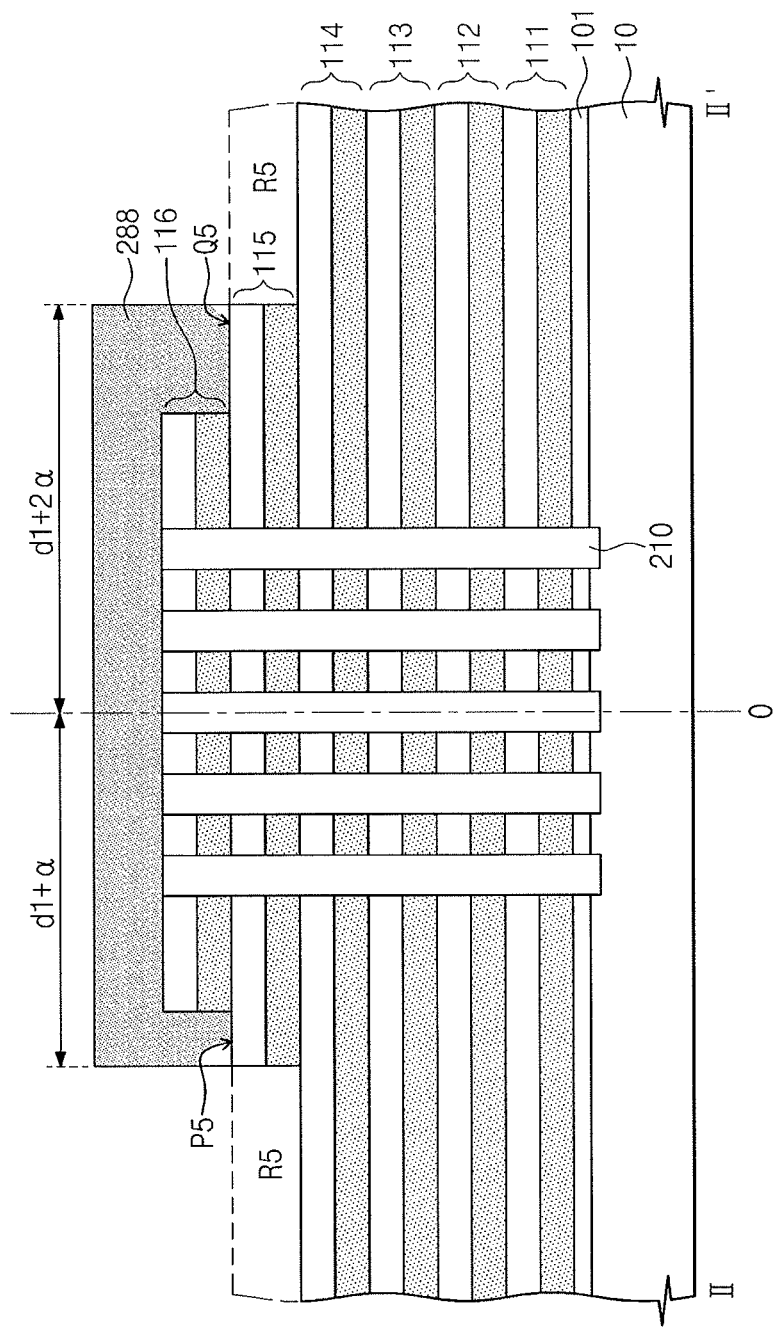

Referring to FIGS. 33 and 34, an eighth photoresist film 288 may be formed on the resultant structure described with reference to FIGS. 6 and 7. Second and fourth directional distances from the origin O to edges of the eighth photoresist film 288 may be given by d1+2·α and d1+α, respectively. The fifth horizontal layer 115 may be patterned using the eighth photoresist film 288 as an etch mask. A portion R5 of the fifth horizontal layer 115 may be removed by the patterning process. Further, as the result of the patterning process, a pad Q5 may be formed in the second directional adjacent region and a pad P5 may be formed in the fourth directional adjacent regions. A width of the pad Q5 may be greater than that of the pad P5. For instance, the width of the pad Q5 may be twice as large as the width of the pad P5.

Figure 35:
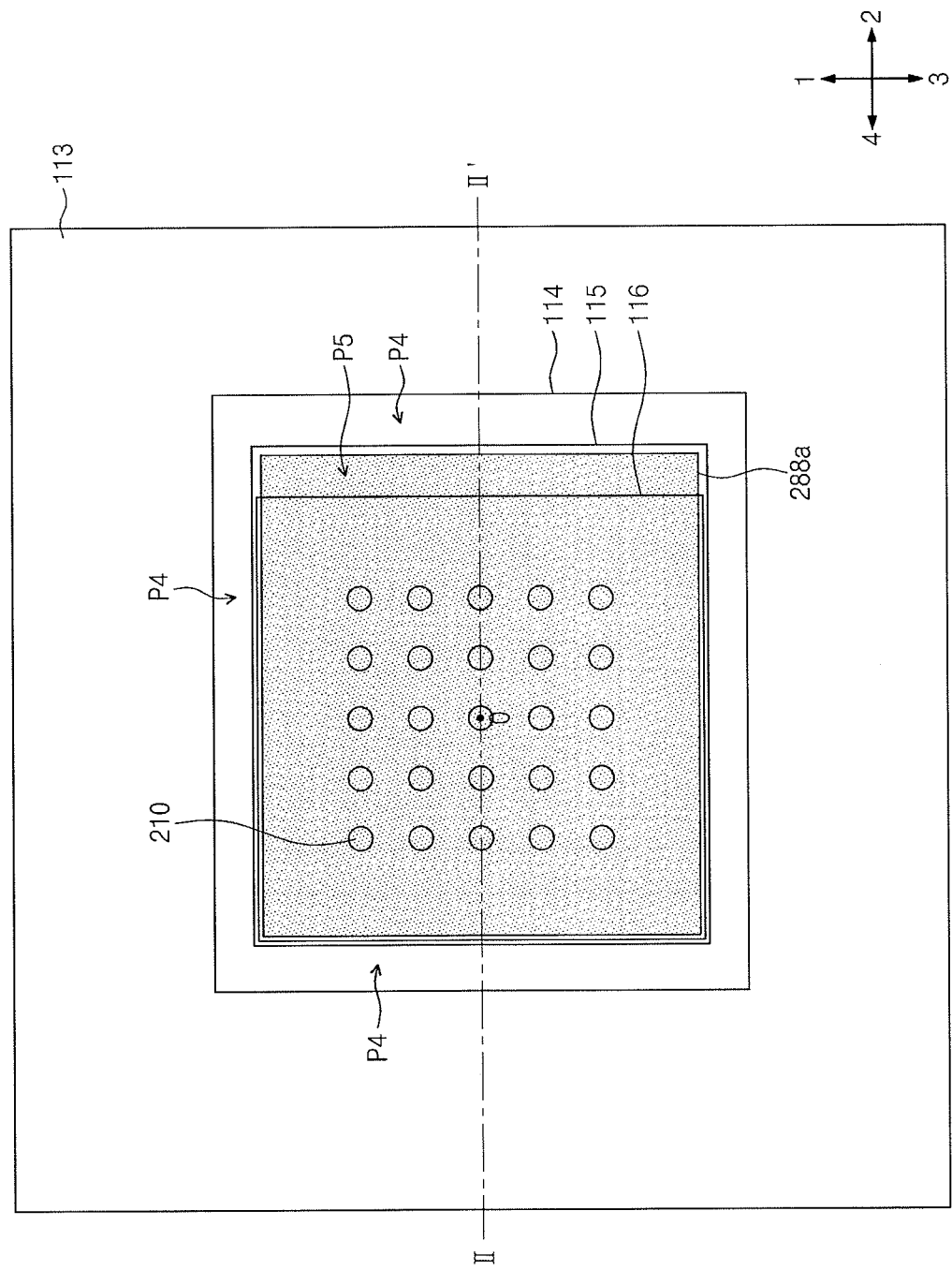
Figure 36:
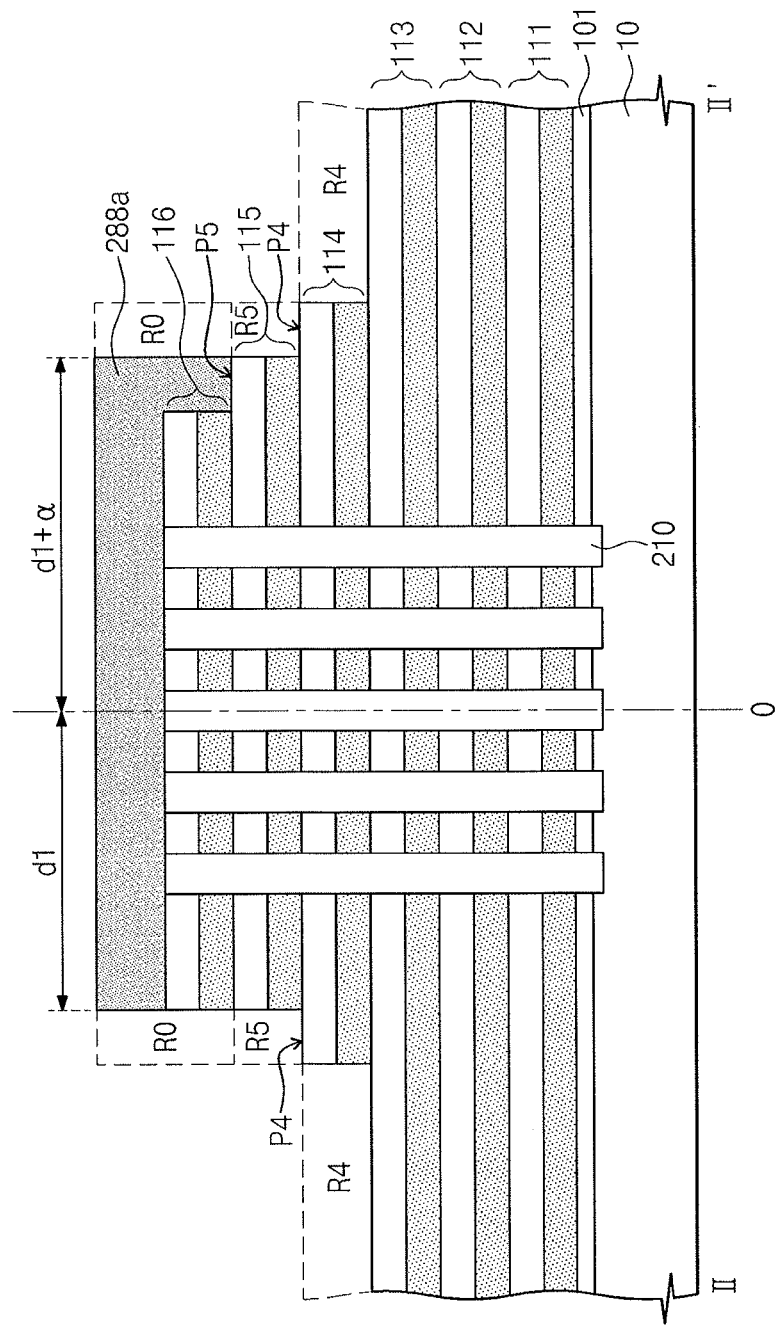

Referring to FIGS. 35 and 36, an eighth photoresist pattern 288a may be formed by removing a portion R0 of the eighth photoresist film 288. Sidewalls of the eighth photoresist film 288 may be laterally recessed by a width a. That is, second and fourth directional distances from the origin O to edges of the eighth photoresist pattern 288a may be given by d1+α and d1, respectively. The portion R5 of the fifth horizontal layer and the portion R4 of the fourth horizontal layer may be etched using the eighth photoresist pattern 288a as an etch mask. As the result of the etching of the fourth and fifth horizontal layers 114 and 115, pads P5 and P4 may be formed in the second directional adjacent region, and a pad P4 may be formed in the fourth directional adjacent region.

Figure 37:
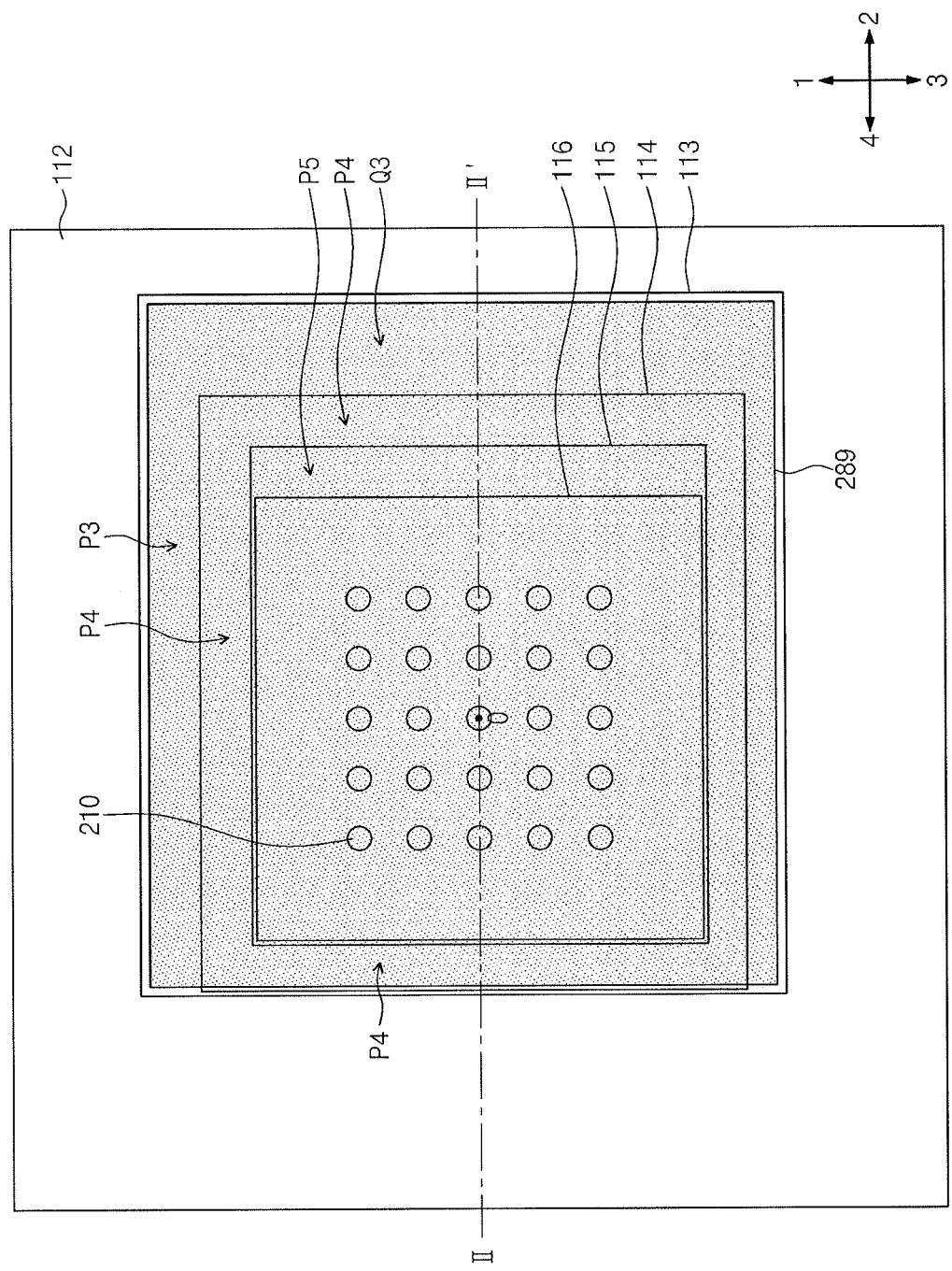
Figure 38:
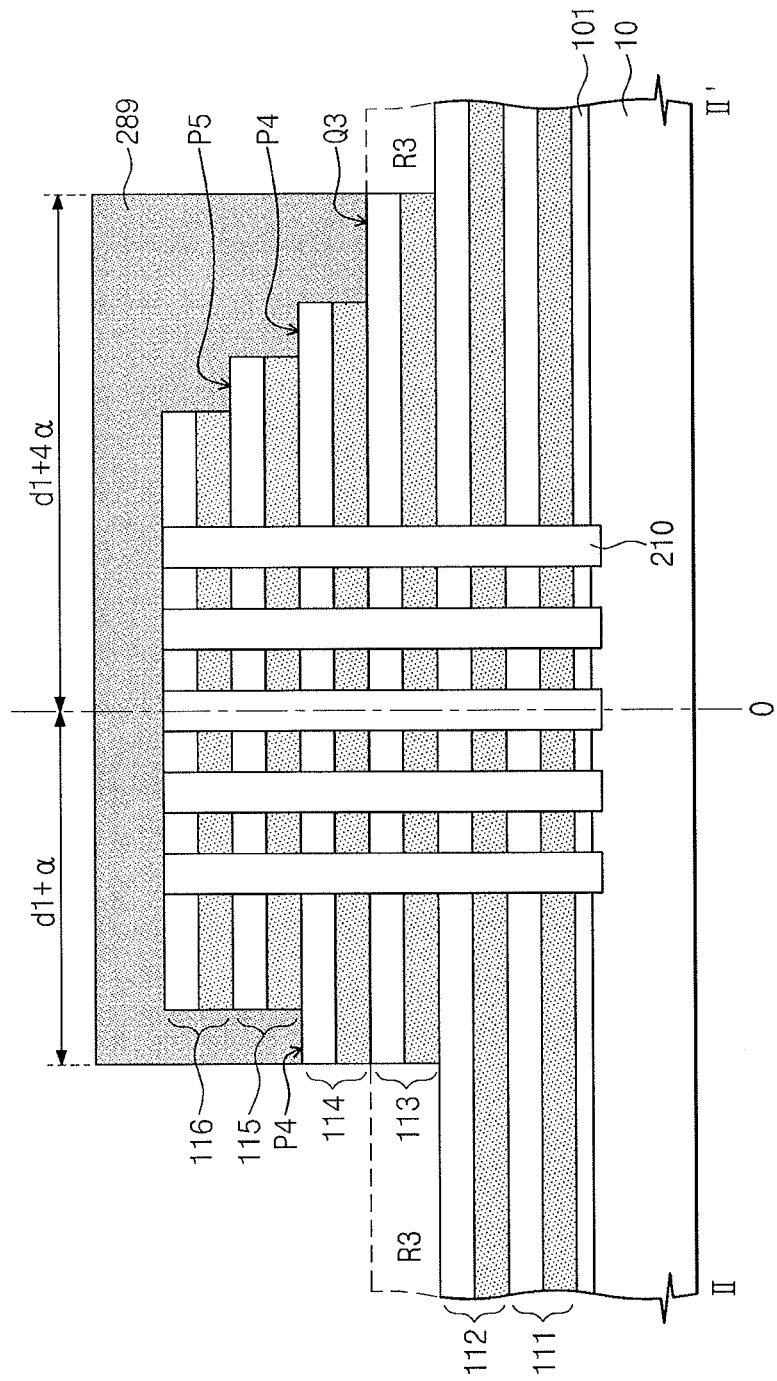

Referring to FIGS. 37 and 38, a ninth photoresist film 289 may be formed on the resultant structure including the pads P5 and P4. Second and fourth directional distances form the origin O to edges of the ninth photoresist film 289 may be given by d1+4·α and d1+α, respectively. The third horizontal layer 113 may be patterned using the ninth photoresist film 289 as an etch mask to remove a portion R3 of the third horizontal layer 113. As the result of the patterning process, a pad Q3 may be formed in the second directional adjacent region. A width of the pad Q3 may be twice (i.e., 2·α) as large as the width of the pad P4.

Figure 39:
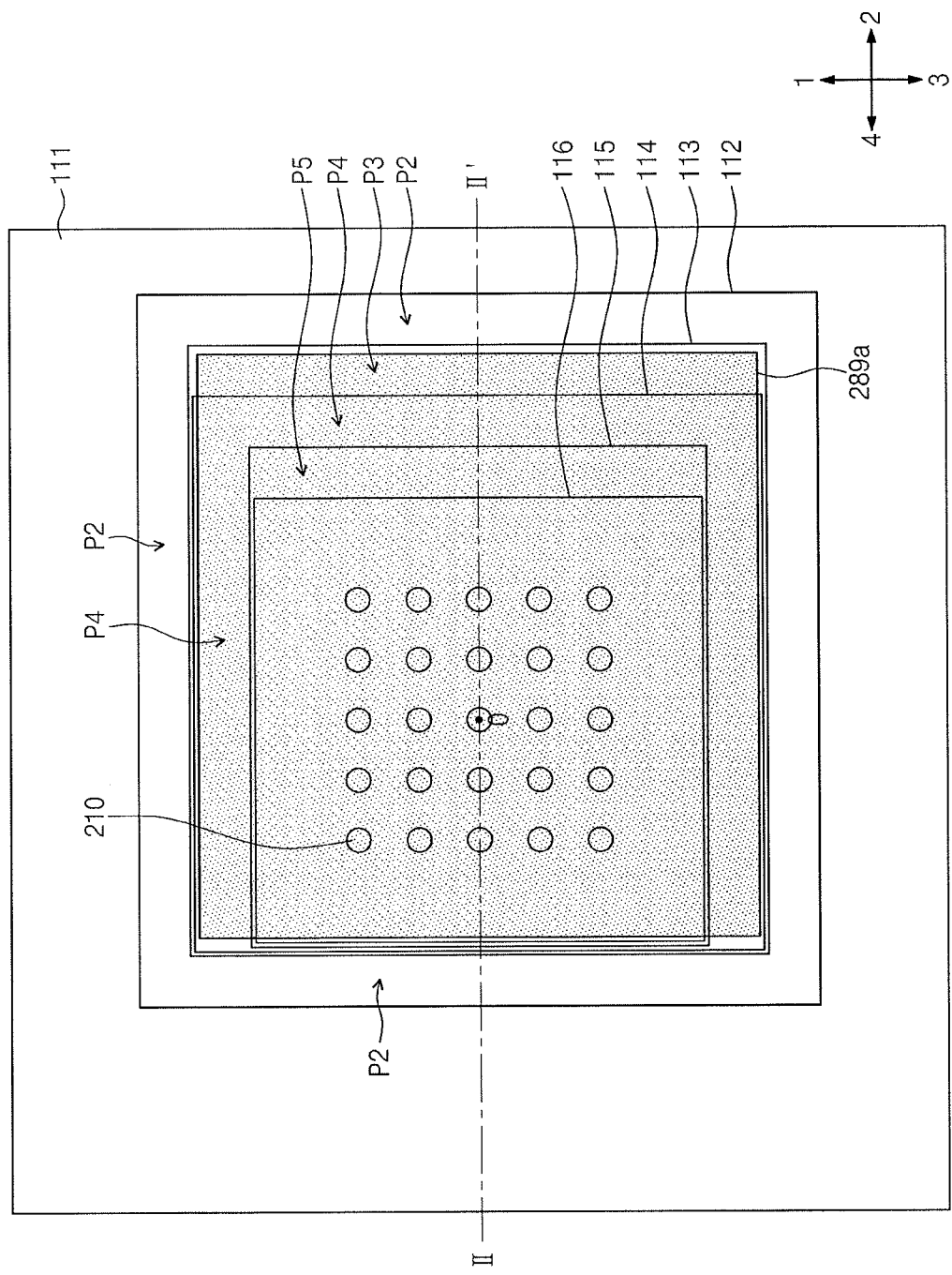
Figure 40:
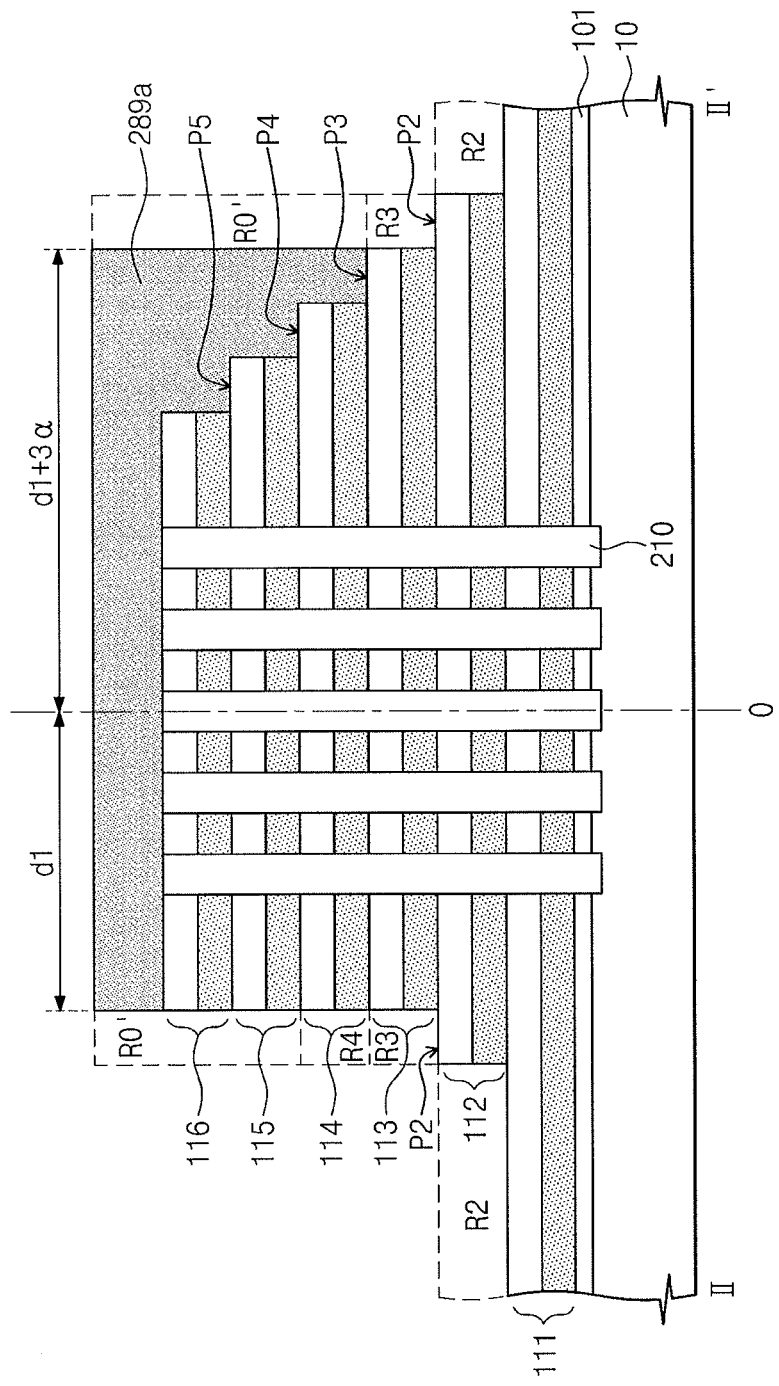

Referring to FIGS. 39 and 40, a ninth photoresist pattern 289a may be formed by removing a portion R0' of the ninth photoresist film 289. Sidewalls of the ninth photoresist film 289 may be laterally recessed by a width a. That is, second and fourth directional distances from the origin O to edges of the ninth photoresist pattern 289a may be given by d1+3·α and d1, respectively. Portions R2, R3, and R4 of the second to fourth horizontal layers 112, 113, and 114 may be removed using the ninth photoresist pattern 289a as an etch mask. As the result of the etching of the second to fourth horizontal layers 112, 113, and 114, pads P3, and P2 may be formed in the second directional adjacent region, and a pad P2 may be formed in the fourth directional adjacent region.

Figure 41:
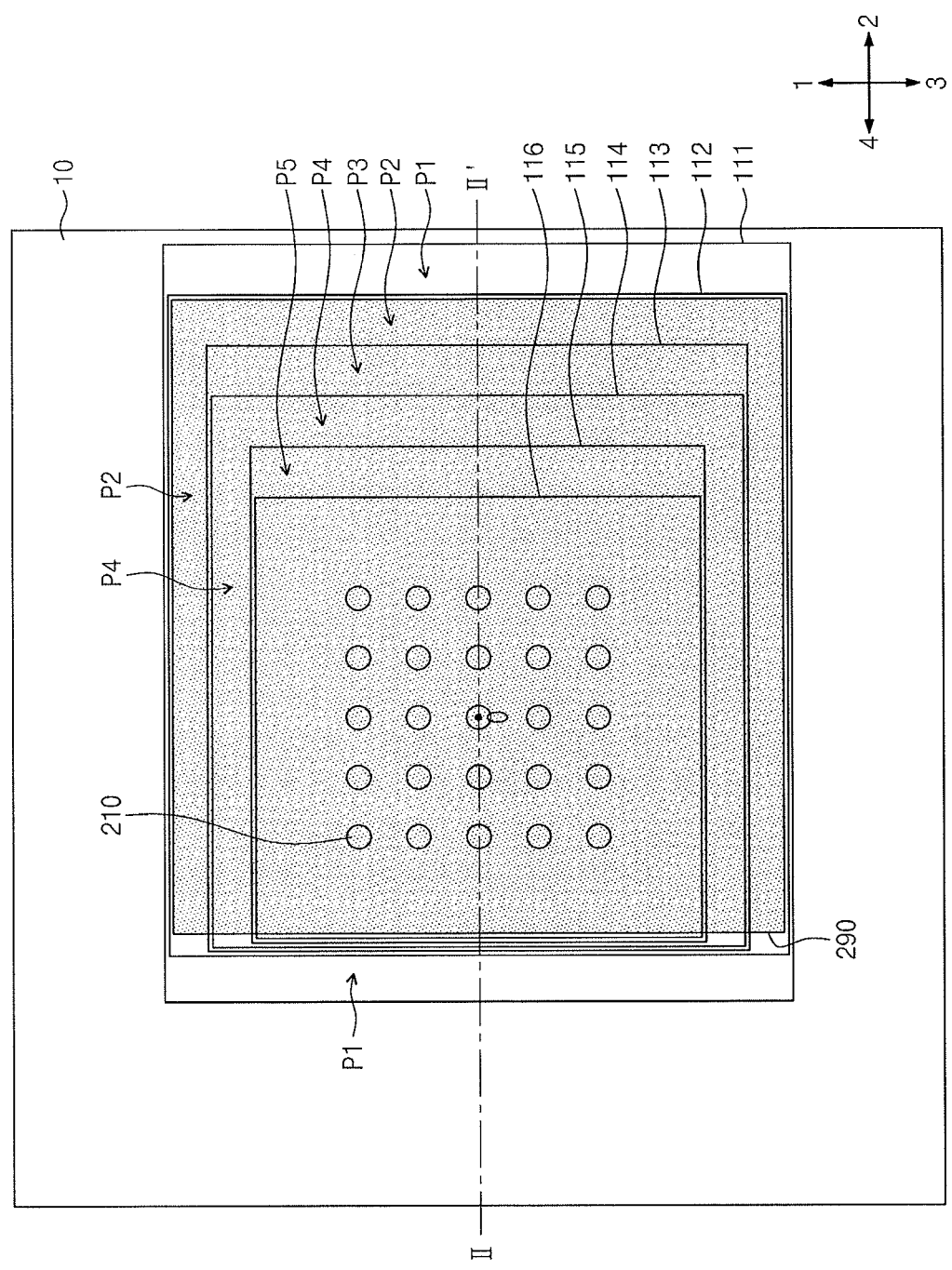
Figure 42:
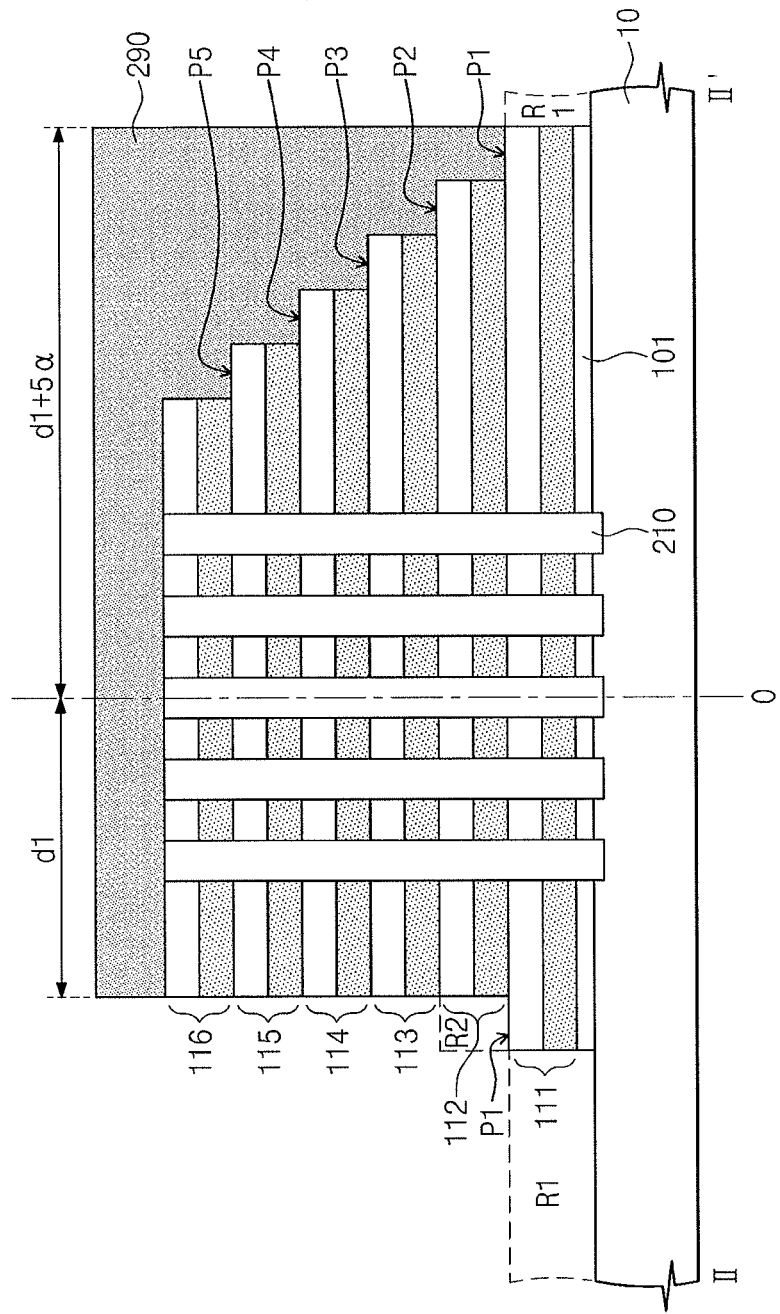

Referring to FIGS. 41 and 42, a tenth photoresist film 290 may be formed on the resultant structure including the pads P2 and P3. Second and fourth directional distances from the origin O to edges of the tenth photoresist film 290 may be given by d+5·α and d1, respectively. A portion R1 of the first horizontal layer 111 may be removed using the tenth photoresist film 290 as an etch mask. As the result of the removal process, a pad P1 may be formed in the second and fourth directional adjacent. The pad P1 in the fourth directional adjacent region may be removed by a patterning process using an additional mask.

According to the fourth embodiment of the inventive concept, a fabrication method of repeatedly using a single photoresist film during etching a plurality of horizontal layers may be used to realize a pad structure, in which pads are formed on every horizontal layer in the second directional adjacent region and on every second horizontal layer in the first directional adjacent region. Here, there may be no pad in the fourth directional adjacent region. Distances from the origin O to fourth directional edges of the photoresist films may be successively changed into d1+α, d1, d1+α and d1 during forming the pad structure. That is, the formation of the pad structure may include repeating a series of processes forming a photoresist film whose a fourth directional distance from the origin O to an edge thereof is d1+α and then laterally etching sidewalls of the photoresist film by a width of α. Due to repeating the series of processes, the first pad region PR1 may be formed in the second directional adjacent region, while the pads may not be formed in the fourth directional adjacent region.

Fifth Embodiment 3D semiconductor devices according to a fifth embodiment of the inventive concept will be described with reference to FIGS. 43 through 48. The 3D semiconductor device according to the fifth embodiment may include a plurality of stacked structures, each of which may be fabricated by one of the methods described as the first to fourth embodiments of the inventive concept. In the following description, overlapping description of the respective stacked structures may be omitted for concise description.

Figure 43:
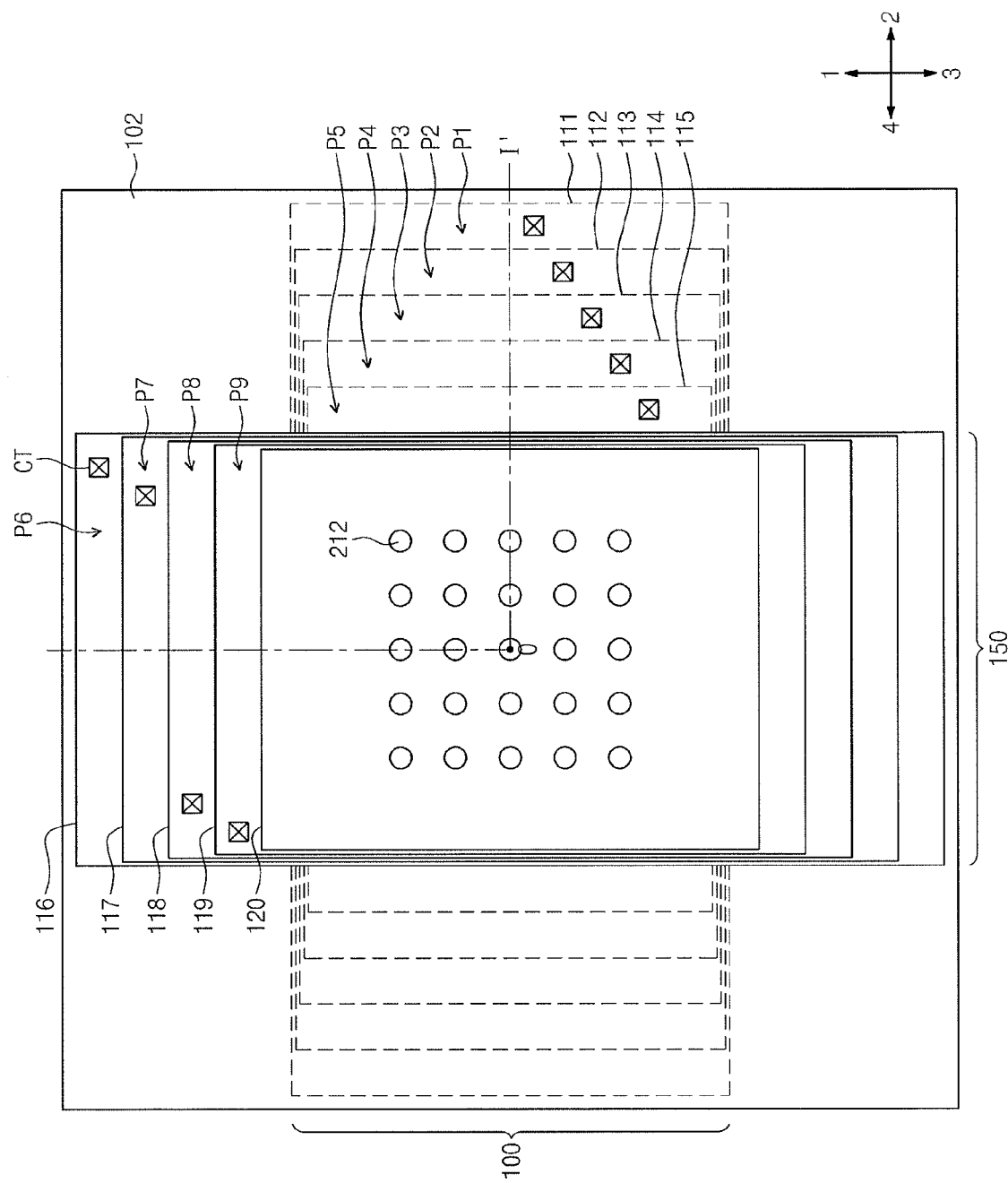
FIGS. 43 through 45 illustrate a 3D semiconductor device and methods of fabricating according to a fifth embodiment of the inventive concept.
Figure 44:
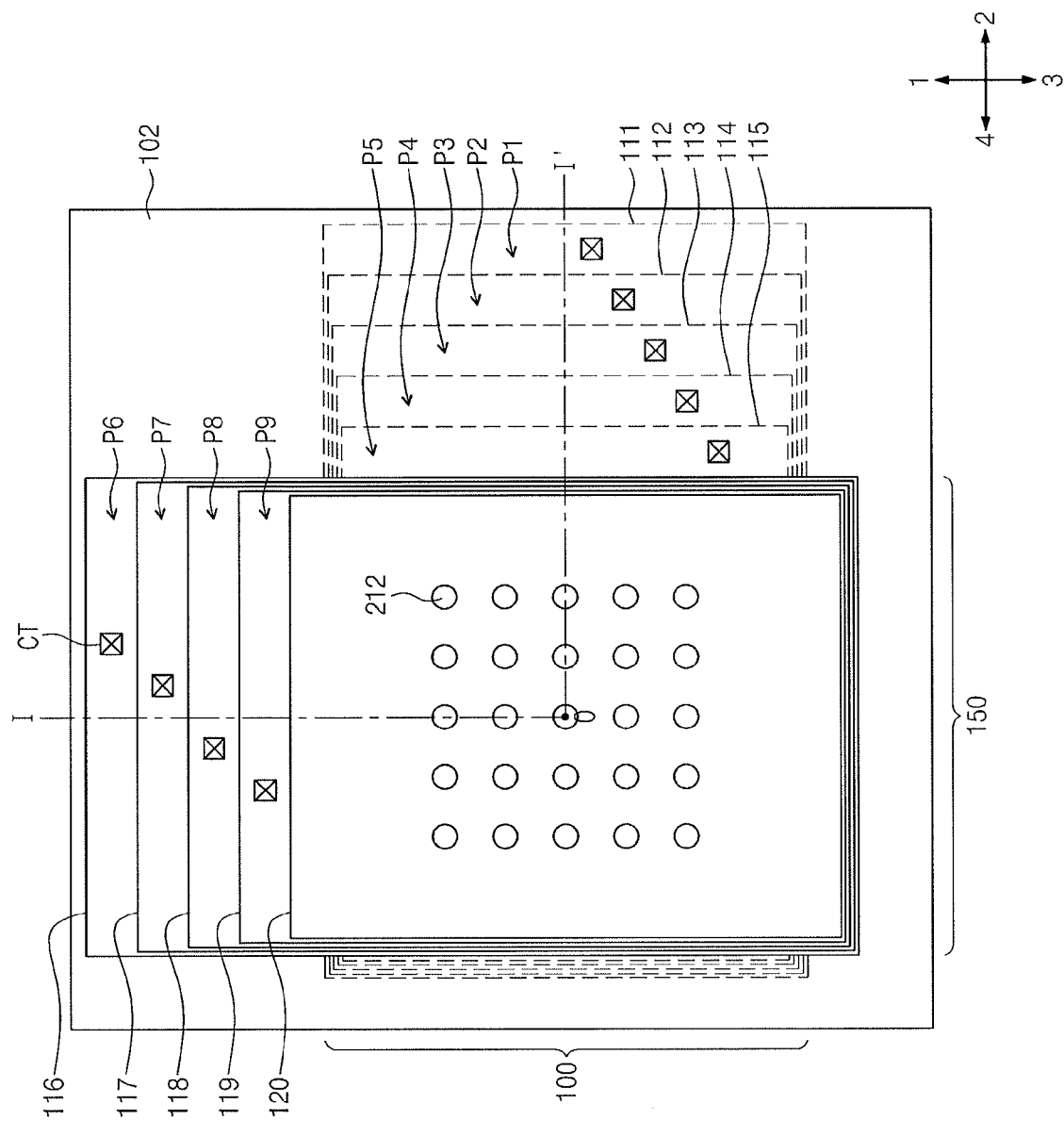
Figure 45:
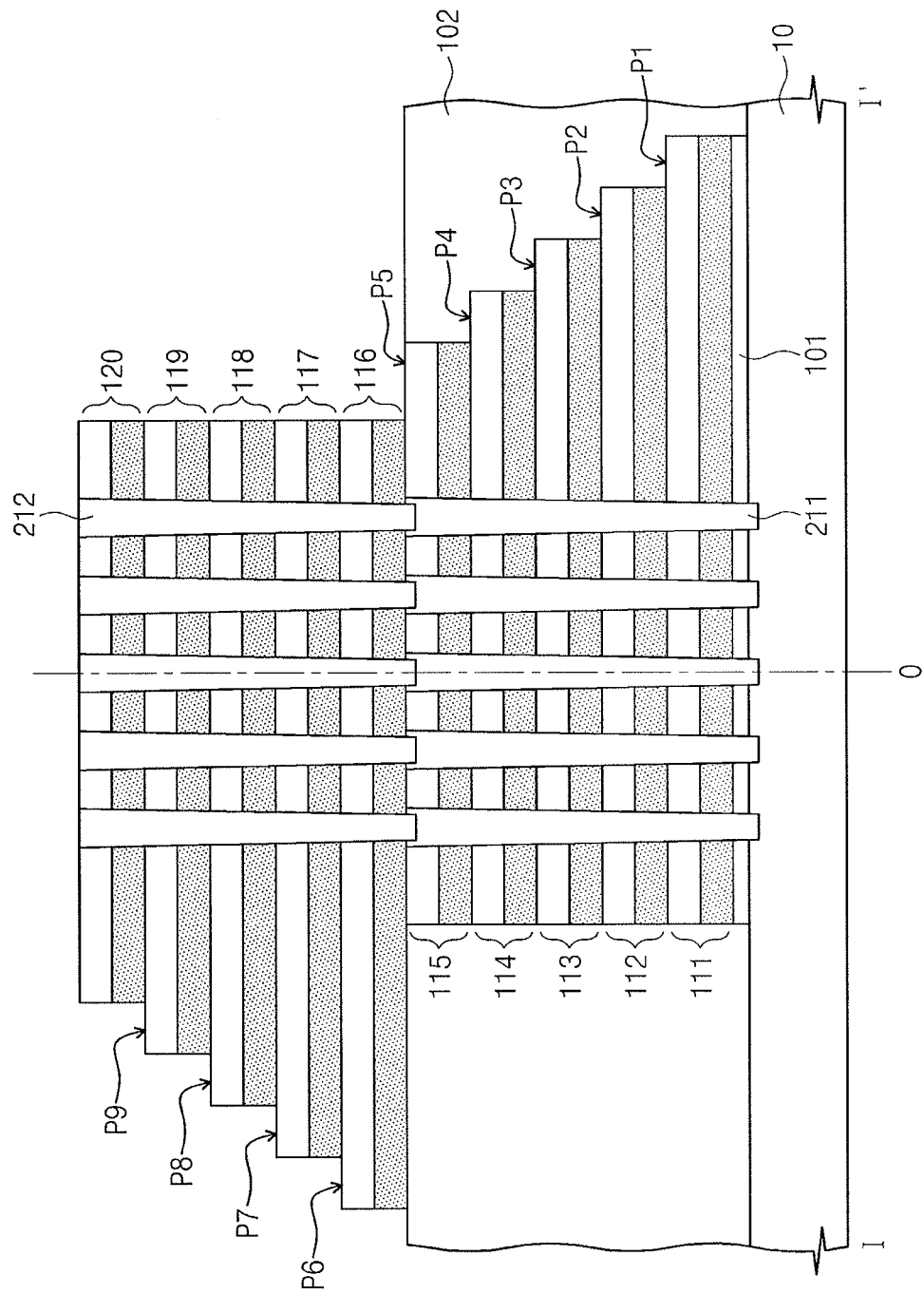

FIGS. 43 and 44 are plan views illustrating the 3D semiconductor device according to the fifth embodiment of the inventive concept, and FIG. 45 is a cross-sectional view taken along line I-O-I' of FIG. 43 or 44. Referring to FIGS. 43 and 44, the 3D semiconductor device may include the first stacked structure 100 and a second stacked structure 150 disposed on the first stacked structure 100. The second stacked structure 150 may be formed to cross the first stacked structure 100. That is, in a plan view, a major axis of the second stacked structure 150 may cross a major axis of the first stacked structure 100. In some embodiments, the second stacked structure 150 may be formed to expose pads of the first stacked structure 100. Further, a first directional width of the first stacked structure 100 may be smaller than that of the second stacked structure 150, and a second directional width of the first stacked structure 100 may be greater than that of the second stacked structure 150.

For example, as shown in FIG. 43, each of the first and second stacked structures 100 and 150 may have a substantially same structure as the stacked structure described with reference to FIGS. 2 and 3. In another example, as shown in FIG. 44, each of the first and second stacked structures 100 and 150 may have a substantially same structure as the stacked structure described with reference to FIGS. 12 and 13. With regard to the fabrication thereof, an interlayer insulating layer 102 may be formed on the first stacked structure 100 before formation the second stacked structure 150, i.e., between the first and second stacked structures 100 and 150. The interlayer insulating layer 102 may be formed to cover pads of the first stacked structure 100. Thereafter, a planarization process may be performed on the interlayer insulating layer 102, thereby exposing a top surface of the first stacked structure 100. In addition, first vertical channel structures 211 may be provided to penetrate the first stacked structure 100, and second vertical channel structures 212 may be provided to penetrate the second stacked structure 150. Each of the second vertical channel structures 212 may be connected to the corresponding one of the first vertical channel structures 211. For instance, a lower portion of the second vertical channel structures 212 may be inserted into an upper portion of the first vertical channel structures 211. A configuration or arrangement of the contact plugs CT may be modified from the depicted by FIG. 44 by those skilled in the art.

Figure 46:
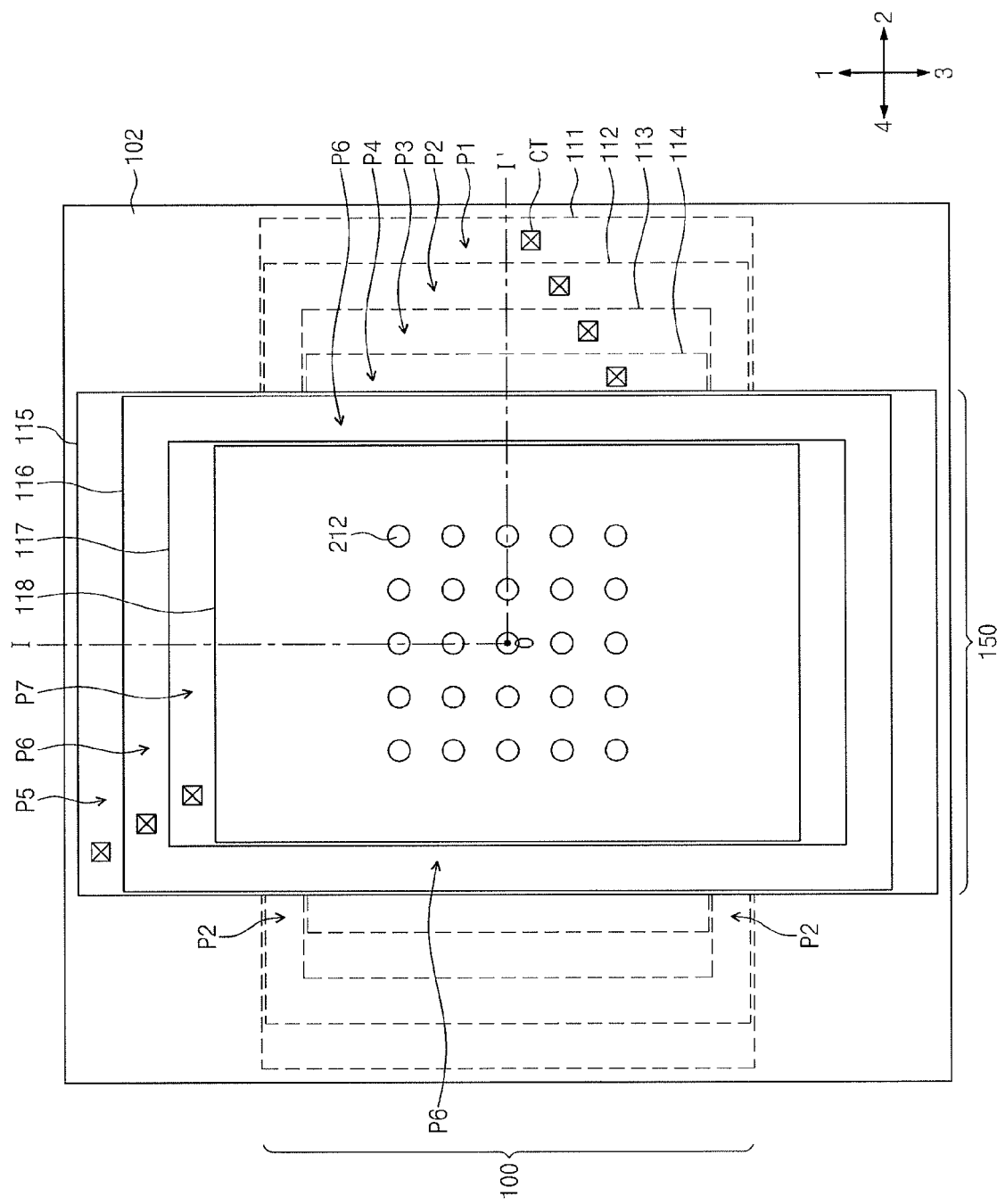
FIGS. 46 through 48 illustrate a 3D semiconductor device and methods of fabricating the same according to modifications of the fifth embodiment of the inventive concept.
Figure 47:
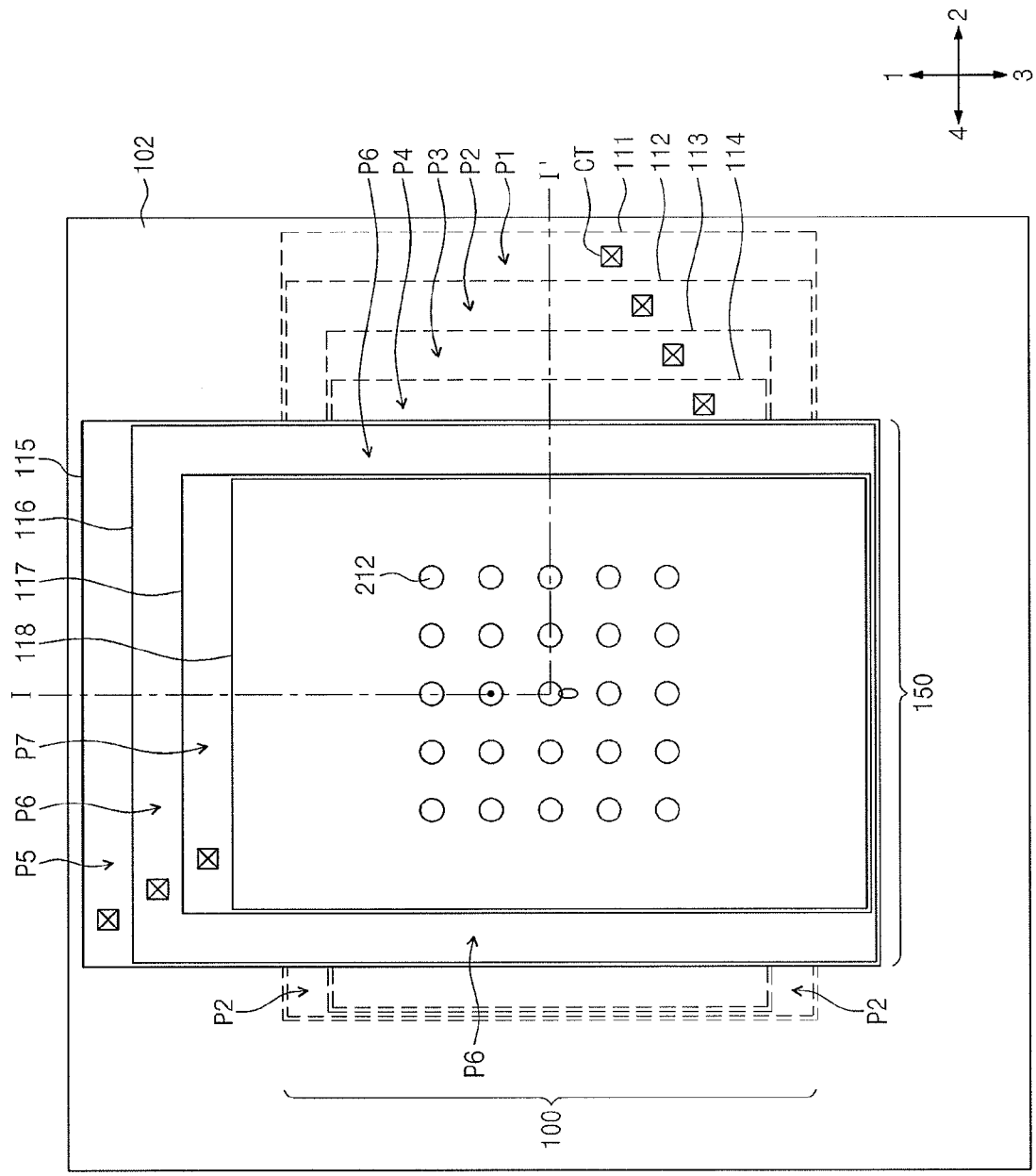
Figure 48:
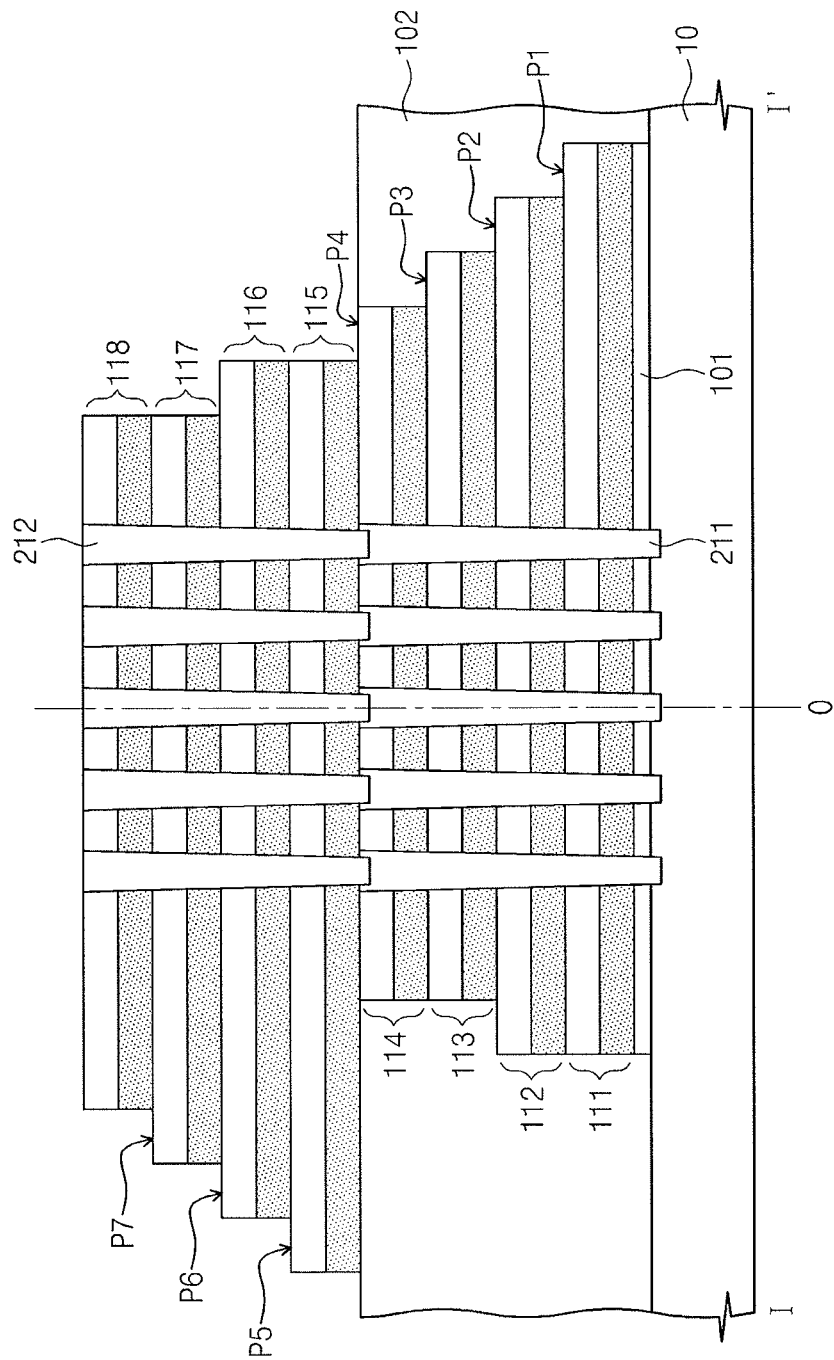

FIGS. 46 and 47 are plan views illustrating a 3D semiconductor device according to modifications of the fifth embodiment of the inventive concept, and FIG. 48 is a cross-sectional view taken along line I-O-I' of FIG. 46 or 47. For example, as shown in FIG. 46, each of the first and second stacked structures 100 and 150 may have a substantially same structure as the stacked structure described with reference to FIGS. 18 and 19. In another example, as shown in FIG. 47, each of the first and second stacked structures 100 and 150 may have a substantially same structure as the stacked structure described with reference to FIGS. 31 and 32.

According to the fifth embodiment of the inventive concept, in a plan view, the stacked structures may be stacked such that their major axes cross each other. In the meantime, not as shown in FIGS. 43 through 48, the 3D semiconductor device may include three or more stacked structures. Typically, an occupying area of a pad region provided to an electric connection may increase as a number of layers stacked in a 3D semiconductor device increases. For instance, in the case that a conventional 3D semiconductor device includes at least two stacked structures and the pad region is formed along all edges of the respective stacked structures, an occupying area of the pad region may increase excessively. In other words, when a conventional 3D semiconductor device includes two stacked structures having the same height, a total width of the pad region measured along a specific direction may be twice as large as the case of a single stacked structure, i.e., in order to expose twice as many pads. In contrast, according to the fifth embodiment of the inventive concept, a 3D semiconductor device including two stacked structures may be fabricated to have the stacked structures at different orientations, e.g., crossing each other, with pad regions limited to specifics direction, e.g., at one side of each of the stacked structures, so a resultant occupying area of a pad region may be substantially equal to or less than that of the case of a single stacked structure.

[Vertical Channel Structure and Horizontal Pattern]

Figure 49:
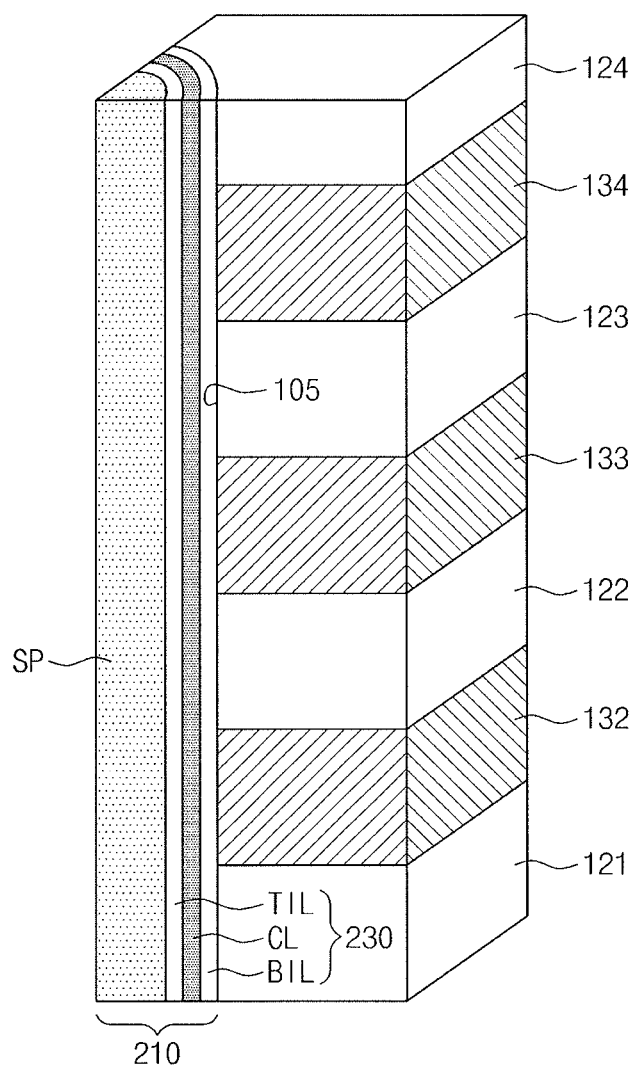
FIG. 49 illustrates methods of fabricating conductive layers according to example embodiments of the inventive concept.

A structure of the vertical channel structure will be described in further detail with reference to FIG. 49. Referring to FIG. 49, the vertical channel structure 210 may include a memory layer 230 formed on a sidewall of a channel hole 105. The memory layer 230 may include a blocking insulating layer BIL, a charge storing layer CL, and a tunnel insulating layer TIL sequentially stacked on the sidewall of the channel hole 105. The charge storing layer CL may include a layer with charge trap sites capable of storing electric charges. For instance, the charge storing layer CL may include at least one of a silicon nitride layer, a metal nitride layer, a metal oxynitride layer, a metal silicon oxide layer, a metal silicon oxynitride layer, or an insulating layer including nano dots. The vertical channel structure 210 may include a semiconductor pattern SP, which is formed in the channel hole 105 to cover an inner wall of the tunnel insulating layer TIL.

Figure 50:
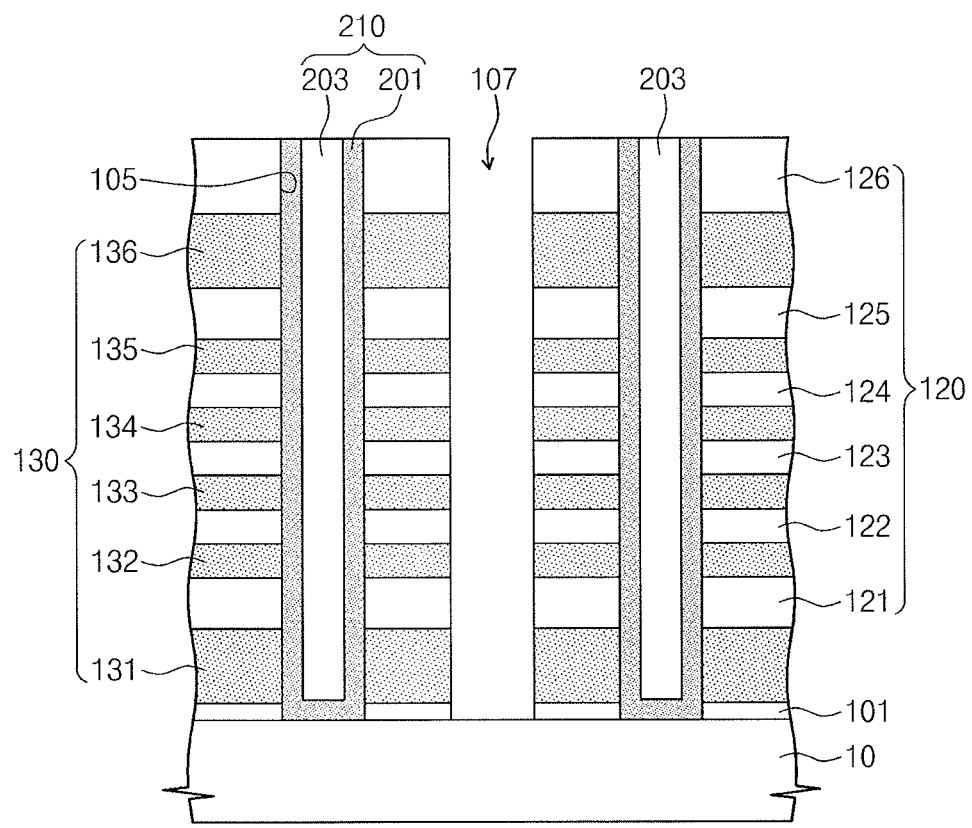
FIGS. 50 through 52 illustrate methods of fabricating the stacked structures.
Figure 51:
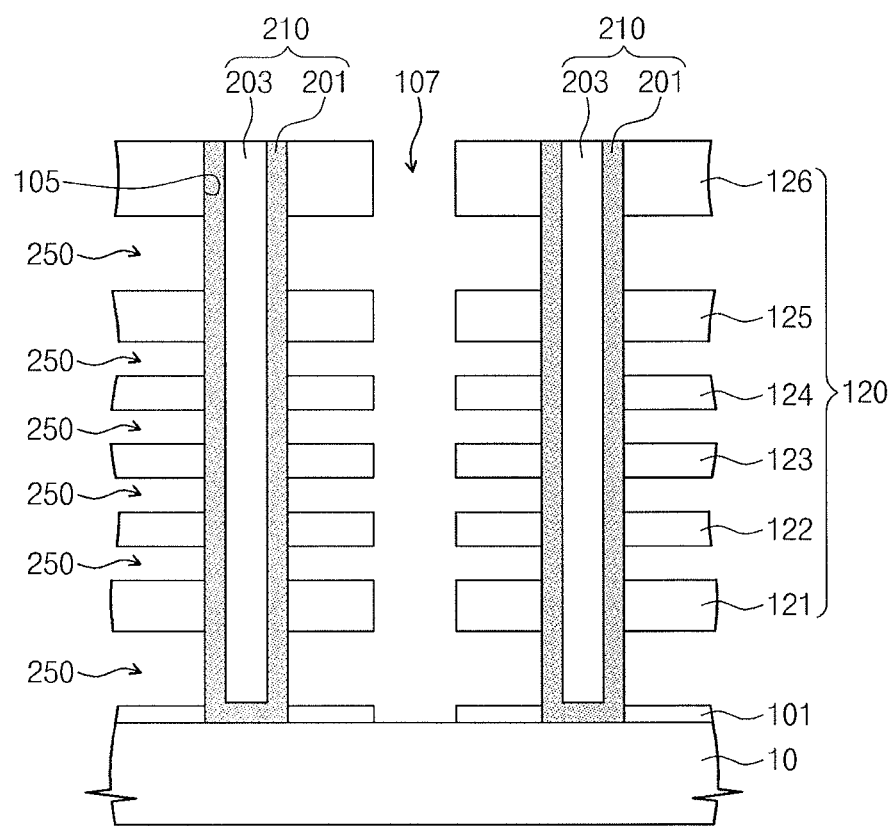
Figure 52:
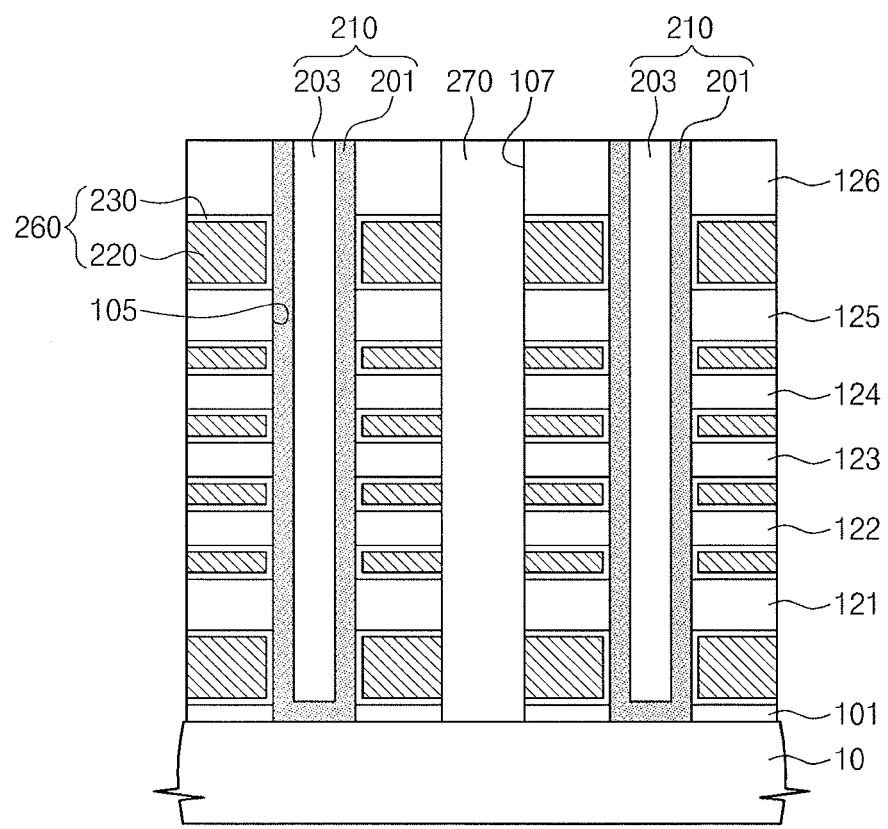

FIGS. 50 through 52 are cross-sectional views illustrating a portion of the memory region MR of the stacked structures. In the case that the first material layers 131 to 136 are formed of the sacrificial layers as described above, the sacrificial layers may be replaced by conductive layers and this replacement may be performed by, for instance, processes which will be described with reference to FIGS. 50 through 52.

Referring to FIG. 50, the first material layers 131 to 136 or 130 and the second material layers 121 to 126 or 120 may be patterned to form a trench 107 exposing sidewalls of the first and second material groups 120 and 130. The first material layers 130 may be formed of a material having an etch selectivity to the second material layers 120. For instance, the first material layers 130 may be formed of silicon nitride, and the second material layers 120 may be formed of silicon oxide. The trench 107 may be formed between the vertical channel structures 210. Each of the vertical channel structures 210 may include a semiconductor pattern 201 and a gap-fill pattern 203, where the semiconductor pattern 201 may be formed on an inner wall and a bottom surface of a channel hole 105 penetrating the first and second material layers 120 and 130, and the gap-fill pattern 203 may be formed to fill the remaining space of the channel hole 105.

Referring to FIG. 51, the first material layers 130 exposed by the trench 107 may be removed to form recess regions 250. For instance, in the case that the first material layers 130 are formed of silicon nitride, the first material layers 130 may be selectively removed using an etching solution including a phosphoric acid.

Referring to FIG. 52, a memory layer 230 may be formed to cover an inner sidewall of the recess regions 250 and then conductive layers 220 may be formed to fill the remaining regions of the recess regions 250. In some embodiments, the memory layer 230 and the conductive layer 220 may constitute a horizontal pattern 260. The memory layer 230 may include a tunnel insulating layer, a charge storing layer, and a blocking insulating layer. The conductive layer 220 may include a layer of at least one of metal, metal silicide, conductive metal nitride, or doped semiconductor.

Figure 53:
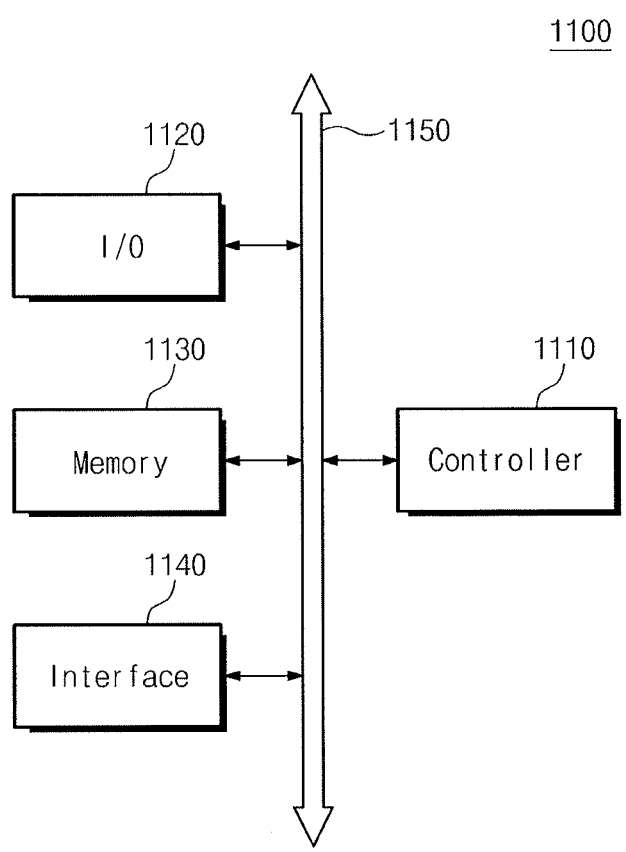
FIG. 53 illustrates a schematic block diagram of an example of a memory system including a semiconductor memory device according to some embodiments of the inventive concept.

FIG. 53 is a schematic block diagram illustrating an example of a memory system including a semiconductor memory device according to some embodiments of the inventive subject matter.

Referring to FIG. 53, a memory system 1100 can be applied to a PDA (personal digital assistant), a portable computer, a web tablet, a wireless phone, a mobile phone, a digital music player, a memory card and/or all the devices that can transmit and/or receive data in a wireless communication environment.

The memory system 1100 includes a controller 1110, an input/output device 1120 such as a key pad and a display device, a memory 1130, an interface 1140 and a bus 1150. The memory 1130 and the interface 1140 communicate with each other through the bus 1150.

The controller 1110 includes at least one microprocessor, at least one digital signal processor, at least one micro controller or other process devices similar to the microprocessor, the digital signal processor and the micro controller. The memory 1130 may be used to store an instruction executed by the controller 1110. The input/output device 1120 can receive data or a signal from the outside of the system 1100 or transmit data or a signal to the outside of the system 1100. For example, the input/output device 1120 may include a keyboard, a keypad and/or a displayer.

The memory 1130 includes the nonvolatile memory device according to embodiments of the inventive subject matter. The memory 1130 may further include a different kind of memory, a volatile memory device capable of random access and various kinds of memories.

The interface 1140 transmits data to a communication network or receives data from a communication network.

Figure 54:
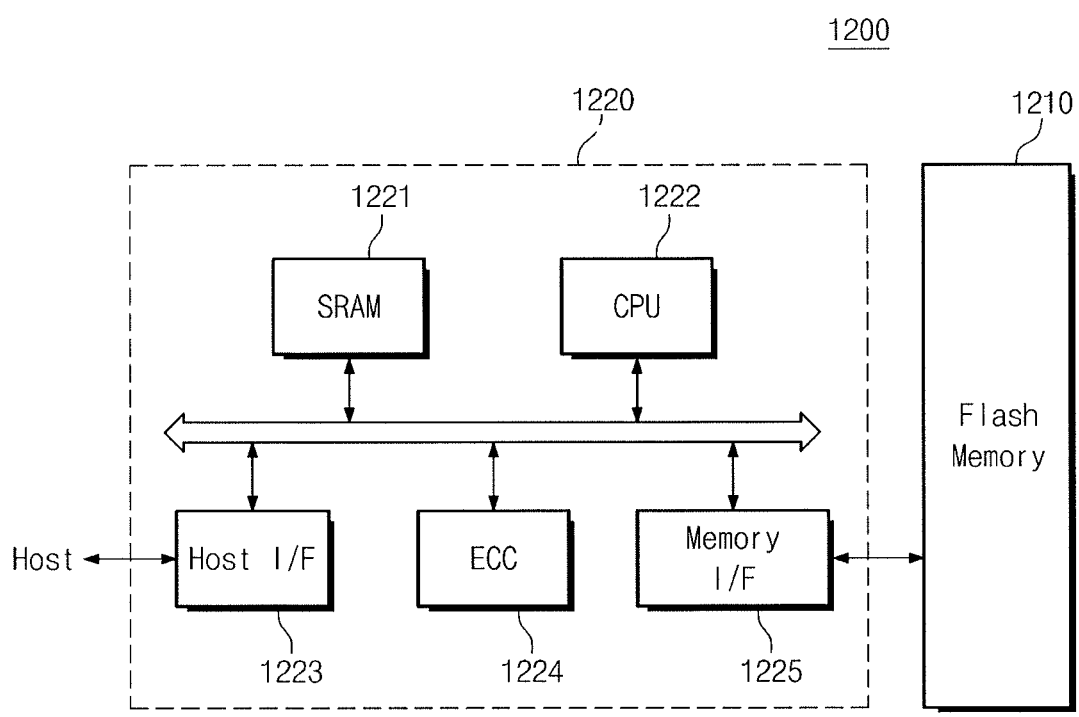
FIG. 54 illustrates a block diagram of an example of a memory card including a semiconductor memory device according to some embodiments of the inventive concept.

FIG. 54 is a block diagram illustrating an example of a memory card including a semiconductor memory device according to some embodiments of the inventive subject matter.

Referring to FIG. 54, the memory card 1200 for supporting a storage capability of a large capacity is fitted with a FLASH memory device 1210 according to some embodiments of the inventive subject matter. The memory card 1200 according to some embodiments of the inventive subject matter includes a memory controller 1220 controlling every data exchange between a host and the FLASH memory device 1210.

A static random access memory (SRAM) 1221 is used as an operation memory of a processing unit 1222. A host interface 1223 includes data exchange protocols of a host to be connected to the memory card 1200. An error correction block 1224 detects and corrects errors included in data readout from a multi bit FLASH memory device 1210. A memory interface 1225 interfaces with the FLASH memory device 1210 of some embodiments of the inventive subject matter. The processing unit 1222 performs every control operation for exchanging data of the memory controller 1220. Even though not depicted in drawings, it is apparent to one of ordinary skill in the art that the memory card 1200 according to some embodiments of the inventive subject matter can further include a ROM (not shown) storing code data for interfacing with the host.

Figure 55:
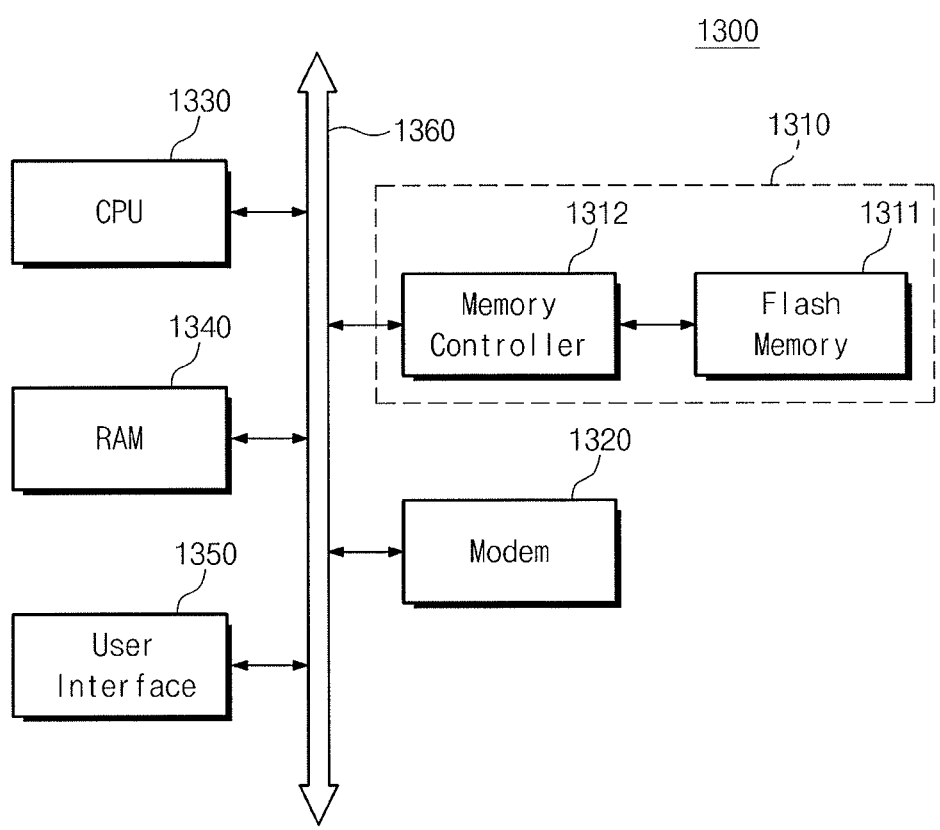
FIG. 55 illustrates a block diagram of an example of an information processing system including a semiconductor memory device according to some embodiments of the inventive concept.

FIG. 55 is a block diagram illustrating an example of an information processing system including a semiconductor memory device according to some embodiments of the inventive subject matter.

Referring to FIG. 55, a FLASH memory system 1310 of the inventive subject matter is built in a data processing system such as a mobile product or a desktop computer. The data processing system 1300 according to the inventive subject matter includes the FLASH memory system 1310 and a modem 1320, a central processing unit 1330, a RAM, a user interface 1350 that are electrically connected to a system bus 1360. The FLASH memory system 1310 may be constructed to be identical to the memory system or the FLASH memory system described above. The FLASH memory system 1310 stores data processed by the central processing unit 1330 or data inputted from an external device. The FLASH memory system 1310 may include a solid state disk (SSD) and in this case, the data processing system 1310 can stably store huge amounts of data in the FLASH memory system 1310. As reliability is improved, the FLASH memory system 1310 can reduce resources used to correct errors, thereby providing a high speed data exchange function to the data processing system 1300. Even though not depicted in the drawings, it is apparent to one of ordinary skill in the art that the data processing unit 1300 according to some embodiments of the inventive subject matter can further include an application chipset, a camera image processor (CIS) and/or an input/output device.

FLASH memory devices or memory systems according to the inventive subject matter can be mounted with various types of packages. For example, a FLASH memory device or a memory system according to the inventive subject matter can be packaged with methods such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flat pack (TQFP), system in package (SIP), multichip package (MCP), wafer-level fabricated package (WFP), wafer-level processed stack package (WSP) and mounted.

According to example embodiments of the inventive concept, the stacked structure may be formed to include a pad region with a reduced occupying area. Consequently, it may be possible to increase an integration density of a 3D semiconductor device. Additionally, in some embodiments, pads may be formed by patterning a plurality of horizontal layers using a single photoresist film.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional semiconductor device, comprising:
a stacked structure including first and second conductive layers sequentially stacked on a substrate; and
a vertical channel structure including a memory layer and a semiconductor pattern and penetrating the first and second conductive layers in the stacked structure, wherein each of the first and second conductive layers includes:
  a first sidewall extending along a first direction, and
  a second sidewall extending along a second direction crossing the first direction,
wherein the first conductive layer includes:
  a first pad being exposed by the second conductive layer and being spaced apart from the vertical channel structure along the second direction, and
  a second pad being exposed by the second conductive layer and being spaced apart from the vertical channel structure along the first direction,
wherein the first pad has a first width as a distance along the second direction between the first sidewalls of the first and second conductive layers, and the second pad has a second width as a distance along the first direction between the second sidewalls of the first and second conductive layers, and
wherein the first width and the second width are different from each other.

2. The device of claim 1, further comprising a bit line electrically connected to the vertical channel structure, the bit line extending along the first direction, wherein the second width is smaller than the first width.

3. The device of claim 2, wherein the second width is smaller than a half of the first width.

4. The device of claim 2, wherein the vertical channel structure is provided in plural number in the stacked structure, the plurality of vertical channel structures are spaced apart from each other along the first direction, and wherein the bit line electrically connects the plurality of vertical channel structures with each other.

5. The device of claim 2, further comprising at least one contact plug disposed on the first pad, the contact plug electrically connected to a global word line.

6. The device of claim 1, wherein the stacked structure further comprises an insulating layer interposed between the first and second conductive layers,
  wherein sidewalls of the first conductive layer and the insulating layer are substantially coplanar with each other.

* * * * *